US012720940B2

(12) United States Patent
Akimoto

(10) Patent No.: US 12,720,940 B2
(45) Date of Patent: Aug. 25, 2026

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 397 days.

(21) Appl. No.: 18/472,025

(22) Filed: Sep. 21, 2023

(65) Prior Publication Data

US 2024/0014249 A1 Jan. 11, 2024

Related U.S. Application Data

(63) Continuation of application No. PCT/JP2022/010856, filed on Mar. 11, 2022.

(30) Foreign Application Priority Data

Mar. 29, 2021 (JP) ................................ 2021-055841

(51) Int. Cl.
*H10H 29/14* (2025.01)

(52) U.S. Cl.
CPC ................................ *H10H 29/142* (2025.01)

(58) Field of Classification Search
None
See application file for complete search history.

(56) References Cited

U.S. PATENT DOCUMENTS

2013/0001564 A1* 1/2013 Choi .................. H10D 30/0316 257/40
2014/0138722 A1* 5/2014 Yamada ................. H10H 20/83 257/98

(Continued)

FOREIGN PATENT DOCUMENTS

CN 110459557 A 11/2019
CN 111223885 A 6/2020

(Continued)

OTHER PUBLICATIONS

Hyeryun Kim et al., "Fabrication of full-color GaN-based light-emitting diodes on nearly lattice-matched flexible metal foils", Scientific Reports, 7:2112, May 18, 2017.

(Continued)

*Primary Examiner* — Nicholas J Tobergte
(74) *Attorney, Agent, or Firm* — Foley & Lardner LLP

(57) ABSTRACT

A method for manufacturing an image display device according to an embodiment includes: forming a graphene layer on a first surface of a substrate; forming a semiconductor layer on the graphene layer; forming a light-emitting element that includes a light-emitting surface on the graphene layer and an upper surface at a side opposite to the light-emitting surface by patterning the semiconductor layer; forming a first insulating film covering the first surface, the graphene layer, and the light-emitting element; forming a circuit element on the first insulating film; forming a second insulating film covering the first insulating film and the circuit element; forming a first via extending through the first and second insulating films; and forming a first wiring layer on the second insulating film. The first via is located between, and electrically connects, the first wiring layer and the upper surface.

20 Claims, 30 Drawing Sheets

(56) References Cited

U.S. PATENT DOCUMENTS

| | | | | |
|---|---|---|---|---|
| 2014/0339496 | A1* | 11/2014 | Chu | H10H 20/82 257/13 |
| 2015/0069425 | A1* | 3/2015 | Kim | H01L 24/19 438/28 |
| 2016/0240561 | A1 | 8/2016 | Saito et al. | |
| 2019/0355766 | A1 | 11/2019 | Zhang et al. | |
| 2020/0168663 | A1 | 5/2020 | Choi et al. | |
| 2022/0059518 | A1 | 2/2022 | Akimoto | |
| 2022/0149228 | A1 | 5/2022 | Akimoto | |

FOREIGN PATENT DOCUMENTS

| | | | | |
|---|---|---|---|---|
| JP | 2002-141492 | A | 5/2002 | |
| JP | 2015-015321 | A | 1/2015 | |
| JP | 2020-507107 | A | 3/2020 | |
| WO | WO-2019168187 | A1 * | 9/2019 | C30B 29/46 |
| WO | WO-2020/226044 | A1 | 11/2020 | |
| WO | WO-2021/014972 | A1 | 1/2021 | |

OTHER PUBLICATIONS

Jeong Woo Shon et al., "Fabrication of full-color InGaN-based light-emitting diodes on amorphous substrates by pulsed sputtering", Scientific Reports, 4:5325, Jun. 23, 2014.

International Search Report with English language translation and Written Opinion of the International Searching Authority issued in the corresponding International Patent Application No. PCT/JP2022/010856, dated May 17, 2022.

* cited by examiner 1140
102a
102
Z

IMAGE DISPLAY DEVICE AND METHOD FOR MANUFACTURING IMAGE DISPLAY DEVICE

CROSS-REFERENCE TO RELATED APPLICATIONS

The present application is a bypass continuation of PCT Application No. PCT/JP2022/010856, filed Mar. 11, 2022, which claims priority to Japanese Application No. 2021-055841, filed Mar. 29, 2021. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (e.g., see Japanese Patent Publication No. 2002-141492).

SUMMARY

An embodiment of the invention provides a method for manufacturing an image display device and an image display device in which a transfer process of a light-emitting element is shortened, and the yield is increased.

A method for manufacturing an image display device according to an embodiment of the invention includes a process of forming a graphene-including layer on a first surface of a substrate, a process of forming a semiconductor layer including a light-emitting layer on the graphene-including layer, a process of forming a light-emitting element that includes a light-emitting surface on the graphene-including layer and an upper surface at a side opposite to the light-emitting surface by patterning the semiconductor layer, a process of forming a first insulating film covering the first surface, the graphene-including layer, and the light-emitting element, a process of forming a circuit element on the first insulating film, a process of forming a second insulating film covering the first insulating film and the circuit element, a process of forming a first via extending through the first and second insulating films, and a process of forming a first wiring layer on the second insulating film. The first via is located between the first wiring layer and the upper surface and electrically connects the first wiring layer and the upper surface.

An image display device according to an embodiment of the invention includes a light-transmitting member including a first surface, a light-emitting element that includes a light-emitting surface on the first surface and an upper surface at a side opposite to the light-emitting surface, a first insulating film covering the first surface and the light-emitting element, a circuit element located on the first insulating film, a second insulating film covering the first insulating film and the circuit element, a first via extending through the first and second insulating films, and a first wiring layer located on the second insulating film. The first via is located between the first wiring layer and the upper surface and electrically connects the first wiring layer and the upper surface.

An image display device according to an embodiment of the invention includes a light-transmitting member including a first surface, a first semiconductor layer including a light-emitting surface on the first surface wherein multiple light-emitting regions are formable in the light-emitting surface, multiple light-emitting layers provided to be separated from each other on the first semiconductor layer, multiple second semiconductor layers that are located respectively on the multiple light-emitting layers and are of a different conductivity type from the first semiconductor layer, a first insulating film covering the first surface, the first semiconductor layer, the multiple light-emitting layers, and the multiple second semiconductor layers, multiple transistors provided to be separated from each other on the first insulating film, a second insulating film covering the first insulating film and the multiple transistors, multiple first vias extending through the first and second insulating films, and a first wiring layer located on the second insulating film. The multiple second semiconductor layers and the multiple light-emitting layers are separated by the first insulating film. The multiple first vias are located respectively between the first wiring layer and the multiple second semiconductor layers and electrically connect the first wiring layer and the multiple second semiconductor layers respectively.

An image display device according to an embodiment of the invention includes a light-transmitting member including a first surface, multiple light-emitting elements that each include a light-emitting surface on the first surface and an upper surface at a side opposite to the light-emitting surface, a first insulating film covering the first surface and the multiple light-emitting elements, a circuit element located on the first insulating film, a second insulating film covering the first insulating film and the circuit element, multiple first vias extending through the first and second insulating films, and a first wiring layer located on the second insulating film. The multiple first vias are located respectively between the first wiring layer and the upper surfaces and electrically connect the first wiring layer and the upper surfaces respectively.

An embodiment of the invention provides a method for manufacturing an image display device in which a transfer process of a light-emitting element is shortened, and the yield is increased.

According to an embodiment of the invention, a high-definition image display device is realized in which a light-emitting element can be reduced in size.

DETAILED DESCRIPTION

Figure 1:
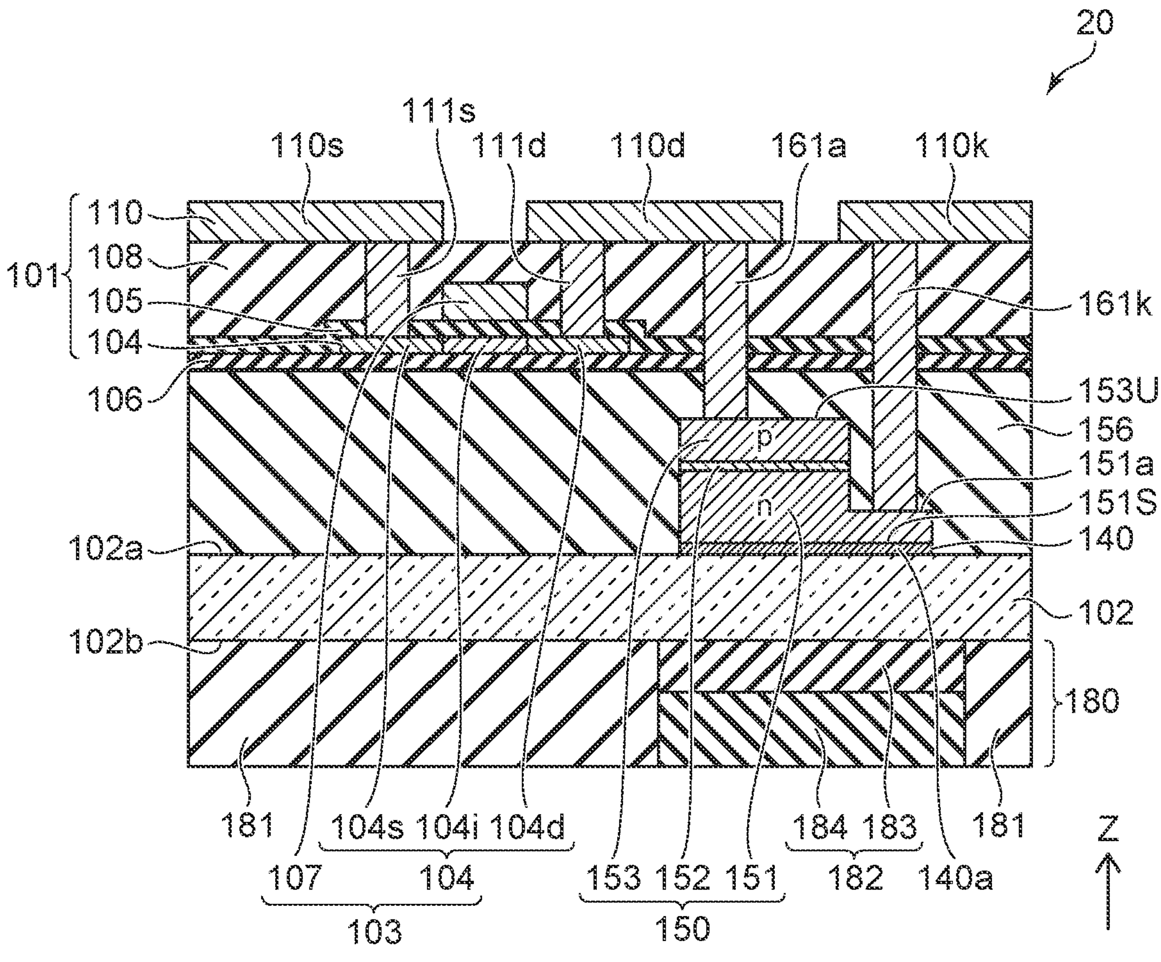
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are identified with the same reference numerals, and a repeated detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment.

Figure 9:
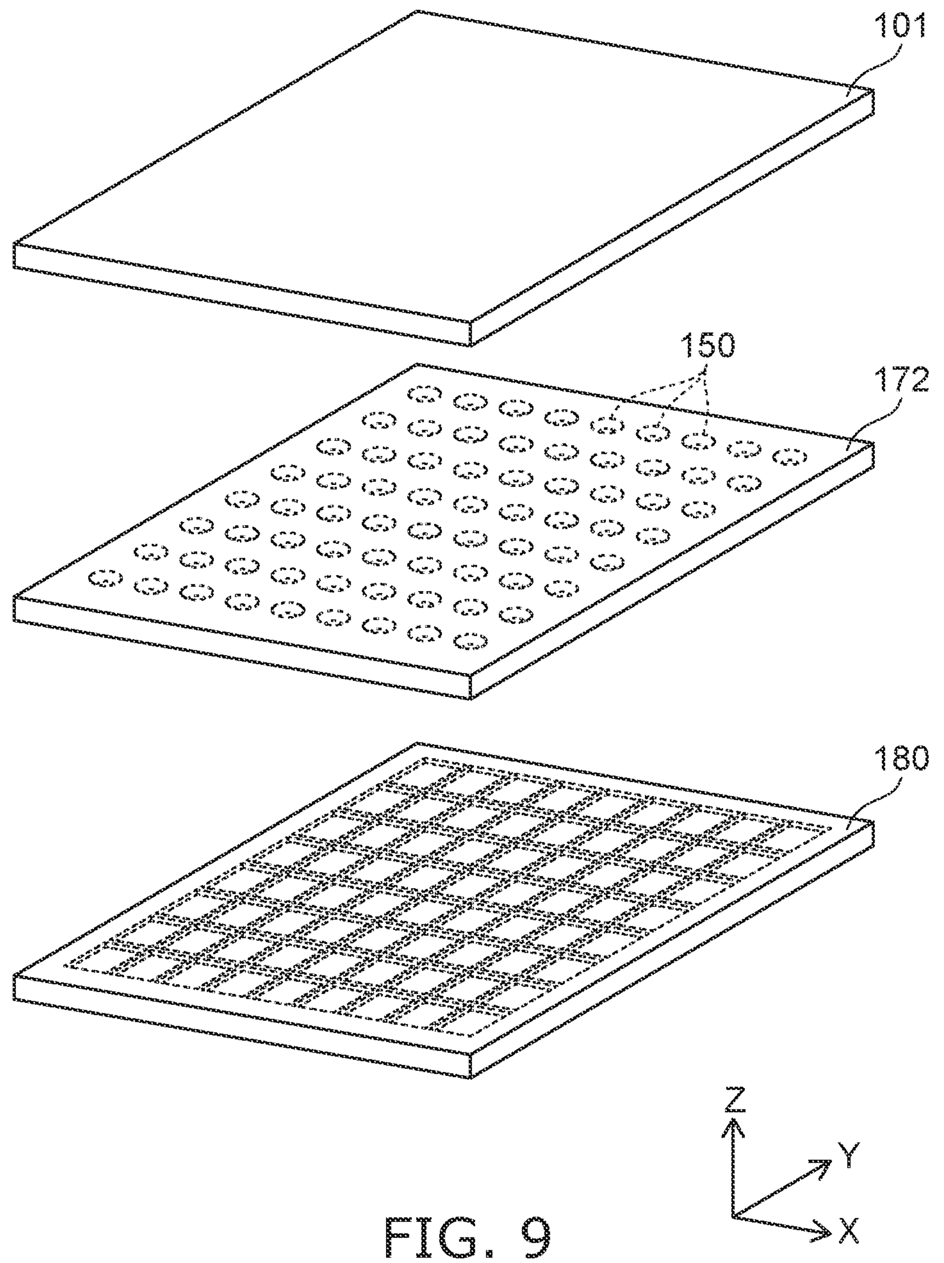
FIG. 9 is a schematic perspective view illustrating the image display device according to the first embodiment.
Figure 10:
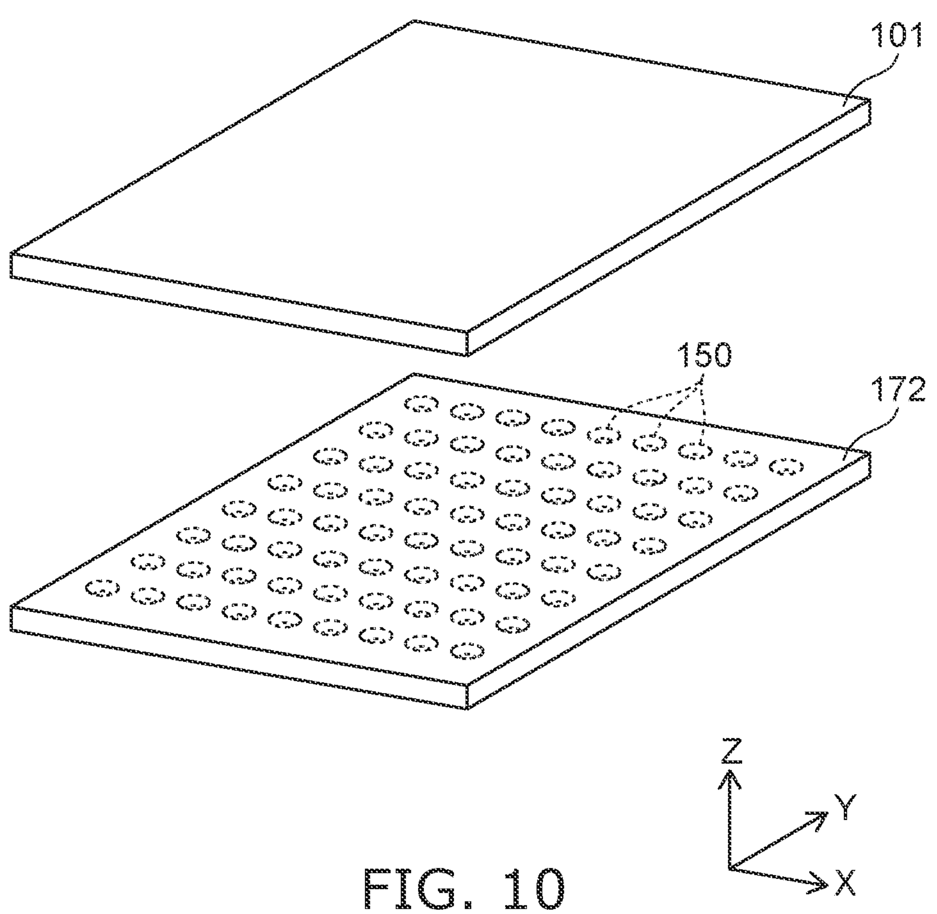
FIG. 10 is a schematic perspective view illustrating an image display device according to a modification of the first embodiment.

An XYZ three-dimensional coordinate system may be used in the following description. Light-emitting elements 150 are arranged in a two-dimensional plane as shown in FIGS. 9 and 10 below. The light-emitting element 150 is provided for each subpixel 20. The two-dimensional plane in which the subpixels 20 are arranged is taken as an XY plane. The subpixels 20 are arranged along an X-axis direction and a Y-axis direction.

FIG. 1 is the auxiliary cross section along line AA' of FIG. 3 below, and is a cross-sectional view in which cross sections of multiple planes perpendicular to the XY plane are joined in one plane. In FIG. 1, and in other drawings as well, in a cross-sectional view of multiple planes perpendicular to the XY plane, the X-axis and the Y-axis are not illustrated, and the Z-axis perpendicular to the XY plane is shown. That is, in these drawings, the plane perpendicular to the Z-axis is the XY plane.

Although the positive direction of the Z-axis is called "up" or "above" and the negative direction of the Z-axis is called "down" or "below" hereinbelow, the directions along the Z-axis are not always limited to directions in which gravity acts. A length in a direction along the Z-axis may be called a height.

The subpixel 20 includes a light-emitting surface 151S that is substantially parallel to the XY plane. The light-emitting surface 151S is a surface that radiates light mainly in the negative direction of the Z-axis orthogonal to the XY plane. According to the embodiment, its modifications, and all of the embodiments and their modifications described below, the light-emitting surface radiates light mainly in the negative direction of the Z-axis.

As shown in FIG. 1, the subpixel 20 of the image display device includes a substrate (a light-transmitting member) 102, a graphene layer 140, the light-emitting element 150, a first inter-layer insulating film (a first insulating film) 156, a transistor (a circuit element) 103, a second inter-layer insulating film (a second insulating film) 108, a via (a first via) 161*a*, and a first wiring layer 110. According to the embodiment, the subpixel 20 further includes a color filter 180.

The substrate 102 includes two surfaces 102*a* and 102*b*, the surface 102*b* is a surface at the side opposite to the surface 102*a*, and both the surfaces 102*a* and 102*b* are substantially parallel to the XY plane. The light-emitting element 150 is located on one surface (the first surface) 102*a*. The color filter 180 is located on the other surface 102*b*. The substrate 102 is a light-transmitting substrate, e.g., a glass substrate.

According to the embodiment, the graphene layer 140 is located between the substrate 102 and the light-emitting element 150. The graphene layer 140 is located on the one surface 102*a* of the substrate 102, and the light-emitting element 150 is located on the graphene layer 140. As described with reference to FIGS. 4A to 6B below, the graphene layer 140 is used in the formation process of the light-emitting element 150. The graphene layer 140 is thin enough to transmit light.

The light-emitting element 150 is located on the color filter 180 with the graphene layer 140 and the substrate 102 interposed. The surface of the light-emitting element 150 on the color filter 180 is the light-emitting surface 151S.

The light-emitting element 150 is driven by the transistor 103 located on the first inter-layer insulating film 156. The transistor 103 is a thin film transistor (TFT).

The configuration of the subpixel 20 will now be described in detail.

The color filter 180 includes a light-shielding part 181 and a color conversion part 182. The color conversion part 182 is provided to correspond to the shape of the light-emitting surface 151S directly under the light-emitting surface 151S of the light-emitting element 150. The part of the color filter 180 other than the color conversion part 182 is used as the light-shielding part 181. The light-shielding part 181 is a so-called black matrix that reduces blur due to color mixing of the light emitted from the adjacent color conversion part 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, one layer is the color conversion layer 183, and the other layer is the filter layer 184. The color conversion layer 183 is stacked on the filter layer 184, and the color conversion layer 183 is located at a position more proximate to the light-emitting element 150 than the filter layer 184.

The color conversion layer 183 converts the wavelength of the light emitted by the light-emitting element 150 into the desired wavelength. When the subpixel 20 emits red, for example, the light of the wavelength of the light-emitting element 150, i.e., 467 nm±30 nm, is converted into light of a wavelength of about 630 nm±20 nm. When the subpixel 20 emits green, for example, the light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the light may be output via the color conversion layer 183 or may be output as-is without passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide the color conversion layer 183 to convert the wavelength of the output light into about 467 nm±30 nm.

The subpixel 20 may include the filter layer 184 even when the subpixel 20 is blue. By providing the filter layer 184 through which blue light passes through in the blue subpixel 20, the occurrence of a micro external light reflection other than blue light at the surface of the light-emitting element 150 is suppressed.

The substrate 102 is located on the color filter 180. The graphene layer 140 is located on the one surface 102*a* of the substrate 102.

The graphene layer 140 includes multiple graphene sheets 140*a*. The graphene sheet 140*a* is provided for each light-emitting element 150. The outer perimeter of the graphene sheet 140*a* when projected onto the XY plane substantially matches the outer perimeter of the light-emitting element 150 when projected onto the XY plane.

The light-emitting element 150 includes the light-emitting surface 151S located on the graphene sheet (the graphene-including layer) 140*a*. The light-emitting element 150 includes an upper surface 153U located at the side opposite to the light-emitting surface 151S. In the example, the outer perimeter shapes of the light-emitting surface 151S and the upper surface 153U when projected onto the XY plane are quadrangular or rectangular, and the light-emitting element 150 is a prismatic element including the light-emitting surface 151S on the surface 102*a*. The cross section of the prism may be a polygon having five or more sides. The light-emitting element 150 is not limited to a prismatic element and may be a cylindrical element.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the light-emitting surface 151S toward the upper surface 153U. The light-emitting surface 151S, i.e., the n-type semiconductor layer 151, is located in contact with the graphene sheet 140*a*. The light-emitting element 150 radiates light mainly in the negative direction of the Z-axis via the light-emitting surface 151S, the graphene sheet 140*a*, the substrate 102, and the color filter 180.

The n-type semiconductor layer 151 includes a connection part 151*a*. The connection part 151*a* is provided to protrude in one direction from the n-type semiconductor layer 151 over the one surface 102*a* of the substrate 102. The height from the surface 102*a* of the connection part 151*a* is the same as the height from the surface 102*a* of the n-type semiconductor layer 151 or less than the height from the surface 102*a* of the n-type semiconductor layer 151. The connection part 151*a* is a portion of the n-type semiconductor layer 151. The connection part 151*a* is connected to one end of a via 161*k*, and the n-type semiconductor layer 151 is electrically connected to the via 161*k* by the connection part 151*a*.

When the light-emitting element 150 is prismatic, the shape of the light-emitting element 150 when projected onto the XY plane is, for example, substantially square or rectangular. When the shape of the light-emitting element 150 when projected onto the XY plane is polygonal including quadrangular, the corner portions of the light-emitting element 150 may be rounded. When the shape of the light-emitting element 150 when projected onto the XY plane is cylindrical, the shape of the light-emitting element 150 when projected onto the XY plane is not limited to circular and may be, for example, elliptical. The degree of freedom of the wiring layout and the like is increased by appropriately selecting the shape, arrangement, etc., of the light-emitting element in a plan view.

For example, the light-emitting element 150 favorably includes a gallium nitride compound semiconductor including a light-emitting layer of $In_XAl_YGa_{1-X-Y}N$ ($0 \le X$, $0 \le Y$, and $X+Y<1$), etc. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be in the range from the near-ultraviolet region to the visible region, e.g., about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The first inter-layer insulating film (the first insulating film) 156 covers the surface 102*a*, the graphene layer 140 including the graphene sheet 140*a*, and the light-emitting element 150. The first inter-layer insulating film 156 electrically isolates the light-emitting elements 150 located adjacent to each other. The first inter-layer insulating film 156 electrically isolates the light-emitting element 150 from the circuit elements such as the transistor 103, etc. The first inter-layer insulating film 156 provides a flat surface for forming a circuit 101 including the circuit elements such as the transistor 103, etc. By covering the light-emitting element 150, the first inter-layer insulating film 156 protects the light-emitting element 150 from thermal stress when forming the transistor 103, etc.

It is favorable for the first inter-layer insulating film 156 to be formed of an organic insulating material. The organic insulating material that is included in the first inter-layer insulating film 156 is light-reflective, and is favorably a white resin. By using a white resin as the first inter-layer insulating film 156, returning light caused by the light emitted by the light-emitting element 150 in the lateral direction is reflected. The returning light that is emitted by the light-emitting element 150 also may be occurred at the interface between the light-emitting element 150 and the graphene sheet 140*a*, the boundary between the light-emitting element 150 and the substrate 102, etc.; therefore, such returning light also can be reflected. Thus, by using a white resin as the first inter-layer insulating film 156, the luminous efficiency of the light-emitting element 150 is substantially improved. Because the first inter-layer insulating film 156 is light-reflective, the effects of reflecting the upward-scattered light of the light-emitting element 150, etc., suppressing the light that reaches the transistor 103, and preventing malfunction of the transistor 103 also can be obtained.

The white resin is formed by dispersing fine scattering particles having a Mie scattering effect in a silicon resin such as SOG (Spin On Glass) or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter of about 1/2 of the light wavelength. For example, $TiO_2$, $Al_2O_3$, ZnO, etc., are examples of such a fine scattering particle.

The white resin also can be formed by utilizing many fine voids or the like dispersed in a transparent resin. When whitening the first inter-layer insulating film 156, a $SiO_2$ film or the like may be used by overlaying with SOG, etc. In such a case, for example, the $SiO_2$ film or the like is formed using ALD (Atomic-Layer-Deposition) or CVD.

The first inter-layer insulating film 156 may be formed of a black resin. By using a black resin as the first inter-layer insulating film 156, the scattering of the light inside the subpixel 20 is suppressed, and stray light is more effectively suppressed. An image display device in which stray light is suppressed can display a sharper image.

A TFT underlying film 106 is formed over the first inter-layer insulating film 156. The TFT underlying film 106 is provided to ensure the flatness when forming the transistor 103, and to protect the TFT channel 104 of the transistor 103 from contamination, etc., in the heat processing. The TFT underlying film 106 is, for example, an insulating film of $SiO_2$, etc.

The transistor 103 is formed on the TFT underlying film 106. In addition to the transistor 103, other circuit elements such as transistors, capacitors, etc., are formed on the TFT underlying film 106, and the circuit 101 is configured using wiring parts, etc. For example, in FIG. 2 below, the transistor 103 corresponds to a drive transistor 26. Also, a select transistor 24, a capacitor 28, etc., are circuit elements in FIG. 2. In the description, the circuit 101 includes the TFT channel 104, an insulating layer 105, the second inter-layer insulating film 108, vias 111*s* and 111*d*, and the first wiring layer 110.

In the example, the transistor 103 is a p-channel TFT. The transistor 103 includes the TFT channel 104 and a gate 107. The TFT channel 104 is favorably formed by a low-temperature polysilicon (LTPS) process. In the LTPS process, the TFT channel 104 is formed by polycrystallizing and activating a region of amorphous Si formed on the TFT underlying film 106. For example, laser annealing with a laser is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* function as p-type semiconductor regions by being doped with p-type impurities such as boron (B), boron fluoride (BF), etc., and by being activated. The regions 104*s* and 104*d* have ohmic connections respectively with the vias 111*s* and 111*d*.

The gate 107 is located on the TFT channel 104 with the insulating layer 105 interposed. The insulating layer 105 is provided to insulate the TFT channel 104 and the gate 107 and insulate from other adjacent circuit elements. The current that flows between the regions 104*s* and 104*d* can be controlled by forming a channel in the region 104*i* when a lower potential than the region 104*s* is applied to the gate 107.

The insulating layer 105 is, for example, $SiO_2$. The insulating layer 105 may be a multilevel insulating layer that includes $SiO_2$, $Si_3N_4$, etc.

For example, the gate 107 may be formed of polycrystalline Si or may be formed of a refractory metal such as W, Mo, etc. For example, the gate 107 is formed by CVD or the like when the gate 107 is formed of a polycrystalline Si film.

The second inter-layer insulating film 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film of $SiO_2$, etc. The second inter-layer insulating film 108 also functions as a planarization film for forming the first wiring layer 110.

The vias 111*s* and 111*d* extend through the second inter-layer insulating film 108 and the insulating layer 105. The first wiring layer 110 is formed on the second inter-layer insulating film 108. The first wiring layer 110 includes multiple wiring parts that can have different potentials. In the example, the first wiring layer 110 includes wiring parts 110*s*, 110*d*, and 110*k*. The wiring parts 110*s*, 110*d*, and 110*k* are formed to be separated from each other.

A portion of the wiring part 110*s* is located above the region 104*s*. For example, another part of the wiring part 110*s* is connected to a power supply line 3 shown in FIG. 2 below. A portion of the wiring part 110*d* is located above the region 104*d*. Another part of the wiring part 110*d* is located above the upper surface 153U. A portion of the wiring part 110*k* is located above the connection part 151*a*. For example, another part of the wiring part 110*k* is connected to a ground line 4 shown in the circuit of FIG. 2 below.

In FIG. 1 and subsequent cross-sectional views, unless otherwise noted, the reference numeral of a wiring layer is displayed beside a wiring part included in the wiring layer. In the example of FIG. 1, the reference numeral of the first wiring layer 110 is displayed beside the wiring part 110*s*.

The via 111*s* is located between the wiring part 110*s* and the region 104*s* and electrically connects the wiring part 110*s* and the region 104*s*. The via 111*d* is located between the wiring part 110*d* and the region 104*d* and electrically connects the wiring part 110*d* and the region 104*d*.

The wiring part 110*s* is connected to the region 104*s* by the via 111*s*. The region 104*s* is a source region of the transistor 103. Accordingly, for example, the source region of the transistor 103 is electrically connected to the power supply line 3 shown in the circuit of FIG. 2 below by the via 111*s* and the wiring part 110*s*.

The wiring part 110*d* is connected to the region 104*d* by the via 111*d*. The region 104*d* is a drain region of the transistor 103.

The via (the first via) 161*a* extends through the second inter-layer insulating film 108, the insulating layer 105, the TFT underlying film 106, and the first inter-layer insulating film 156 and reaches the upper surface 153U. The via 161*a* is located between the wiring part (the first wiring part) 110*d* and the upper surface 153U and electrically connects the wiring part 110*d* and the p-type semiconductor layer 153. Accordingly, the p-type semiconductor layer 153 is electrically connected to the drain region of the transistor 103 by the via 161*a*, the wiring part 110*d*, and the via 111*d*.

The via (the second via) 161*k* extends through the second inter-layer insulating film 108, the insulating layer 105, the TFT underlying film 106, and the first inter-layer insulating film 156 and reach the connection part 151*a*. The via 161*k* is located between the wiring part (the second wiring part) 110*k* and the connection part 151*a* and electrically connects the wiring part 110*k* and the connection part 151*a*. Accordingly, for example, the n-type semiconductor layer 151 is electrically connected to the ground line 4 of the circuit of FIG. 2 via the connection part 151*a*, the via 161*k*, and the wiring part 110*k*.

For example, the first wiring layer 110 and the vias 111*s*, 111*d*, 161*a*, and 161*k* are formed of Al, an alloy of Al, a stacked film of Al, Ti, and the like, etc. For example, in a stacked film of Al and Ti, Al is stacked on a thin film of Ti, and then Ti is stacked on the Al.

A protective layer may be provided over the second inter-layer insulating film 108 and the first wiring layer 110 to protect from the external environment.

Figure 2:
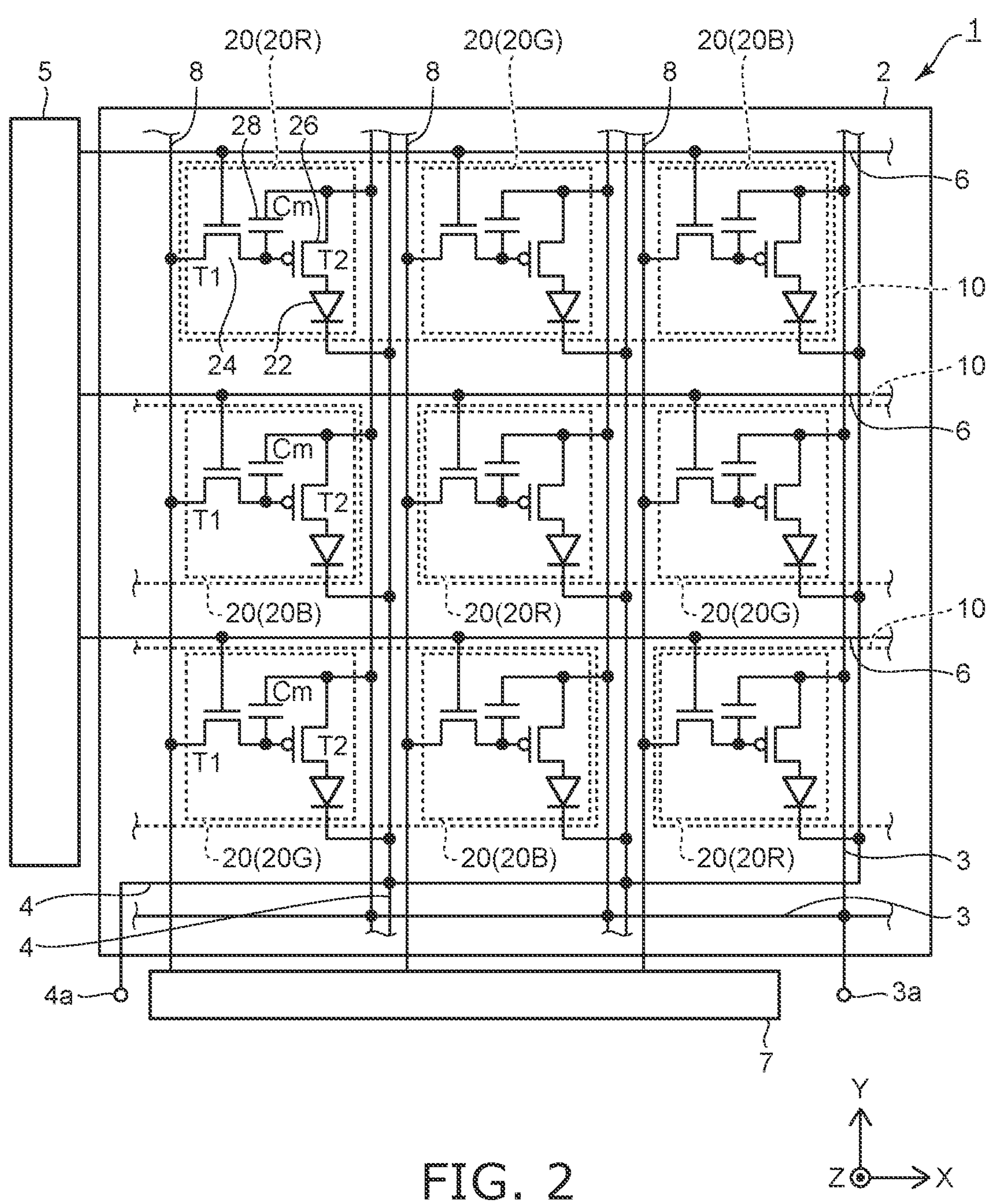
FIG. 2 is a schematic block diagram illustrating the image display device of the first embodiment.

FIG. 2 is a schematic block diagram illustrating the image display device according to the embodiment.

As shown in FIG. 2, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and the GND terminal 4*a*. The power supply terminal 3*a* and the GND terminal 4*a* are located respectively at end portions of the power supply line 3 and the ground line 4 and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the outer edge of the display region 2 in the Y-axis direction. The row selection circuit 5 is electrically connected to the subpixel 20 of each column via the scanning line 6, and supplies a select signal to each subpixel 20.

The signal voltage output circuit 7 is located along the outer edge of the display region 2 in the X-axis direction. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIGS. 2 and 3 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and the anode electrode of the light-emitting element 22 is connected to the drain electrode of the drive transistor 26. The major electrodes of the drive transistor 26 and the select transistor 24 are drain electrodes and source electrodes. The anode electrode of the light-emitting element 22 is connected to the p-type semiconductor layer. The cathode electrode of the light-emitting element 22 is connected to the n-type semiconductor layer. The series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. The luminance of the subpixel 20 is determined by the current flowing in the light-emitting element 22. The subpixels 20 emit light with gradations based on the determined luminances, and an image is displayed in the display region 2.

Figure 3:
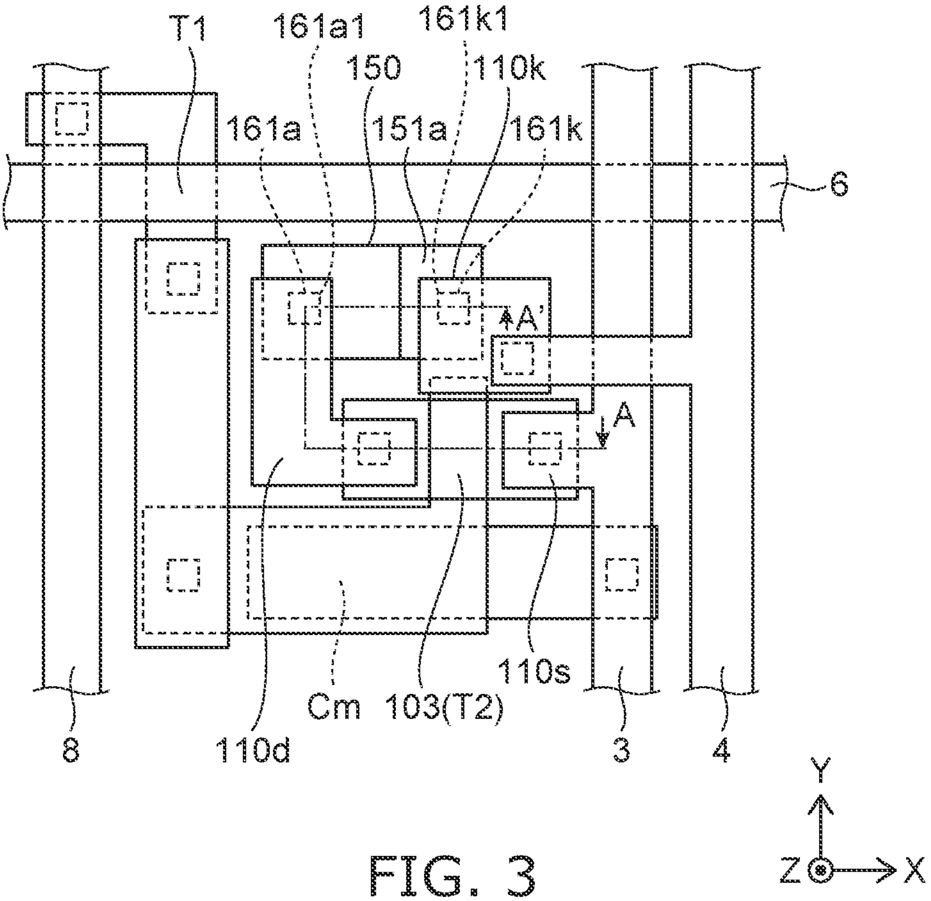
FIG. 3 is a schematic plan view illustrating a portion of the image display device of the first embodiment.

FIG. 3 is a schematic plan view illustrating a portion of the image display device of the embodiment.

In FIG. 3, the line along AA' indicates a cutting plane line of the cross-sectional view of FIG. 1, etc.

According to the embodiment, the light-emitting element 150 and the drive transistor 103 are stacked in the Z-axis direction with the first inter-layer insulating film 156 interposed. The light-emitting element 150 corresponds to the light-emitting element 22 of FIG. 2. The drive transistor 103 corresponds to the drive transistor 26 of FIG. 2 and is labeled T2 as well.

As shown in FIG. 3, the cathode electrode of the light-emitting element 150 is provided by the connection part 151*a*. The connection part 151*a* is located in a lower layer than the transistor 103 and the first wiring layer 110. The connection part 151*a* is electrically connected to the wiring part 110*k* by the via 161*k*. More specifically, one end of the via 161*k* is connected to the connection part 151*a*. The other end of the via 161*k* is connected to the wiring part 110*k* via a contact hole 161*k*1.

The anode electrode of the light-emitting element 150 is provided by the p-type semiconductor layer 153 shown in FIG. 1. The upper surface 153U of the p-type semiconductor layer 153 is connected to the wiring part 110*d* by the via 161*a*. More specifically, one end of the via 161*a* is connected to the upper surface 153U. The other end of the via 161*a* is connected to the wiring part 110*d* via a contact hole 161*a*1.

The other end of the wiring part 110*d* is connected to the drain electrode of the transistor 103 by the via 111*d* shown in FIG. 1. The drain electrode of the transistor 103 is the region 104*d* shown in FIG. 1. The source electrode of the transistor 103 is connected to the wiring part 110*s* by the via 111*s* shown in FIG. 1. The source electrode of the transistor 103 is the region 104*s* shown in FIG. 1. In the example, the first wiring layer 110 includes the power supply line 3, and the wiring part 110*s* is connected to the power supply line 3.

In the example, the ground line 4 is located in a higher layer than the first wiring layer 110. Although not illustrated in FIG. 1, an inter-layer insulating film is located on the first wiring layer 110. The ground line 4 is located on the inter-layer insulating film of the uppermost layer and is insulated from the power supply line 3.

Thus, by using the vias 161*k* and 161*a*, the light-emitting element 150 can be electrically connected to the first wiring layer 110 located in a higher layer than the light-emitting element 150.

A method for manufacturing the image display device 1 of the embodiment will now be described.

FIGS. 4A to 6B are schematic cross-sectional views illustrating a portion of the method for manufacturing the image display device of the embodiment.

Figures 4A, 4B:
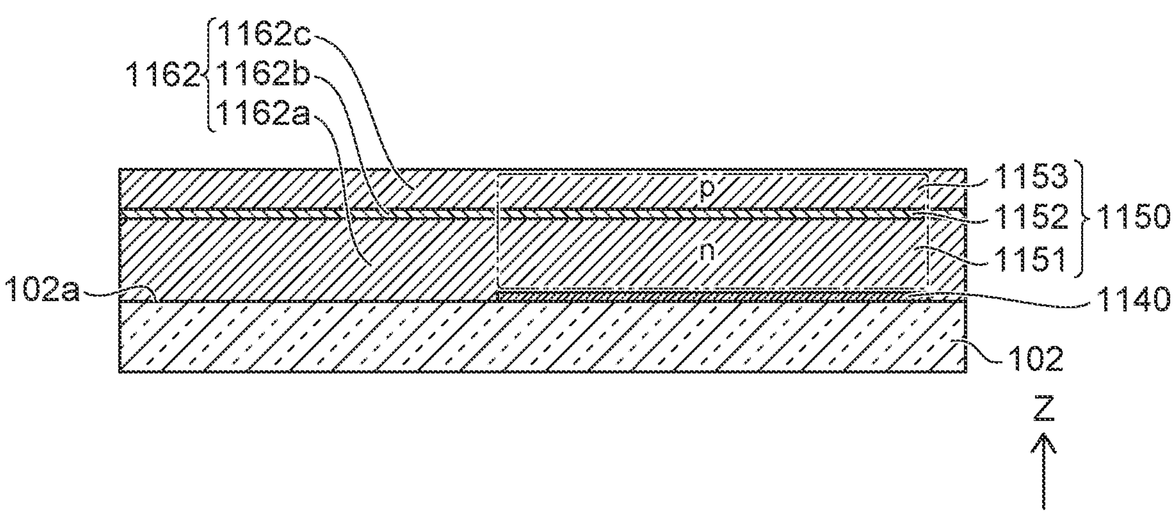
FIG. 4A is a schematic cross-sectional view illustrating a portion of a method for manufacturing the image display device of the first embodiment.
FIG. 4B is a schematic cross-sectional view illustrating a portion of the method for manufacturing the image display device of the first embodiment.

As shown in FIG. 4A, the substrate 102 is prepared according to the method for manufacturing the image display device of the embodiment. The substrate 102 is a light-transmitting substrate and is, for example, a substantially rectangular glass substrate of about 1500 mm×1800 mm. A graphene layer (a layer of graphene) 1140 is formed on the one surface (the first surface) 102*a* of the substrate. The graphene layer 1140 is a graphene-including layer and is favorably formed by stacking several layers to about 10 layers of a single-layer graphene layer. The graphene layer 1140 that is cut to the appropriate size and shape is located at a prescribed position of the surface 102*a* and held by suction to the substrate 102 by the flatness of the surface 102*a*. For example, the graphene layer 1140 may be bonded on the surface 102*a* by an adhesive, etc.

The outer perimeter of the cut graphene layer 1140 when projected onto the XY plane is determined according to the outer perimeter of a semiconductor layer 1150 shown in FIG. 4B below when projected onto the XY plane. The outer perimeter of the graphene layer 1140 when projected onto the XY plane and the outer perimeter of the semiconductor layer 1150 when projected onto the XY plane are set to sufficiently include the outer perimeter of the light-emitting element 150 of FIG. 5A below when projected onto the XY plane. That is, the outer perimeter of the light-emitting element 150 is located within the outer perimeter of the graphene layer 1140 and within the outer perimeter of the semiconductor layer 1150 when projected onto the XY plane.

As shown in FIG. 4B, the semiconductor layer 1150 is formed over the graphene layer 1140. The semiconductor layer 1150 includes an n-type semiconductor layer 1151, a light-emitting layer 1152, and a p-type semiconductor layer 1153 formed in this order from the graphene layer 1140 side in the positive direction of the Z-axis. The semiconductor layer 1150 includes, for example, GaN and more specifically, includes $In_XAl_YGa_{1-X-Y}N$ (0≤X, 0≤Y, and X+Y<1), etc. In the initial growth of the semiconductor layer 1150, crystal defects caused by crystal lattice mismatch easily occur, and crystals having GaN as a major component generally have n-type semiconductor characteristics. Therefore, the yield can be increased by growing the semiconductor layer 1150 from the n-type semiconductor layer 1151 on the graphene layer 1140.

To form the semiconductor layer 1150, physical vapor deposition such as vapor deposition, ion beam deposition, molecular beam epitaxy (MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the graphene layer 1140 in low-temperature sputtering at a low temperature of about 400° C. to about 700° C. (see Non-Patent Literature 1 and 2, etc.). Such low-temperature sputtering is self-aligning when forming the semiconductor layer 1150 on a glass substrate.

By using appropriate film formation technology, the GaN semiconductor layer 1150 is grown on the graphene layer 1140, and the semiconductor layer 1150 that is monocrystallized and includes the light-emitting layer 1152 is thereby formed on the graphene layer 1140. The semiconductor layer 1150 is formed inside the region shown by the double dot-dash line of FIG. 4B.

There are cases where an amorphous deposit 1162 that includes materials of the growth species such as Ga is deposited on the surface 102*a* at which the graphene layer 1140 does not exist in the growth process of the semiconductor layer 1150. In the example, the deposit 1162 includes deposits 1162*a*, 1162*b*, and 1162*c* stacked in this order from the surface 102*a* in the positive direction of the Z-axis. The deposit 1162*a* is deposited when forming the n-type semiconductor layer 1151, the deposit 1162*b* is deposited when forming the light-emitting layer 1152, and the deposit 1162*c* is deposited when forming the p-type semiconductor layer 1153; however, the configuration is not limited thereto.

The semiconductor layer 1150 is not limited to being directly formed on the graphene layer 1140 and may be formed on a buffer layer formed on the graphene layer 1140. There are cases where the GaN crystal growth can be promoted by providing a buffer layer. The buffer layer may be an insulating material, a metal material, etc., and may be any type of material as long as the buffer layer can be formed sufficiently thin enough that transmissivity to light is not lost and the material promotes GaN crystal growth.

Figure 5A:
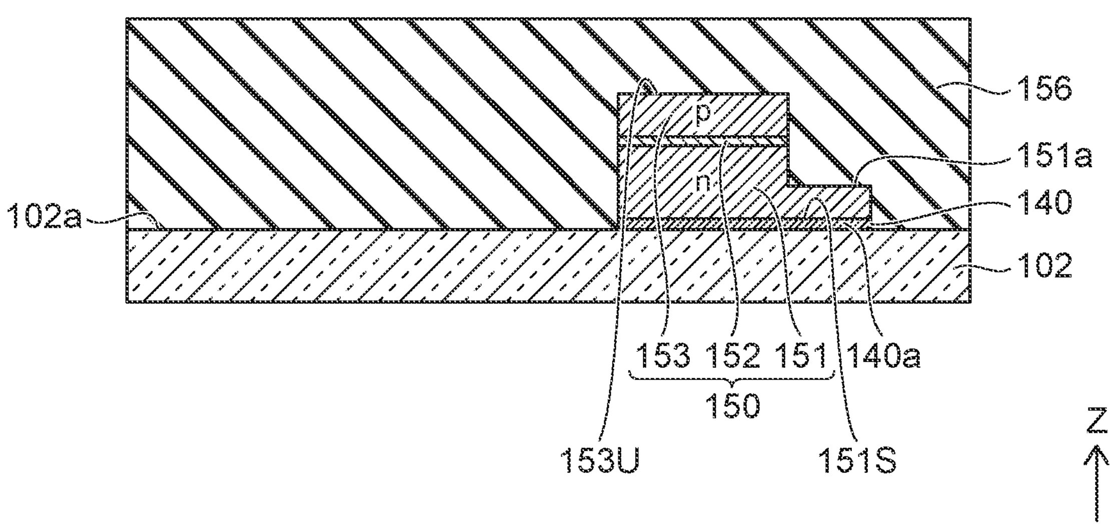
FIG. 5A is a schematic cross-sectional view illustrating a portion of the method for manufacturing the image display device of the first embodiment.

As shown in FIG. 5A, the light-emitting element 150 is formed by patterning the semiconductor layer 1150 shown in FIG. 4B into the desired shape by etching.

In the formation process of the light-emitting element 150, the connection part 151*a* is formed, and then the other parts are formed by further etching. Accordingly, the light-emitting element 150 that includes the connection part 151*a* protruding in one direction from the n-type semiconductor layer 151 over the surface 102*a* can be formed. For example, a dry etching process is used to form the light-emitting element 150, and it is favorable to use anisotropic plasma etching (Reactive Ion Etching (RIE)).

The graphene layer 1140 shown in FIG. 4B is shaped into the graphene sheet 140*a* by over etching when forming the light-emitting element 150. Therefore, the outer perimeter of the graphene sheet 140*a* when projected onto the XY plane substantially matches the outer perimeter of the light-emitting element 150 when projected onto the XY plane.

The first inter-layer insulating film (the first insulating film) 156 is formed to cover the surface 102*a*, the graphene sheet 140*a*, and the light-emitting element.

Figure 5B:
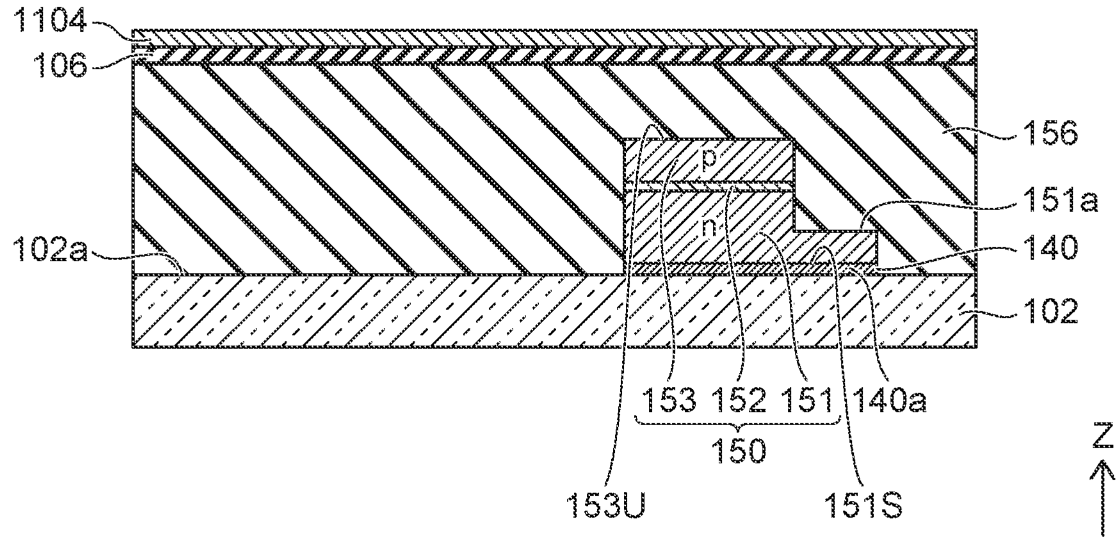
FIG. 5B is a schematic cross-sectional view illustrating a portion of the method for manufacturing the image display device of the first embodiment.

As shown in FIG. 5B, for example, the TFT underlying film 106 is formed on the first inter-layer insulating film 156 by CVD, etc. A Si layer 1104 is formed on the TFT underlying film 106 that is formed. When formed, the Si layer 1104 is a layer of amorphous Si, and after forming, the polycrystallized Si layer 1104 is formed by, for example, scanning an excimer laser pulse multiple times.

Figure 6A:
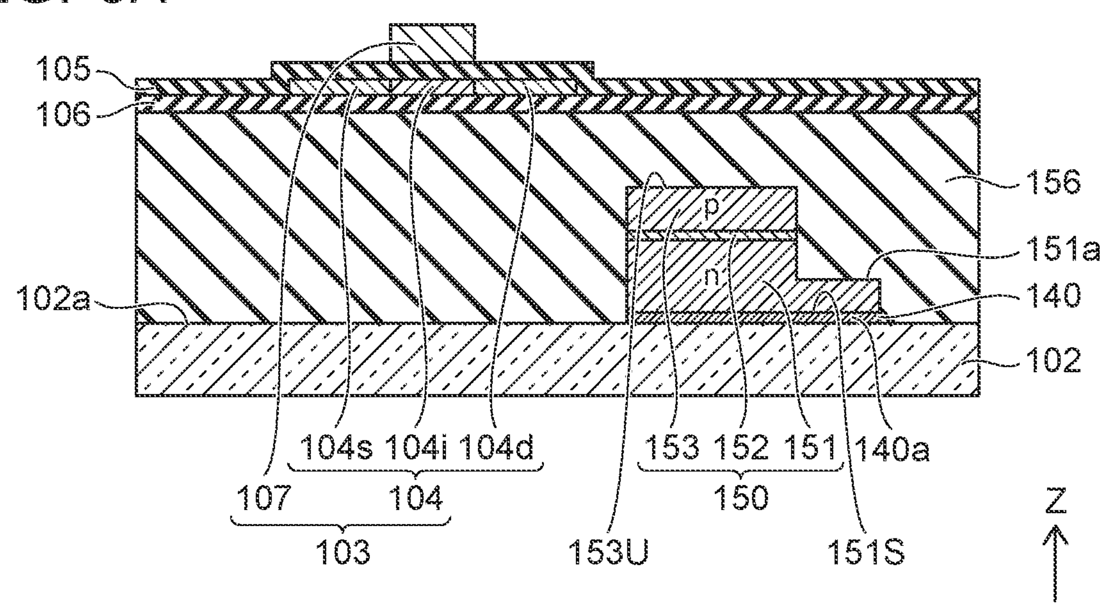
FIG. 6A is a schematic cross-sectional view illustrating a portion of the method for manufacturing the image display device of the first embodiment.

As shown in FIG. 6A, the polycrystallized Si layer 1104 shown in FIG. 5B is patterned into an island configuration to form the TFT channel 104. The insulating layer 105 is formed to cover the TFT underlying film 106 and the TFT channel 104. The insulating layer 105 functions as a gate insulating film. The gate 107 is formed on the TFT channel 104 with the insulating layer 105 interposed. An impurity such as B or the like is selectively doped into the gate 107, and the transistor (the circuit element) 103 is formed by thermal activation. The regions 104*s* and 104*d* become p-type active regions and respectively function as the source region and drain region of the transistor 103. The region 104*i* becomes an n-type active region and functions as the channel.

Thus, when a LTPS process is used, the transistor 103 is formed at the desired position on the TFT underlying film 106.

Figure 6B:
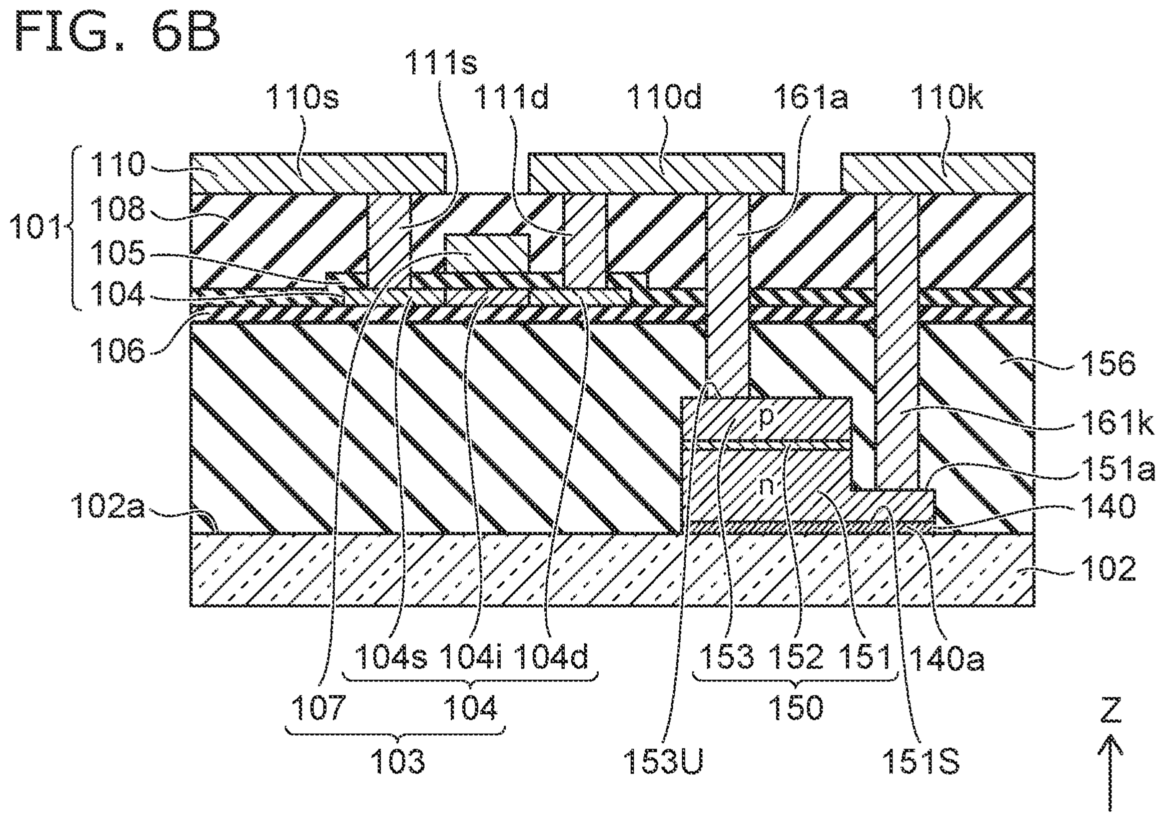
FIG. 6B is a schematic cross-sectional view illustrating a portion of the method for manufacturing the image display device of the first embodiment.

As shown in FIG. 6B, the second inter-layer insulating film (the second insulating film) 108 is provided to cover the insulating layer 105 and the gate 107. To form the second inter-layer insulating film 108, an appropriate formation method according to the material of the second inter-layer insulating film 108 is applied. For example, technology such as ALD, CVD, or the like is used when the second inter-layer insulating film 108 is formed of $SiO_2$.

It is sufficient for the second inter-layer insulating film 108 to be flat enough to form the first wiring layer 110, and a planarizing process may not always be performed. The number of processes can be reduced when a planarizing process of the second inter-layer insulating film 108 is not performed. For example, when there are locations at the periphery of the light-emitting element 150 at which the thickness of the second inter-layer insulating film 108 is thin, the depths of the via holes for the vias 161*a* and 161*k* can be shallow, and sufficient opening diameters can therefore be ensured. It is therefore easier to ensure the electrical connections by vias, and the reduction of the yield due to defects of the electrical characteristics can be suppressed.

The vias 161*a* and 161*k* that extend through the second inter-layer insulating film 108, the insulating layer 105, the TFT underlying film 106, and the first inter-layer insulating film 156 are formed. A via hole that is formed to reach the upper surface 153U is filled with a conductive material to form the via (the first via) 161*a*, and the via (the first via) 161*a* is electrically connected to the upper surface 153U. A via hole that is formed to reach the connection part 151*a* is filled with a conductive material to form the via (the second via) 161*k*, and the via (the second via) 161*k* is electrically connected to the connection part 151*a*.

The vias 111*s* and 111*d* are formed to extend through the second inter-layer insulating film 108 and the insulating layer 105. The via 111*s* is formed to reach the region 104*s*. The via 111*d* is formed to reach the region 104*d*. For example, RIE or the like is used to form the via hole for forming the vias 161*a*, 161*k*, 111*s*, and 111*d*.

The first wiring layer 110 that includes the wiring parts 110*k*, 110*d*, and 110*s* is formed on the second inter-layer insulating film 108. The wiring part 110*k* is connected to one end of the via 161*k*. The wiring part 110*d* is connected to one end of the via 161*a* and one end of the via 111*d*. The wiring part 110*s* is connected to one end of the via 111*s*. The wiring parts 110*k*, 110*d*, and 110*s* may be formed simultaneously with the formation of the vias 161*a*, 161*k*, 111*d*, and 111*s* when forming the first wiring layer 110.

Subsequently, a protective film that covers the second inter-layer insulating film 108 and the first wiring layer 110 may be formed to protect from the external environment.

A formation process of the color filter 180 shown in FIG. 1 will now be described.

FIGS. 7A to 7D are schematic cross-sectional views illustrating a portion of the method for manufacturing the image display device of the embodiment.

FIGS. 7A to 7D show a method of forming a color filter by inkjet printing.

Figure 7A:
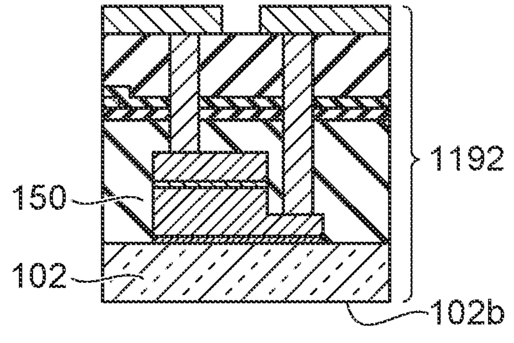
FIG. 7A is a schematic cross-sectional view illustrating a portion of the method for manufacturing the image display device of the first embodiment.
Figure 7A:
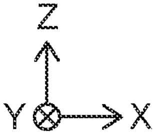

A structure body 1192 is prepared as shown in FIG. 7A. The color filter is formed at the exposed surface (a second surface) 102*b* of the substrate 102. The structure body 1192 is formed by the processes up to the process shown in FIG. 6B above. In addition to the substrate 102 and the light-emitting element 150, the structure body 1192 includes the graphene sheet 140*a*, the first inter-layer insulating film 156, the TFT underlying film 106, the TFT channel, the insulating layer 105, the gate 107, the vias 111*s*, 111*d*, 161*a*, and 161*k*, the first wiring layer 110, etc., shown in FIG. 6B.

Figure 7B:
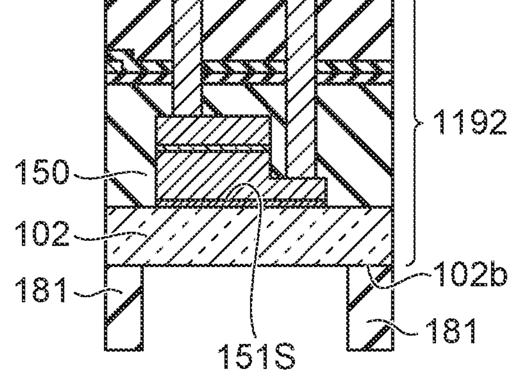
FIG. 7B is a schematic cross-sectional view illustrating a portion of the method for manufacturing the image display device of the first embodiment.
Figure 7B:
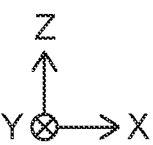

As shown in FIG. 7B, the light-shielding part 181 is formed in the region on the surface 102*b* where the light-emitting surface 151S is not provided. For example, the light-shielding part 181 is formed using screen printing, photolithography technology, etc.

Figure 7C:
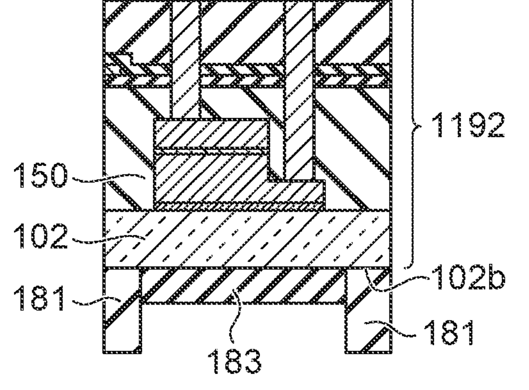
FIG. 7C is a schematic cross-sectional view illustrating a portion of the method for manufacturing the image display device of the first embodiment.
Figure 7C:
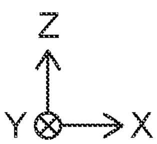

As shown in FIG. 7C, the color conversion layer 183 is formed by dispensing a fluorescer that corresponds to the light emission color from an inkjet nozzle. The fluorescer colors the region on the surface 102*b* in which the light-shielding part 181 is not formed. The fluorescer includes, for example, a fluorescent coating that uses a general fluorescer material, a perovskite fluorescer material, and a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be the thickness of the filter layer 184 stacked on the color conversion layer 183, and to be about equal to the thickness of the light-shielding part 181.

Figure 7D:
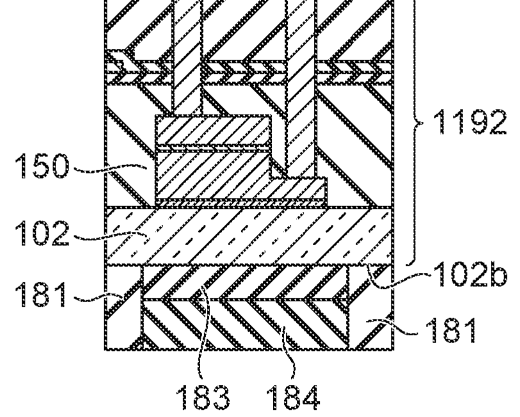
FIG. 7D is a schematic cross-sectional view illustrating a portion of the method for manufacturing the image display device of the first embodiment.

As shown in FIG. 7D, the coating for the filter layer 184 is dispensed from the inkjet nozzle. The coating is applied to overlap the coating of the fluorescer. The total thickness of the fluorescer and the coating is set to be about equal to the thickness of the light-shielding part 181. Thus, the color filter 180 is formed.

Instead of a formation process of a color filter by inkjet printing, a process of forming a film-type color filter 180*a* will now be described.

Figure 8:
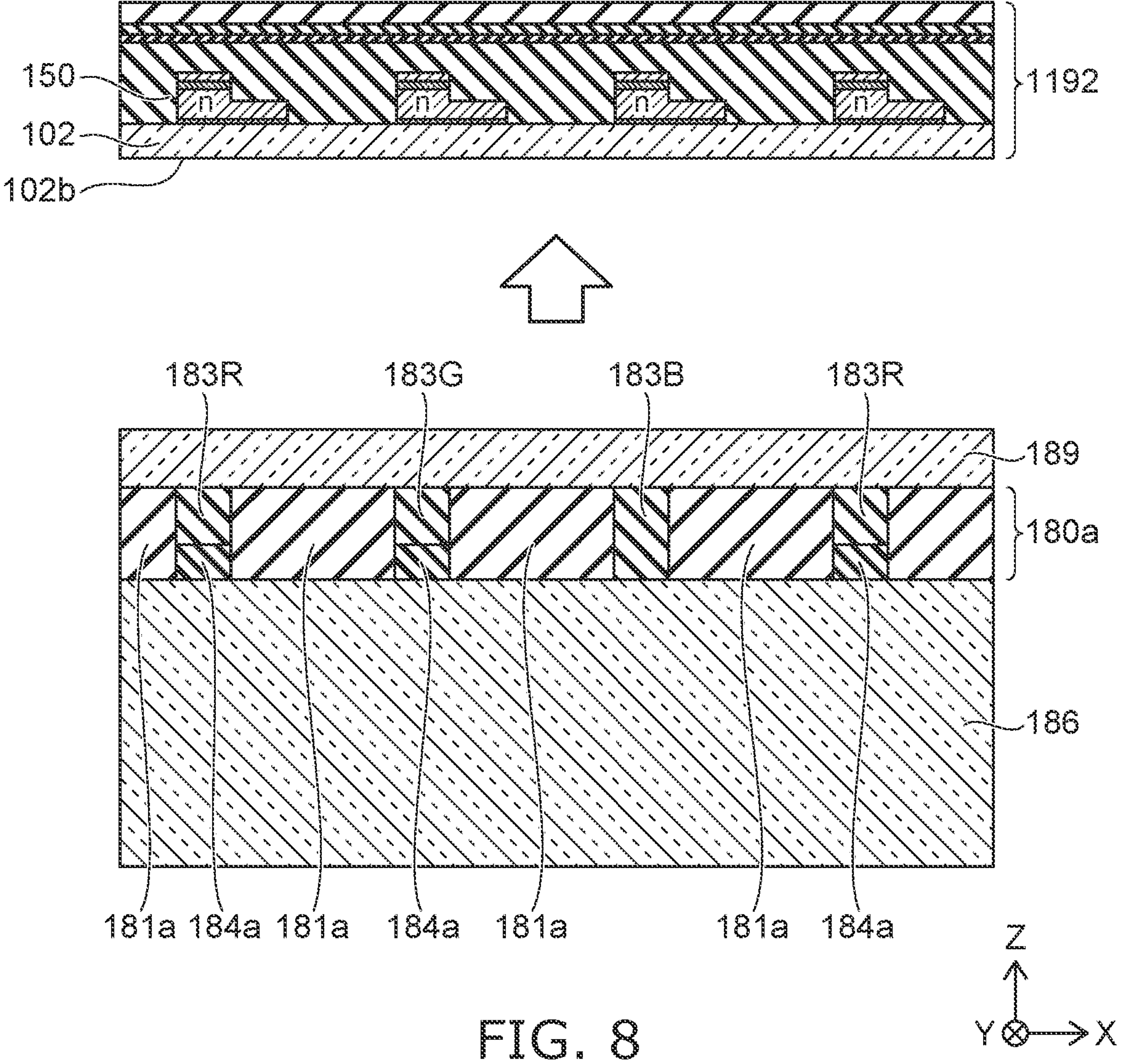
FIG. 8 is a schematic cross-sectional view illustrating a portion of a modification of the method for manufacturing the image display device of the first embodiment.

FIG. 8 is a schematic cross-sectional view illustrating a portion of a modification of the method for manufacturing the image display device of the embodiment.

The drawing above the arrow in FIG. 8 is the structure body 1192. In addition to the substrate 102 and the light-emitting element 150, the structure body 1192 includes the graphene sheet 140*a*, the first inter-layer insulating film 156, the TFT underlying film 106, the TFT channel, the insulating layer 105, the gate 107, the vias 111*s*, 111*d*, 161*a*, and 161*k*, the first wiring layer 110, etc., shown in FIG. 6B. The drawing below the arrow shows a glass substrate 186, the color filter 180*a* bonded to the glass substrate 186, and a transparent thin film adhesive layer 189 that bonds the color filter 180*a* to the structure body 1192. The arrow illustrates how the color filter 180*a* is adhered, together with the glass substrate 186 and the transparent thin film adhesive layer 189, to the structure body 1192.

To avoid complexity of illustration in FIG. 8, the components and/or their reference numerals are not illustrated for some of the components of the structure body 1192. The components inside the structure body 1192 that are not illustrated are the vias 161*a* and 161*k* and the circuit 101 including the transistor 103 shown in FIG. 6B.

As shown in FIG. 8, the color filter (the wavelength conversion member) 180*a* includes a light-shielding part 181*a*, color conversion layers 183R, 183G, and 183B, and a filter layer 184*a*. The light-shielding part 181*a* has a function similar to when an inkjet technique is used. The color conversion layers 183R, 183G, and 183B are formed to have functions and materials similar to when an inkjet technique is used. The filter layer 184*a* also has a function similar to when an inkjet technique is used.

The color filter 180*a* is bonded to the structure body 1192 at one surface. The other surface of the color filter 180*a* is bonded to the glass substrate 186. The transparent thin film adhesive layer 189 is located at the one surface of the color filter 180*a*, and the one surface of the color filter 180*a* is bonded to the exposed surface (second surface) 102*b* of the structure body 1192 via the transparent thin film adhesive layer 189.

In the color filter 180*a* of the example, color conversion parts are arranged in the positive direction of the X-axis in the order of red, green, and blue. For the red color conversion part, a red color conversion layer 183R is located in the layer at the transparent thin film adhesive layer 189 side. For the green color conversion part, the green color conversion layer 183G is located at the layer at the transparent thin film adhesive layer 189 side. For the red color conversion part and the green color conversion part, the filter layers 184*a* are located in the layer at the glass substrate 186 side. For the blue color conversion part in the example, the single-layer color conversion layer 183B is located from the glass substrate 186 side to the transparent thin film adhesive layer 189 side. The configuration is not limited thereto; the filter layer 184*a* may be located at the glass substrate 186 side similarly to the other colors. The frequency characteristic of the filter layer 184 may be the same characteristic for all of the colors of the color conversion parts and may be a different characteristic for each color of the color conversion parts. The light-shielding part 181*a* is located between the color conversion parts.

As shown by the arrow of FIG. 8, the color filter 180*a* is adhered to the structure body 1192 via the transparent thin film adhesive layer 189 by aligning the positions of the color conversion layers 183R, 183G, and 183B of the colors with the positions of the light-emitting elements 150.

Thus, the color filters 180 and 180*a* are formed in the structure body 1192 including the light-emitting element 150 and the circuit 101, and the subpixels are formed. An appropriate technique for the color filter is selected among inkjet techniques, film techniques, and other techniques that can form an equivalent color filter. By forming the color filter 180 by inkjet printing, the film adhesion process, etc., can be omitted, and the image display device 1 shown in FIG. 2 can be manufactured more inexpensively.

It is desirable to make the color conversion layer 183 as thick as possible to increase the color conversion efficiency for both the color filter 180 formed by inkjet printing and the film-type color filter 180*a*. On the other hand, when the color conversion layer 183 is too thick, the light emitted by the color conversion approximates Lambertian, but the blue light that is not color-converted has an emission angle limited by the light-shielding parts 181 and 181*a*. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding parts 181 and 181*a*.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

After the color filters 180 and 180*a* are formed, the structure body 1192 shown in FIG. 7D, etc., is diced together with the color filters 180 and 180*a* to form the image display device. The formation process of the color filters 180 and 180*a* may be performed after dicing the structure body 1192.

FIG. 9 is a schematic perspective view illustrating the image display device according to the embodiment.

In the image display device of the embodiment as shown in FIG. 9, a light-emitting circuit part 172 that includes many light-emitting elements 150 is located on the color filter 180. In addition to the light-emitting element 150, the light-emitting circuit part 172 includes the first inter-layer insulating film 156 and the graphene sheet 140*a* formed on the substrate 102 shown in FIG. 1. The circuit 101 that includes the transistor 103, etc., is located on the light-emitting circuit part 172 with the TFT underlying film 106 shown in FIG. 1 interposed. The circuit 101 and the light-emitting circuit part 172 are electrically connected by the vias 161*a* and 161*k* shown in FIG. 1.

Modification

FIG. 10 is a schematic perspective view illustrating an image display device according to a modification of the embodiment.

The image display device of the first embodiment described above includes the color filter 180, but may be a monochromatic light-emitting image display device without providing a color filter as shown in FIG. 10.

Effects of the image display device of the embodiment will now be described.

According to the method for manufacturing the image display device of the embodiment, the light-emitting element 150 is formed by performing crystal growth of the semiconductor layer 1150 on the substrate 102 and by etching the semiconductor layer 1150. Subsequently, the light-emitting element 150 is covered with the first inter-layer insulating film 156, and the circuit 101 that includes the circuit elements such as the transistor 103, etc., driving the light-emitting element 150 is made on the first inter-layer insulating film 156. Therefore, the manufacturing processes are markedly reduced compared to when singulated light-emitting elements are individually transferred to the substrate 102.

According to the method for manufacturing the image display device 1 of the embodiment, the graphene layer 1140 can be formed on the substrate 102, and the graphene layer 1140 that is formed can be used as the seed for performing crystal growth of the semiconductor layer 1150. The graphene layer 1140 can be easily formed by adhering graphene cut to the prescribed shape on the one surface 102*a* of the substrate 102, and the processes can be simple.

In an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the method for manufacturing the image display device of the embodiment provides the following effects.

According to the method for manufacturing the image display device of the embodiment, the transfer process of the light-emitting elements 150 can be reduced because the light-emitting elements 150 are formed after forming the entire semiconductor layer 1150 on the graphene layer 1140 formed on the substrate 102. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the graphene layer 1140, the light-emitting element 150 can be provided with self-alignment by cutting and adhering graphene having the appropriate shape. This is favorable for a higher-definition display because alignment of the light-emitting elements on the substrate 102 is unnecessary, and it is easy to reduce the size of the light-emitting element 150.

After the light-emitting element is formed directly on the substrate 102 by etching, etc., the light-emitting element 150 and the circuit element formed in a higher layer than the light-emitting element 150 are electrically connected by via formation; therefore, a uniform connection structure can be realized, and the reduction of the yield can be suppressed.

According to the embodiment, for example, the light-emitting element 150 on a glass substrate formed as described above can be covered with the first inter-layer insulating film 156, and a drive circuit, a scanning circuit, and the like including TFTs, etc., can be formed on a planarized surface by using a LTPS process, etc. A LTPS process is advantageous in that existing manufacturing processes and plants of flat panel displays can be utilized, the thermal stress on the light-emitting element 150 of the lower layer, etc., can be reduced, and the yield can be increased.

According to the embodiment, the light-emitting element 150 that is formed in a lower layer than the transistor 103, etc., can be electrically connected to a power supply line, a ground line, a drive transistor, etc., formed in an upper layer by forming vias extending through the first inter-layer insulating film 156, the TFT underlying film 106, the insulating layer 105, and the second inter-layer insulating film 108. Thus, a uniform connection structure can be easily realized using the technically-established multilevel wiring technology, and the yield can be increased. Accordingly, the reduction of the yield due to connection defects of the light-emitting elements, etc., is suppressed.

The graphene sheet 140*a* that is formed from the graphene layer 1140 is a stacked body of several atoms to about several tens of atoms, and is therefore thin enough that the transmissivity to light is not lost. Therefore, the process of removing the substrate 102 on which the graphene layer 140 including the graphene sheet 140*a* is formed can be omitted. Therefore, the image display device can be formed with fewer processes, and an inexpensive image display device can be realized.

It is also possible to add a process of removing the substrate 102 before forming the color filter 180. In such a case, a thinner image display device can be realized.

Second Embodiment

Figure 11:
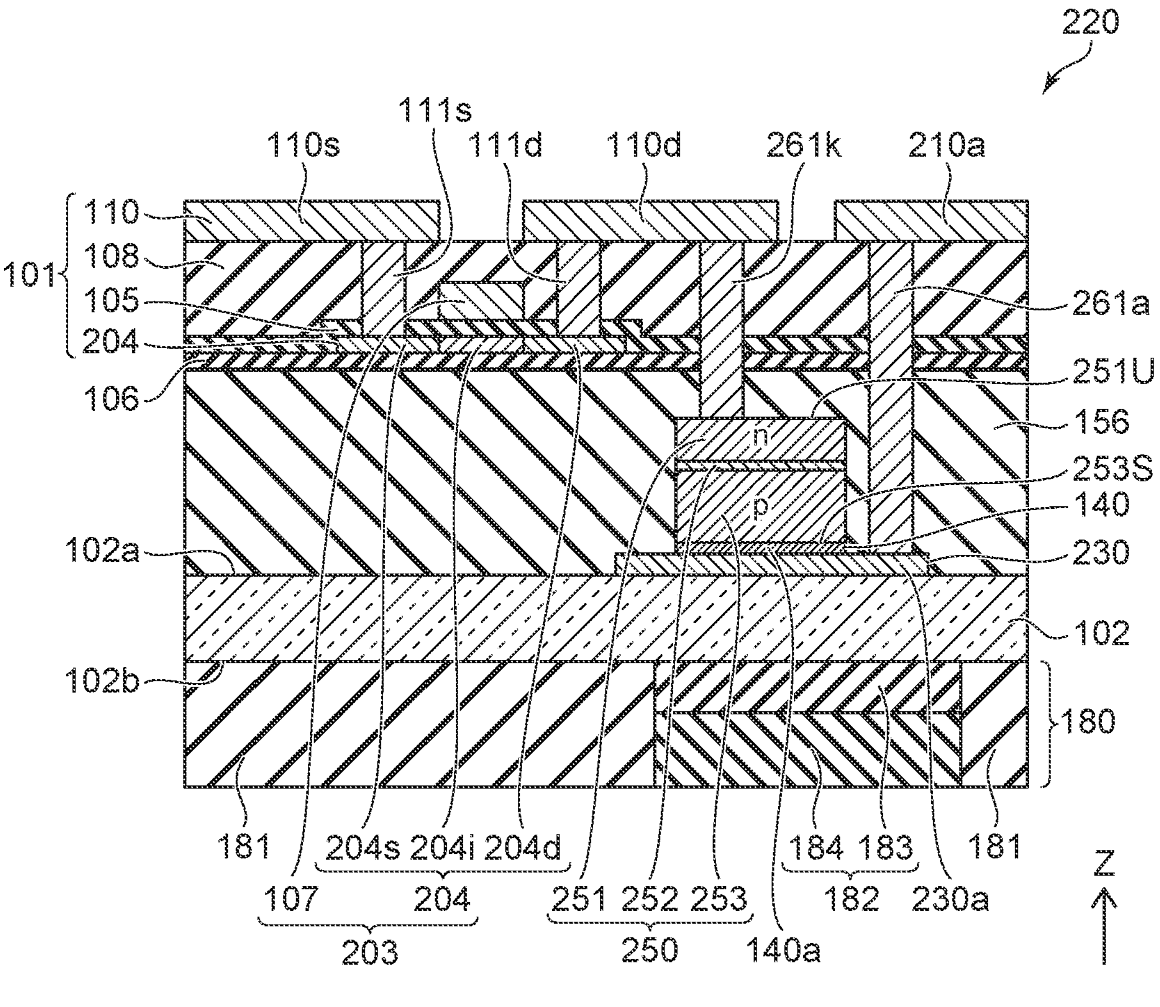
FIG. 11 is a schematic cross-sectional view illustrating a portion of an image display device according to a second embodiment.

FIG. 11 is a schematic cross-sectional view illustrating a portion of an image display device according to the embodiment.

In a subpixel 220 of the image display device of the embodiment as shown in FIG. 11, the configurations of a light-emitting element 250 and a transistor 203 are different from those of the other embodiment described above. Specifically, the subpixel 220 differs from that of the other embodiment described above in that a light-emitting surface 253S of the light-emitting element 250 is provided by a p-type semiconductor layer 253, and the transistor 203 has an n-channel. The subpixel 220 also differs from that of the other embodiment described above in that the subpixel 220 includes a second wiring layer 230 including a wiring part 230*a*, and that thep-type semiconductor layer 253 and a via 261*a* are connected by the wiring part 230*a*. The same components as those of the other embodiment are marked with the same reference numerals, and a detailed description is omitted as appropriate.

The image display device of the embodiment includes the subpixel 220. The subpixel 220 includes the substrate 102, the second wiring layer 230, the graphene layer 140, the light-emitting element 250, the first inter-layer insulating film 156, the transistor (the circuit element) 203, the second inter-layer insulating film 108, a via (a first via) 261*k*, and the first wiring layer 110. The subpixel 220 further includes the color filter 180.

Similarly to the other embodiment described above, the light-emitting element 250 is located on the one surface 102*a* of the substrate 102. The color filter 180 is located at the other surface 102*b* of the substrate 102.

The second wiring layer 230 is located on the surface 102*a*. The second wiring layer 230 includes the multiple wiring parts 230*a*. The wiring part 230*a* is provided for each light-emitting element 250. The second wiring layer 230 that includes the wiring part 230*a* is formed of a light-transmitting conductive film. For example, the conductive film is formed of a transparent conductive film such as ITO, ZnO, etc., or is formed of a metal thin film that is thin enough to transmit light.

The graphene layer 140 that includes the multiple graphene sheets 140*a* is located on the second wiring layer 230. The graphene sheet 140*a* is located on the wiring part 230*a*, and the light-emitting element 250 is electrically connected to the wiring part 230*a* via the graphene sheet 140*a*.

The light-emitting element 250 includes the light-emitting surface 253S, and an upper surface 251U at the side opposite to the light-emitting surface 253S. The light-emitting surface 253S contacts the graphene sheet 140a. Accordingly, the light-emitting element 250 radiates light in the negative direction of the Z-axis via the light-emitting surface 253S, the graphene sheet 140a, the wiring part 230a, the substrate 102, and the color filter 180.

The light-emitting element 250 includes the p-type semiconductor layer 253, a light-emitting layer 252, and an n-type semiconductor layer 251. The p-type semiconductor layer 253, the light-emitting layer 252, and the n-type semiconductor layer 251 are stacked in this order from the light-emitting surface 253S toward the upper surface 251U.

The light-emitting element 250 has a shape similar to that of the light-emitting element 150 of the other embodiment described above when projected onto the XY plane. An appropriate shape is selected according to the layout of the circuit elements, etc.

The light-emitting element 250 is a light-emitting diode similar to the light-emitting element 150 shown in FIG. 1 above.

When projected onto the XY plane, the outer perimeter of the wiring part 230a is set to include the outer perimeter of the light-emitting element 250 when the light-emitting element 250 is projected onto the wiring part 230a. That is, the outer perimeter of the light-emitting element 250 is located within the outer perimeter of the wiring part 230a when projected onto the XY plane. The wiring part 230a is provided to protrude in one direction from directly under the light-emitting surface 253S over the surface 102a. One end of the via 261a is connected to the protruding region of the wiring part 230a. Accordingly, for example, the p-type semiconductor layer 253 is electrically connected to the power supply line 3 of the circuit of FIG. 12 below via the graphene sheet 140a, the wiring part 230a, the via 261a, and a wiring part 210a.

Similarly to the other embodiment described above, the outer perimeter of the graphene sheet 140a when projected onto the XY plane substantially matches the outer perimeter of the light-emitting element 250 when projected onto the XY plane.

The transistor 203 is located on the TFT underlying film 106. The transistor 203 is an n-channel TFT. The transistor 203 includes the TFT channel 204 and the gate 107. Similarly to the other embodiment described above, the transistor 203 is favorably formed by a LTPS process, etc. According to the embodiment, the circuit 101 includes the TFT channel 204, the insulating layer 105, the second inter-layer insulating film 108, the vias 111s and 111d, and the wiring layer 110.

The TFT channel 204 includes regions 204s, 204i, and 204d. The regions 204s, 204i, and 204d are located on the TFT underlying film 106. The regions 204s and 204d form n-type semiconductor regions by being doped with an impurity such as phosphorus (P) or the like and by being activated. The region 204s has an ohmic connection with the via 111s. The region 204d has an ohmic connection with the via 111d.

The gate 107 is located on the TFT channel 204 with the insulating layer 105 interposed. The insulating layer 105 insulates the TFT channel 204 and the gate 107.

In the transistor 203, a channel is formed in the region 204i when a higher voltage than that of the region 204s is applied to the gate 107. The current that flows between the regions 204s and 204d is controlled by the voltage of the gate 107 with respect to the region 204s. The TFT channel 204 and the gate 107 are formed using materials and formation methods similar to those of the TFT channel 104 and the gate 107 according to the other embodiment described above.

The first wiring layer 110 includes the wiring parts 110s, 110d, and 210a. A portion of the wiring part 210a is located above the wiring part 230a. For example, another part of the wiring part 210a is connected to the power supply line 3 shown in FIG. 12 below.

The vias 111s and 111d extend through the second inter-layer insulating film 108. The via 111s is located between the wiring part 110s and the region 204s. The via 111s electrically connects the wiring part 110s and the region 204s. The via 111d is located between the wiring part 110d and the region 204d. The via 111d electrically connects the wiring part 110d and the region 204d. The vias 111s and 111d are formed using materials and formation methods similar to those of the other embodiment described above.

The via (the first via) 261k extends through the second inter-layer insulating film 108, the insulating layer 105, the TFT underlying film 106, and the first inter-layer insulating film 156 and reach the upper surface 251U. The via 261k is located between the wiring part (a third wiring part) 110d and the upper surface 251U and electrically connects the wiring part 110d and the upper surface 251U. Accordingly, the n-type semiconductor layer 251 is electrically connected by the via 261k, the wiring part 110d, and the via 111d to the region 204d that forms the drain electrode of the transistor 203.

The via (the second via) 261a extends through the second inter-layer insulating film 108, the insulating layer 105, the TFT underlying film 106, and the first inter-layer insulating film 156 and reach the wiring part 230a. The via 261a is located between the wiring part (a fourth wiring part) 210a and the wiring part 230a and electrically connects the wiring part 210a and the wiring part 230a. Accordingly, for example, thep-type semiconductor layer 253 is electrically connected to the power supply line 3 of the circuit of FIG. 12 via the wiring part 230a, the via 261a, and the wiring part 210a.

Figure 12:
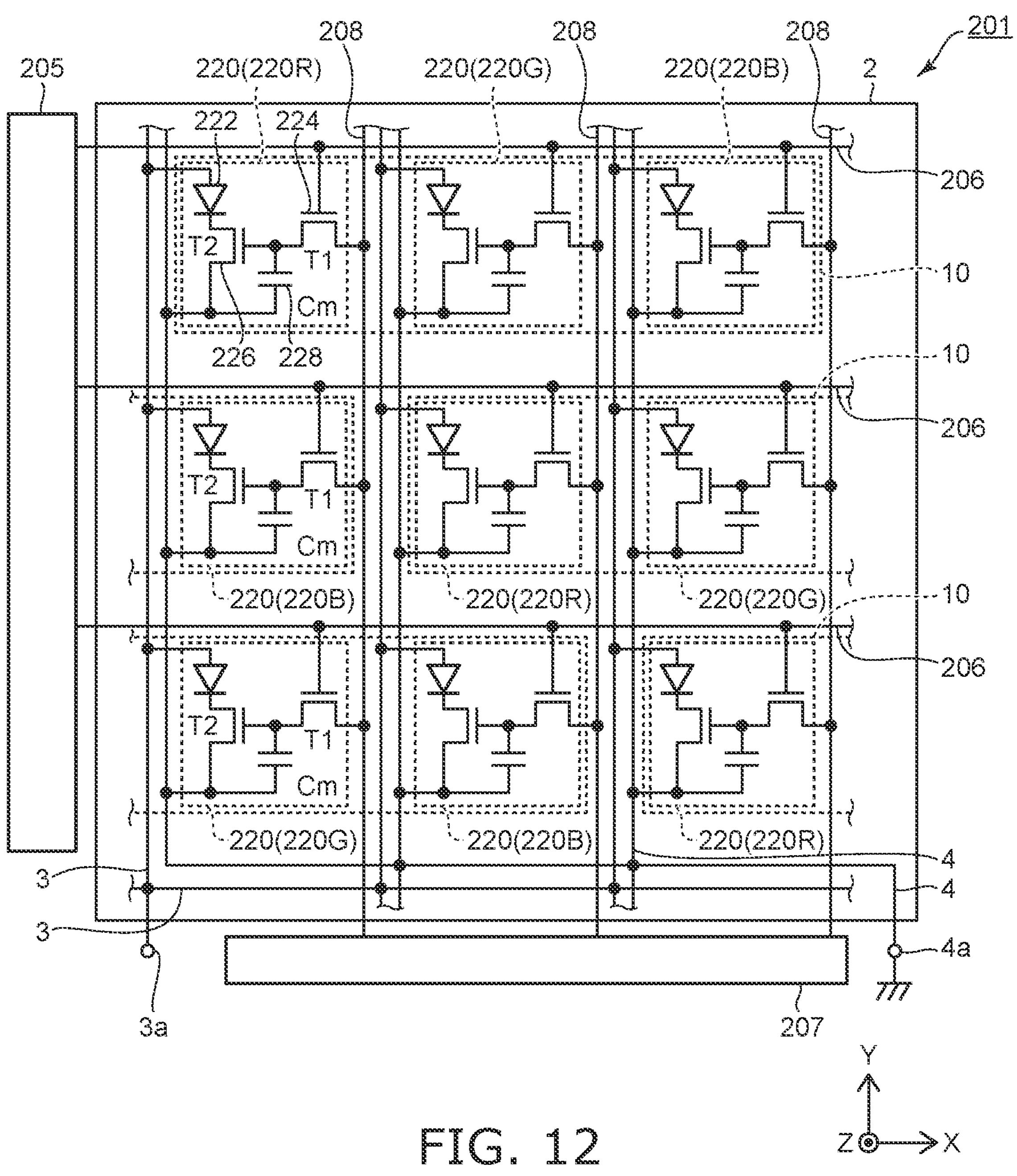
FIG. 12 is a schematic block diagram illustrating the image display device of the second embodiment.

FIG. 12 is a schematic block diagram illustrating the image display device of the embodiment.

As shown in FIG. 12, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, a pixel 10 includes the multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes the three subpixels 220R, 220G, and 220B, and, for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 12, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is an n-channel transistor, the row selection circuit 205 and the signal voltage output circuit 207 supply, to the signal line 208, a signal voltage that has a different polarity from that of the other embodiment described above.

According to the embodiment, because the polarity of the drive transistor 226 is an n-channel, the polarity of the signal voltage and the like are different from those of the other embodiment described above. Specifically, the row selection circuit 205 supplies a select signal to a scanning line 206 to sequentially select one row from the arrangement of the m rows of subpixels 220. The signal voltage output circuit 207 supplies a signal voltage having an analog voltage value necessary for the subpixels 220 of the selected row. The drive transistors 226 of the subpixels 220 of the selected row allow currents corresponding to the signal voltage to flow in the light-emitting elements 222. The light-emitting elements 222 emit light of luminances corresponding to the currents that flow.

A manufacturing method of the embodiment will now be described.

FIGS. 13A to 15B are schematic cross-sectional views illustrating a portion of the method for manufacturing the image display device of the embodiment.

Figure 13A:
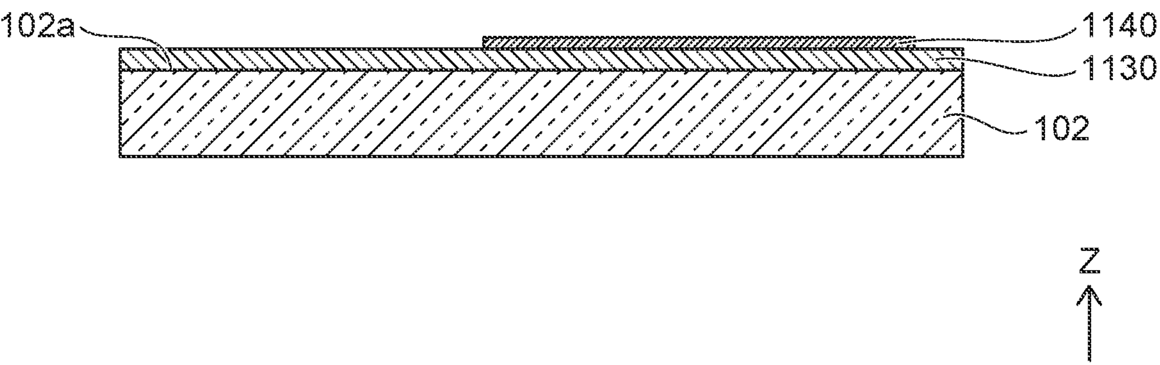
FIG. 13A is a schematic cross-sectional view illustrating a portion of a method for manufacturing the image display device of the second embodiment.

The substrate 102 is prepared as shown in FIG. 13A. Similarly to the other embodiment described above, the substrate 102 is a light-transmitting substrate such as a glass substrate, etc. A light-transmitting conductive film 1130 is formed at the one surface 102*a* of the prepared substrate 102. The graphene layer 1140 is formed on the light-transmitting conductive film 1130.

Figure 13B:
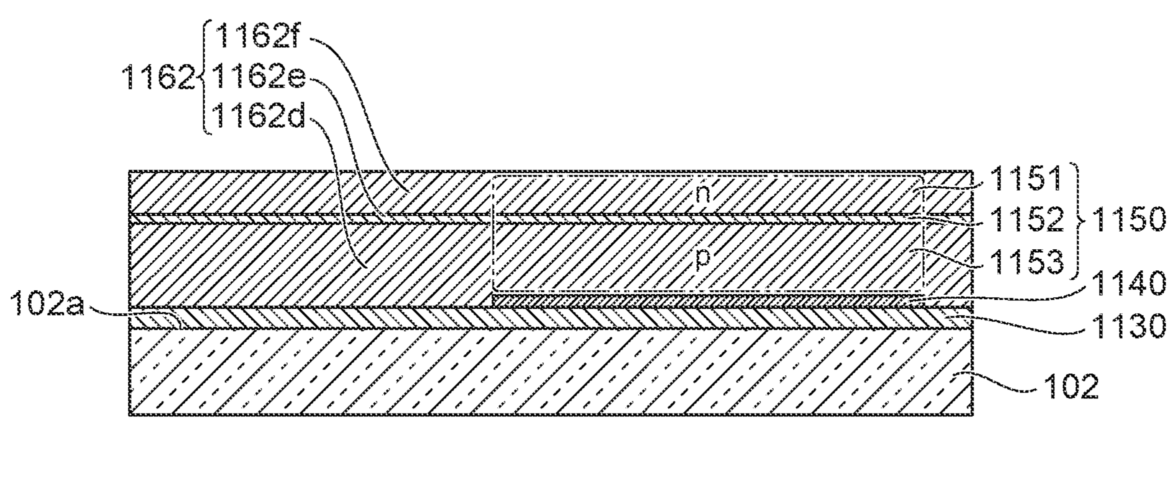
FIG. 13B is a schematic cross-sectional view illustrating a portion of the method for manufacturing the image display device of the second embodiment.

As shown in FIG. 13B, the semiconductor layer 1150 is formed over the graphene layer 1140. The semiconductor layer 1150 includes the p-type semiconductor layer 1153, the light-emitting layer 1152, and the n-type semiconductor layer 1151 formed in this order from the graphene layer 1140 side in the positive direction of the Z-axis. The semiconductor layer 1150 is formed over the graphene layer 1140 as shown by the double dot-dash line of FIG. 13B. Similarly to the other embodiment described above, the amorphous deposit 1162 that includes materials of the growth species such as Ga may be deposited on the surface 102*a* at which the graphene layer 1140 does not exist. In the example, the deposit 1162 includes deposits 1162*d*, 1162*e*, and 1162*f* stacked in this order from the surface 102*a* in the positive direction of the Z-axis. The deposit 1162*d* is deposited when forming the p-type semiconductor layer 1153, the deposit 1162*e* is deposited when forming the light-emitting layer 1152, and the deposit 1162*f* is deposited when forming the n-type semiconductor layer 1151; however, the configuration is not limited thereto.

Figure 14A:
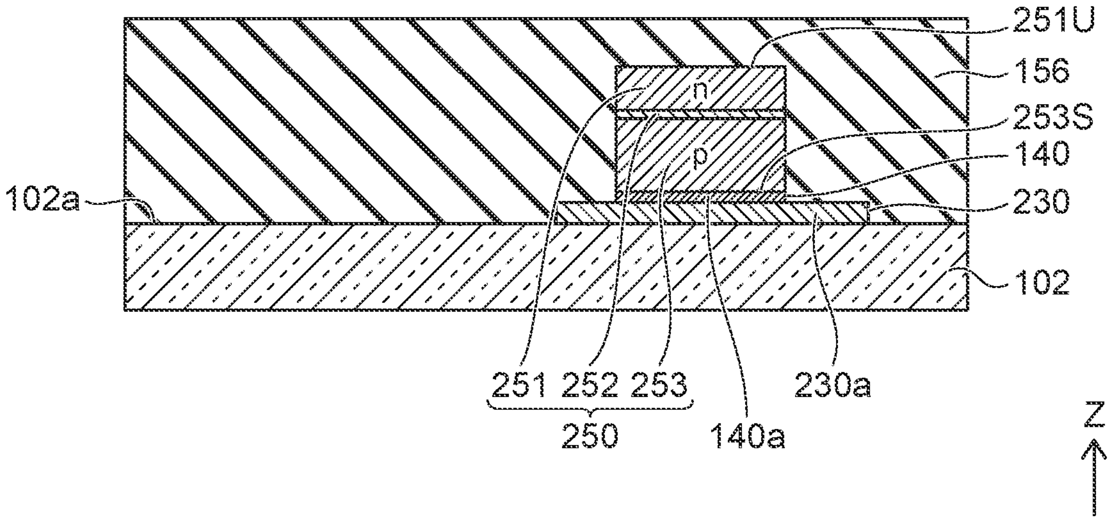
FIG. 14A is a schematic cross-sectional view illustrating a portion of the method for manufacturing the image display device of the second embodiment.

As shown in FIG. 14A, the second wiring layer 230 that includes the wiring part 230*a* is formed by patterning the light-transmitting conductive film 1130 shown in FIG. 13B by etching.

The light-emitting element 250 is formed on the wiring part 230*a* by patterning the semiconductor layer 1150 shown in FIG. 13B by etching. The graphene sheet 140*a* is shaped by over etching of the graphene layer 1140 shown in FIG. 13B when forming the light-emitting element 250.

The first inter-layer insulating film 156 is formed to cover the surface 102*a*, the second wiring layer 230 including the wiring part 230*a*, the graphene layer 140 including the graphene sheet 140*a*, and the light-emitting element 250.

Figure 14B:
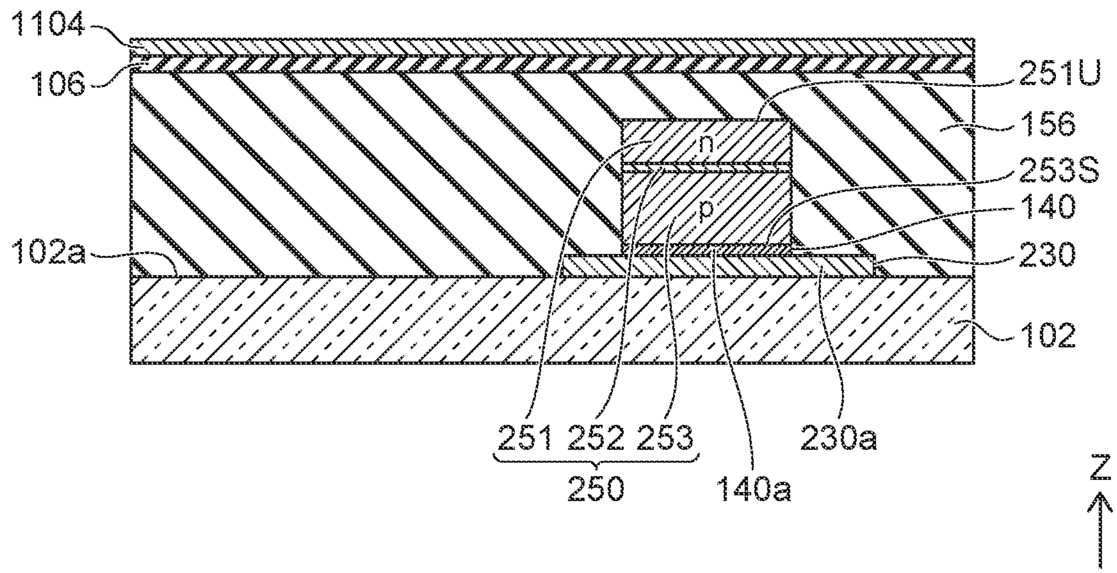
FIG. 14B is a schematic cross-sectional view illustrating a portion of the method for manufacturing the image display device of the second embodiment.

As shown in FIG. 14B, the TFT underlying film 106 is formed on the first inter-layer insulating film 156, and the Si layer 1104 is formed on the TFT underlying film 106 and polycrystallized.

Figure 15A:
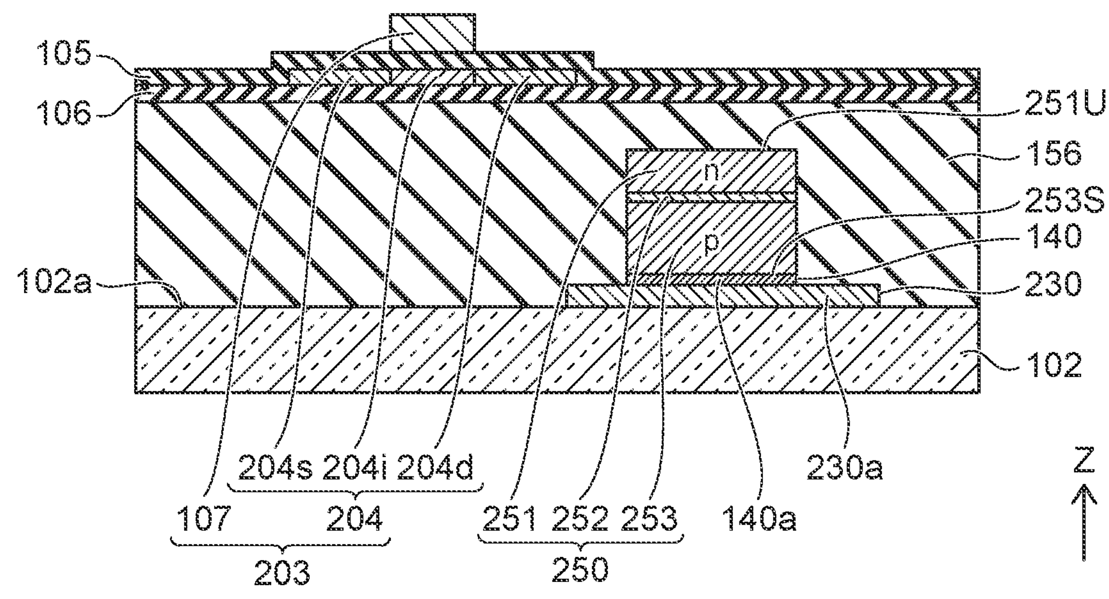
FIG. 15A is a schematic cross-sectional view illustrating a portion of the method for manufacturing the image display device of the second embodiment.

As shown in FIG. 15A, the polycrystallized Si layer 1104 shown in FIG. 14B is patterned into an island configuration to form the TFT channel 204. The insulating layer 105 is formed to cover the TFT underlying film 106 and the TFT channel 204. The insulating layer 105 functions as a gate insulating film. The gate 107 is formed on the TFT channel 204 with the insulating layer 105 interposed. The transistor 203 is formed by selectively doping the gate 107 with an impurity such as B or the like and by thermally activating. The regions 204*s* and 204*d* are used as n-type active regions and function respectively as the source region and drain region of the transistor 203. The region 204*i* is used as a p-type active region and functions as a channel.

Figure 15B:
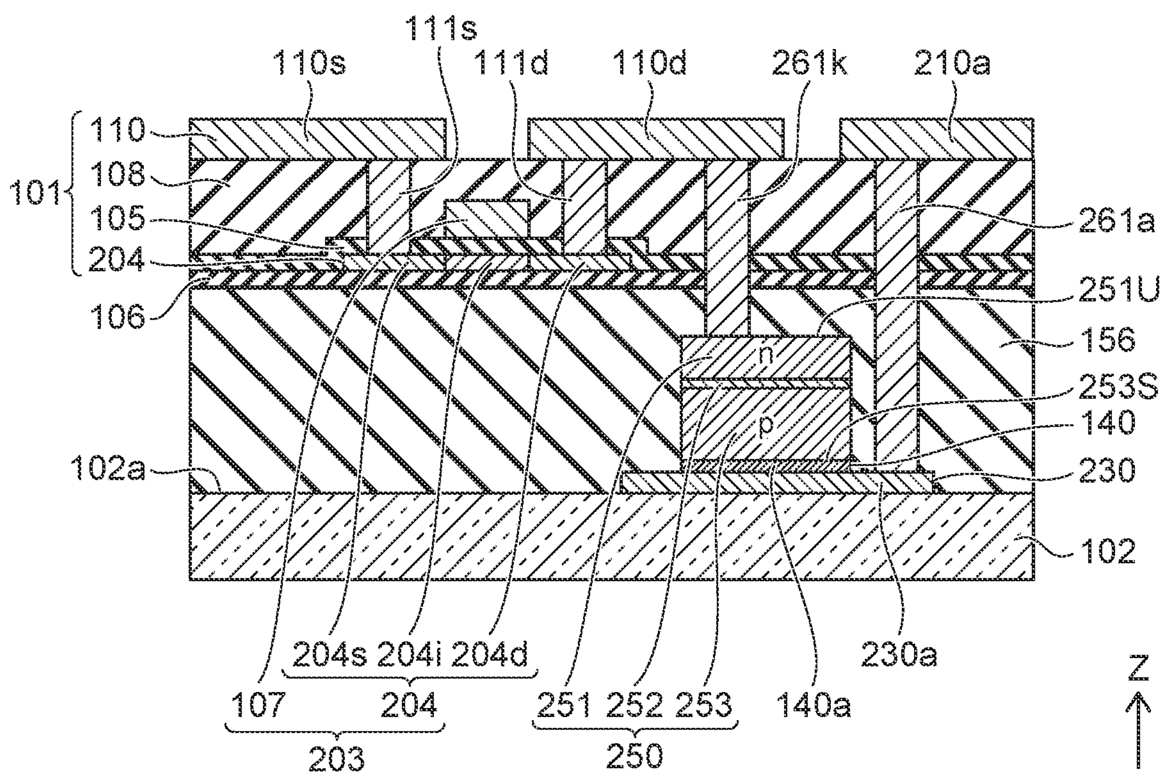
FIG. 15B is a schematic cross-sectional view illustrating a portion of the method for manufacturing the image display device of the second embodiment.

As shown in FIG. 15B, the second inter-layer insulating film 108 is formed to cover the insulating layer 105 and the transistor 203. The vias 111*s* and 111*d* that extend through the second inter-layer insulating film 108 and the insulating layer 105 are formed. A via hole that is formed to extend through the second inter-layer insulating film 108, the insulating layer 105, the TFT underlying film 106, and the first inter-layer insulating film 156 and reach the upper surface 251U is filled with a conductive material to form the via (the first via) 261*k*. The via 261*k* is electrically connected to the upper surface 251U. A via hole that is formed to extend through the second inter-layer insulating film 108, the insulating layer 105, the TFT underlying film 106, and the first inter-layer insulating film 156 and reach the wiring part 230*a* is filled with a conductive material to form the via (the first via) 261*a*. The via 261*a* is electrically connected to the wiring part 230*a*. The wiring part 110*s* is connected to the via 111*s*. The wiring part 110*d* is connected to the vias 111*d* and 261*k*. The wiring part 210*a* is connected to the via 261*a*. The formation of the first wiring layer 110 and the connection process with the vias 111*s*, 111*d*, 261*a*, and 261*k* may be performed simultaneously with the formation process of the vias 111*s*, 111*d*, 261*a*, and 261*k*.

Thereafter, the color filter 180 shown in FIG. 11 is formed at the other surface 102*b* of the substrate 102, and the subpixel 220 is formed. Although it is favorable to form the color filter 180 by inkjet printing as described with reference to FIGS. 7A to 7D above, the film adhesion technique described with reference to FIG. 8 may be used. Also, a monochromatic image display device may be made without providing a color filter.

Effects of the image display device of the embodiment will now be described.

Similarly to the other embodiment described above, the image display device of the embodiment have the effects of reducing the time of the transfer process for forming the light-emitting element 250 and reducing the number of processes. Also, the light-emitting surface 253S can be the p-type semiconductor layer 253 by setting the polarity of the TFT to be a p-channel. This is advantageous in that the degree of freedom of the circuit element arrangement and circuit design is increased, etc.

The second wiring layer 230 that includes the wiring part 230*a* is formed of a light-transmitting conductive film, and is therefore easy to introduce to the manufacturing process, and is easy to pattern into the desired shape. By making the second wiring layer 230 sufficiently light-transmissive, it is unnecessary to add a process of removing the substrate 102, etc., after forming the subpixel 220, which is advantageous because the manufacturing processes can be simplified and reduced.

According to the embodiment, the p-type semiconductor layer 253 can be electrically connected to an external circuit with a low resistance by connecting the wiring part 230*a* to the light-emitting surface 253S via the graphene sheet 140*a* and by connecting one end of the via 261*a* to the wiring part 230*a*. By using a vertical light-emitting element structure such as that of the embodiment, the components along the XY plane of the current flowing in the layers of the light-emitting element 250 can be suppressed and caused to be in directions along the Z-axis, and the loss inside the light-emitting element 250 can be reduced.

Although the connection between the p-type semiconductor layer 253 and the via 261*a* is performed by the wiring part 230*a* of the second wiring layer 230 according to the embodiment, such a connection is applicable to the first embodiment as well. In other words, the n-type semiconductor layer 151 and the via 161*k* can be connected via the graphene sheet 140*a* and the wiring part 230*a* by providing the n-type semiconductor layer 151 on the wiring part 230*a* with the graphene sheet 140*a* interposed.

Third Embodiment

Figure 16:
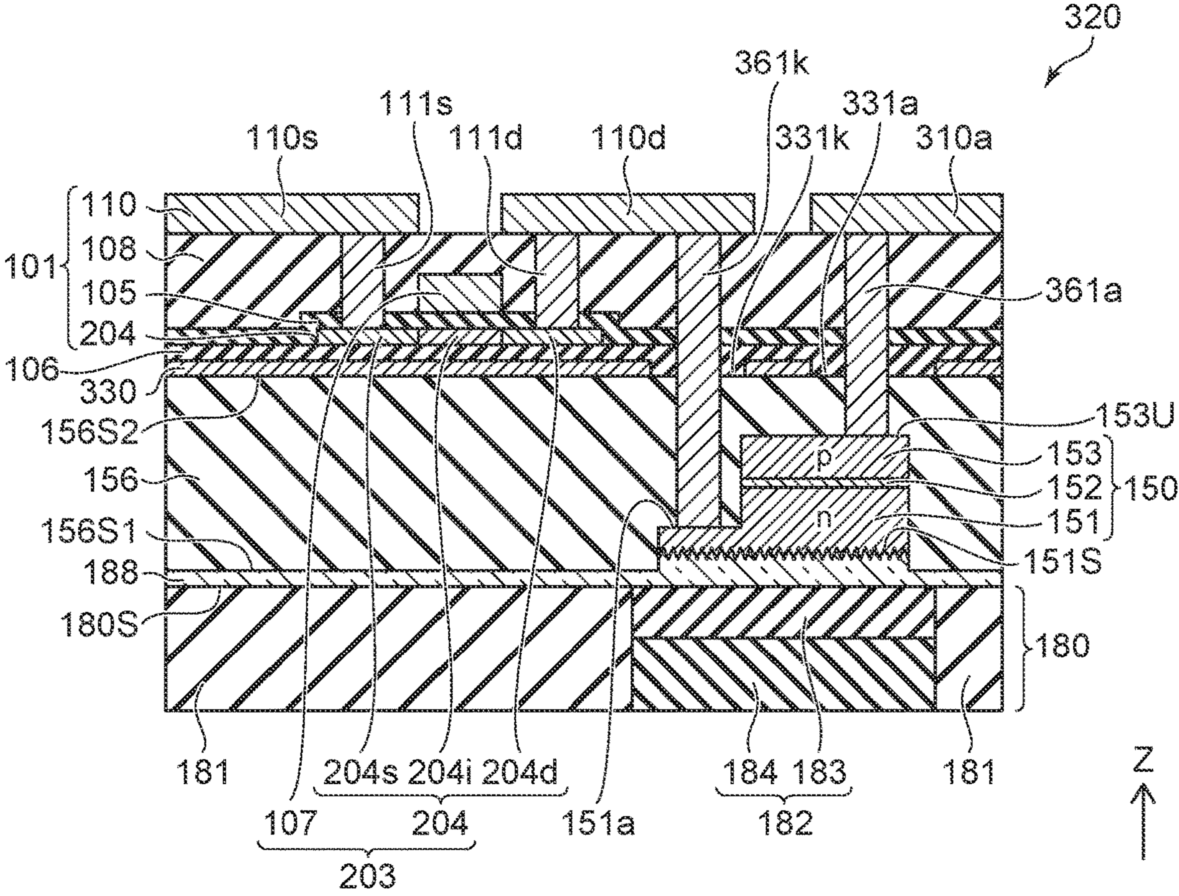
FIG. 16 is a schematic cross-sectional view illustrating a portion of an image display device according to a third embodiment.

FIG. 16 is a schematic cross-sectional view illustrating a portion of an image display device according to the embodiment.

The embodiment differs from the other embodiments described above in that the light-emitting element 150 in which the light-emitting surface 151S is provided by the n-type semiconductor layer 151 is driven by the n-channel transistor 203. The embodiment differs from the other embodiments described above in that a light-shielding layer 330 is located between the light-emitting element 150 and the transistor 203. The light-emitting element 150 of the embodiment also differs from that of the other embodiments described above in that the graphene sheet 140*a* is removed, and the light-emitting surface 151S is roughened. The same components as those of the other embodiments described above are marked with the same reference numerals, and a detailed description is omitted as appropriate.

As shown in FIG. 16, the image display device of the embodiment includes a subpixel 320. The subpixel 320 includes the color filter (the light-transmitting member) 180, the light-emitting element 150, the first inter-layer insulating film 156, the light-shielding layer 330, the transistor 203, the second inter-layer insulating film 108, a via (a first via) 361*a*, and the first wiring layer 110.

According to the embodiment, the light-emitting element 150 is located on a connection surface (a first surface) 180S of the color filter 180 and includes the roughened light-emitting surface 151S. A transparent resin layer 188 is located between the color filter 180 and the roughened light-emitting surface 151S. The transparent resin layer 188 also is located on one surface 156S1 of the first inter-layer insulating film 156, and the light-emitting element 150 and the first inter-layer insulating film 156 are located on the connection surface 180S of the color filter 180 with the transparent resin layer 188 interposed. The transparent resin layer 188 is formed to cover the surface 156S1 and the light-emitting surface 151S and forms a somewhat planarized plane, thereby making it easy to form the color filter 180.

The light-emitting element 150 includes the n-type semiconductor layer 151, the light-emitting layer 152, and the p-type semiconductor layer 153 stacked in this order from the light-emitting surface 151S toward the upper surface 153U. The light-emitting surface 151S that is the n-type semiconductor layer 151 is located on the connection surface 180S of the color filter 180. The connection surface 180S is a surface that contacts the transparent resin layer 188. The light-emitting element 150 radiates light in the negative direction of the Z-axis via the transparent resin layer 188 and the color conversion part 182 of the color filter 180.

The n-type semiconductor layer 151 includes the connection part 151*a*. The connection part 151*a* is provided to protrude in one direction from the n-type semiconductor layer 151 over the connection surface 180S. In the example, the connection part 151*a* is provided to protrude in a different direction from that of the other embodiments described above. The shape and configuration of the connection part 151*a* are similar to those of the first embodiment, and the shape and configuration of the light-emitting element 150 are similar to those of the first embodiment. One end of a via 361*k* is connected to the connection part 151*a*.

The light-shielding layer 330 is located between the first inter-layer insulating film 156 and the second inter-layer insulating film 108. The TFT underlying film 106 and the insulating layer 105 are located between the first inter-layer insulating film 156 and the second inter-layer insulating film 108. Therefore, more specifically, the light-shielding layer 330 is located between the first inter-layer insulating film 156 and the TFT underlying film 106. That is, the light-shielding layer 330 is provided over another surface 156S2 of the first inter-layer insulating film 156. The other surface 156S2 is the surface at the side opposite to the one surface 156S1 of the first inter-layer insulating film 156. The light-shielding layer 330 is provided over the entire surface between the first inter-layer insulating film 156 and the TFT underlying film 106 other than a portion.

The light-shielding layer 330 is formed of a light-shielding material. For example, the light-shielding layer 330 is formed of a light-reflective metal material as in the example, and may not be conductive as long as the material is light-shielding. The light-shielding layer 330 includes through-holes 331*a* and 331*k*. The through-hole 331*a* is located at a position of the light-shielding layer 330 that allows the via 361*a* to pass when projected onto the XY plane. The diameter of the through-hole 331*a* is set to be greater than the diameter of the via 361*a* so that the light-shielding layer 330 does not contact the via 361*a* when the via 361*a* passes through the through-hole 331*a*. The through-hole 331*k* is located at a position of the light-shielding layer 330 that allows the via 361*k* to pass when projected onto the XY plane. The diameter of the through-hole 331*k* is set to be greater than the diameter of the via 361*k* so that the light-shielding layer 330 does not contact the via 361*k* when the via 361*k* passes through the through-hole 331*k*.

The via 361*a* extends through the second inter-layer insulating film 108, the insulating layer 105, the TFT underlying film 106, the light-shielding layer 330, and the first inter-layer insulating film 156 and reach the upper surface 153U. The via 361*k* extends through the second inter-layer insulating film 108, the insulating layer 105, the TFT underlying film 106, the light-shielding layer 330, and the first inter-layer insulating film 156 and reach the connection part 151*a*.

Although the light-shielding layer 330 is formed of a metal material described above, the light-shielding layer 330 may be formed of a resin that is not conductive. In such a case, the resin is, for example, a black resin from the perspective of being light-shielding. When the light-shielding layer 330 is formed of a black resin, via holes can be collectively formed together with the first inter-layer insulating film 156, etc., and filled with a conductive material to form the vias without pre-forming the through-holes 331*k* and 331*a* having larger diameters than the diameters of the vias 361*k* and 361*a*.

The light-shielding layer 330 is provided to cover the TFT channel 204. When projected onto the XY plane, the light-shielding layer 330 is formed to include the outer perimeter of the TFT channel 204 when the TFT channel 204 is projected onto the light-shielding layer 330. That is, the outer perimeter of the TFT channel 204 is located within the outer perimeter of the light-shielding layer 330 when projected onto the XY plane. Even when scattered light and the like is radiated upward from the light-emitting element 150 located below the TFT channel 204, the scattered light and the like is shielded by the light-shielding layer 330, and malfunction of the transistor 203 can be suppressed because the scattered light and the like substantially cannot reach the TFT channel.

Although it is desirable, from the perspective of being light-shielding, to provide the light-shielding layer 330 over the entire surface between the first inter-layer insulating film 156 and the second inter-layer insulating film 108 as in the example, the light-shielding layer 330 is not limited to being one physical member. For example, the light-shielding layer 330 may be divided into a part directly under the TFT channel 204 and a part directly above the light-emitting element 150. Although the light-shielding layer 330 is not connected to any potential in the example, the light-shielding layer 330 may be connected to a specific potential such as a ground potential, a power supply potential, etc. When the light-shielding layer 330 includes multiple separated parts, all of the parts may be set to a common potential, or each part may be connected to a different potential.

The first wiring layer 110 is located on the second inter-layer insulating film 108. The first wiring layer 110 includes the wiring parts 110*s*, 110*d*, and 310*a*.

The via 111*s* is located between the wiring part 110*s* and the region 204*s* and electrically connects the wiring part 110*s* and the region 204*s*. The via 111*d* is located between the wiring part 110*d* and the region 204*d* and electrically connects the wiring part 110*d* and the region 204*d*.

The wiring part 110*s* is connected to the region 204*s* by the via 111*s*. The region 204*s* is a source region of the transistor 203. Accordingly, for example, the source region of the transistor 203 is electrically connected to the ground line 4 shown in FIG. 12 by the via 111*s* and the wiring part 110*s*.

The wiring part 110*d* is connected to the region 204*d* by the via 111*d*. The region 204*d* is a drain region of the transistor 203. One end of the wiring part 110*d* is located above the connection part 151*a*.

One end of the wiring part 310*a* is located above the light-emitting element 150. For example, the wiring part 310*a* is electrically connected to the power supply line 3 of FIG. 12.

The via 361*k* is located between the wiring part 110*d* and the connection part 151*a* and electrically connects the wiring part 110*d* and the connection part 151*a*. Accordingly, the drain region of the transistor 203 is electrically connected to the n-type semiconductor layer 151 by the via 111*d*, the wiring part 110*d*, the via 361*k*, and the connection part 151*a*.

The via 361*a* is located between the wiring part 310*a* and the upper surface 153U and electrically connects the wiring part 310*a* and the upper surface 153U. Accordingly, the p-type semiconductor layer 153 is electrically connected to the power supply line 3 by the via 361*a* and the wiring part 310*a*.

A method for manufacturing the image display device of the embodiment will now be described.

FIGS. 17A to 18B are schematic cross-sectional views illustrating a portion of the method for manufacturing the image display device of the embodiment.

Similarly to the first embodiment, the processes up to the process described with reference to FIG. 5A above are applied to the example. In the following description, the process of FIG. 17A and subsequent processes are applied after the process of FIG. 5A. However, as described above, the protruding direction of the connection part 151*a* according to the embodiment is different from that of FIG. 5A.

Figure 17A:
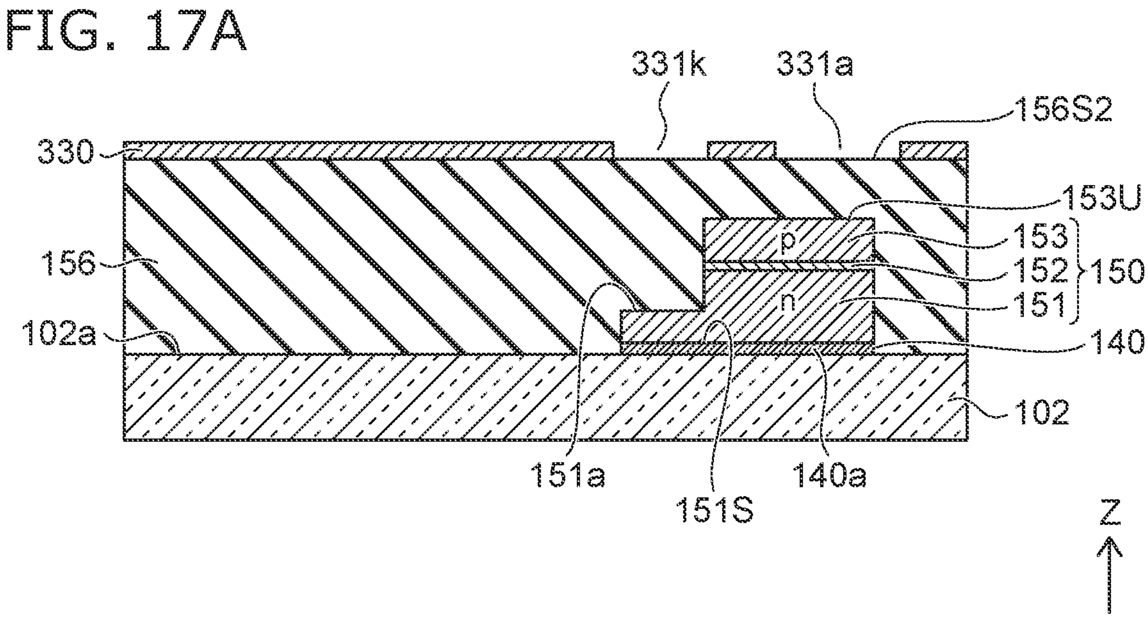
FIG. 17A is a schematic cross-sectional view illustrating a portion of a method for manufacturing the image display device of the third embodiment.

As shown in FIG. 17A, the light-shielding layer 330 is formed over the surface 156S2 of the first inter-layer insulating film 156. The through-holes 331*a* and 331*k* are formed to extend through the light-shielding layer 330 to expose the surface 156S2.

Figure 17B:
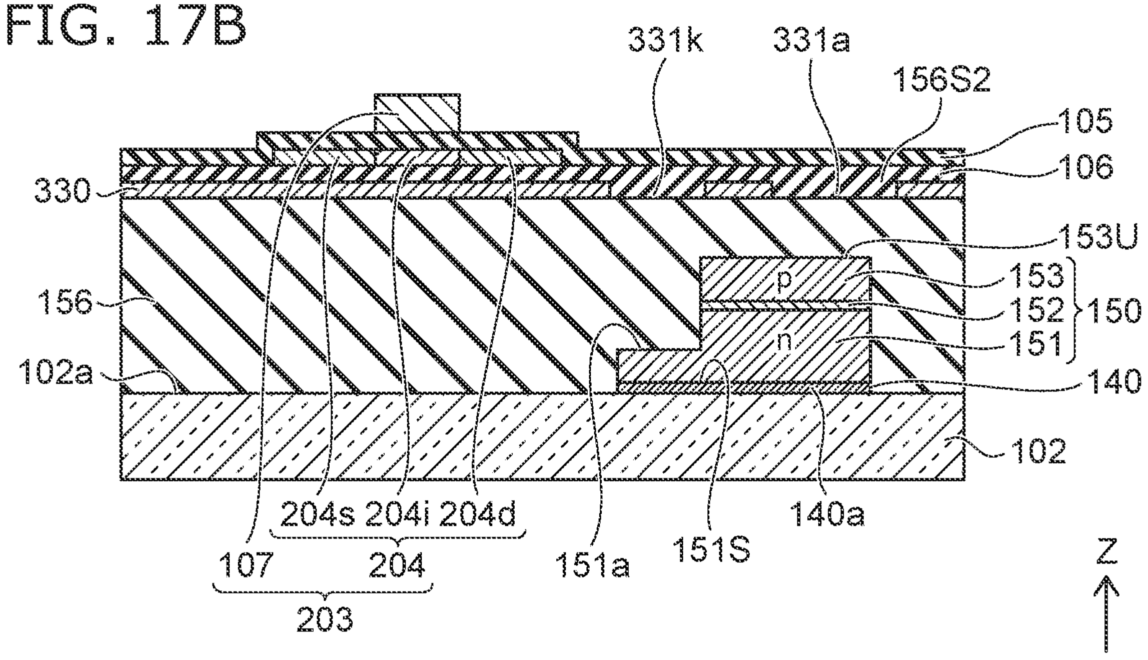
FIG. 17B is a schematic cross-sectional view illustrating a portion of the method for manufacturing the image display device of the third embodiment.

As shown in FIG. 17B, the TFT underlying film 106 is formed on the light-shielding layer 330 and the exposed surface 156S2. The through-holes 331*a* and 331*k* is filled with the material used to form the TFT underlying film 106; subsequently, the TFT underlying film 106 is planarized. The TFT channel 204 is formed on the planarized TFT underlying film 106. The transistor 203 is formed by forming the insulating layer 105 to cover the TFT channel 204, and by forming the gate 107 on the insulating layer 105. These processes can be performed similarly to the second embodiment by using a LTPS process.

Figure 18A:
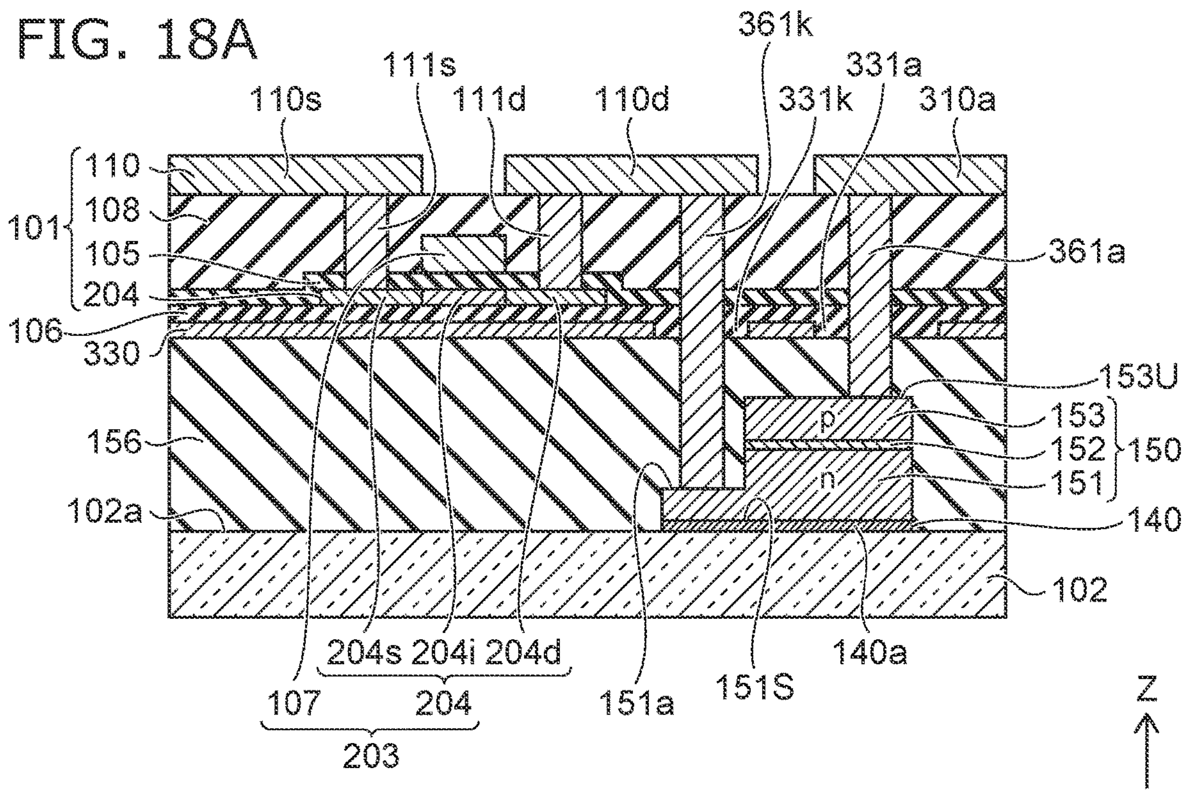
FIG. 18A is a schematic cross-sectional view illustrating a portion of the method for manufacturing the image display device of the third embodiment.

As shown in FIG. 18A, the second inter-layer insulating film 108 is formed to cover the insulating layer 105 and the gate 107, and the vias 111*s*, 111*d*, 361*k*, and 361*a* are formed. The first wiring layer 110 is formed on the second inter-layer insulating film 108, the via 111*s* is connected to the wiring part 110*s*, the via 111*d* and the via 361*k* are connected to the wiring part 110*d*, and the via 361*a* is connected to the wiring part 310*a*. These processes are the same as those of the other embodiments described above.

Figure 18B:
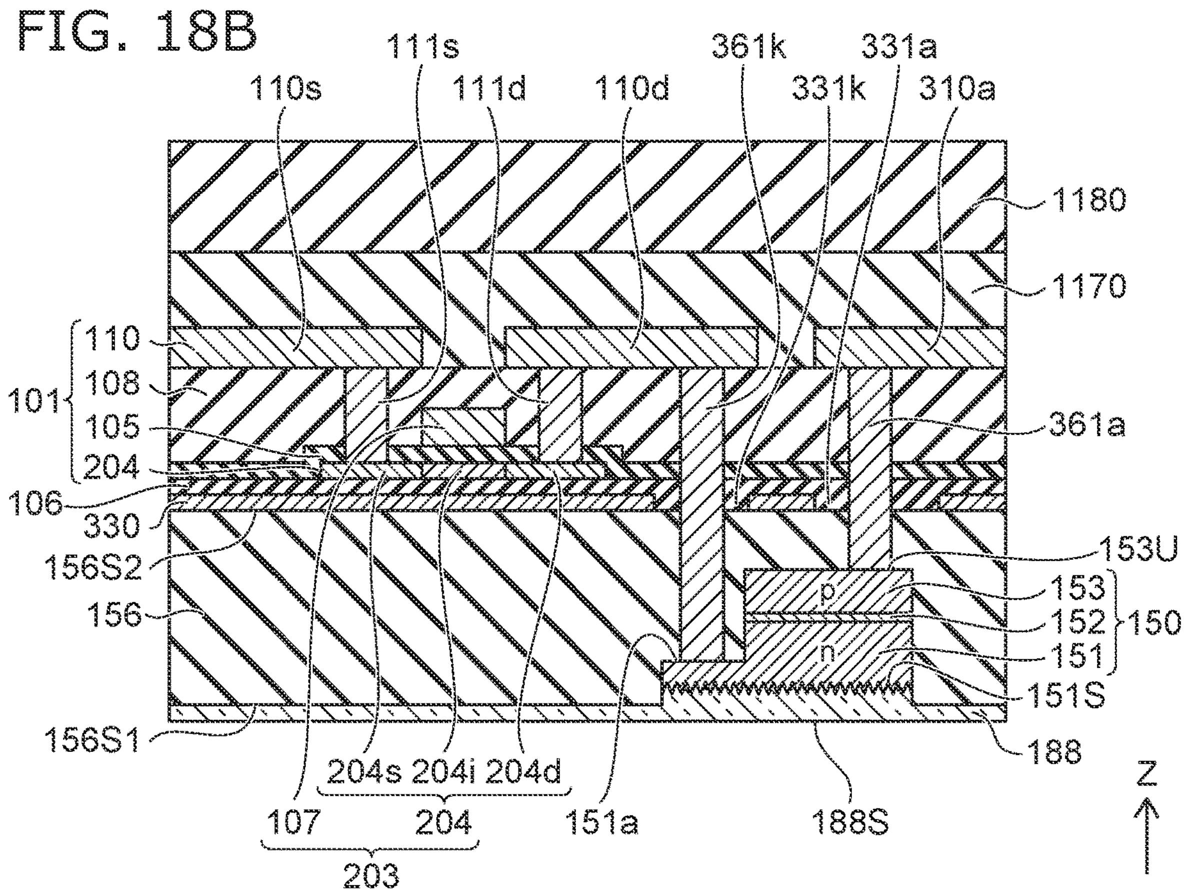
FIG. 18B is a schematic cross-sectional view illustrating a portion of the method for manufacturing the image display device of the third embodiment.

As shown in FIG. 18B, an adhesive layer 1170 is coated onto the second inter-layer insulating film 108 and the first wiring layer 110, and a reinforcing substrate 1180 is bonded by the adhesive layer 1170.

Subsequently, the substrate 102 and the graphene sheet 140*a* shown in FIG. 18A are removed sequentially or simultaneously by wet etching and/or laser lift-off.

The light-emitting surface 151S that is exposed after removing the graphene sheet 140*a* is roughened. For example, wet etching is used to roughen the light-emitting surface 151S.

Subsequently, the transparent resin layer 188 is provided to cover the surface 156S1 and the light-emitting surface 151S, and a substantially planarized color filter formation surface 188S is formed. The color filter 180 shown in FIG. 16 is formed on the color filter formation surface 188S, and the subpixel is formed. The substrate 102 shown in FIG. 18A is not removed when a monochromatic image display device is made without providing a color filter. In such a case, the light-emitting surface 151S is not roughened.

Effects of the image display device of the embodiment will now be described.

According to the method for manufacturing the image display device of the embodiment, other than the effects of reducing the time of the transfer process for forming the light-emitting element 150 and reducing the number of processes similarly to the other embodiments described above, the light-emitting surface 151S is the n-type semiconductor layer 151 that has a lower resistance than thep-type; therefore, the n-type semiconductor layer 151 can be formed to be thick enough that the light-emitting surface 151S can be roughened. By roughening the light-emitting surface 151S, the radiated light is diffused, and so the image display device of the embodiment can be used as a light source having a sufficient light emission area even for a small light-emitting element 150.

According to the embodiment, the light-emitting element 150 in which the light-emitting surface 151S is the n-type semiconductor layer 151 can be driven by the n-channel transistor 203. Therefore, the degree of freedom of the circuit configuration can be increased, and the design efficiency can be increased.

In the image display device of the embodiment, the light-shielding layer 330 is located between the first inter-layer insulating film 156 and the second inter-layer insulating film 108. That is, the light-shielding layer 330 is located between the light-emitting element 150 and the transistor 203. Therefore, when scattered light and the like is radiated upward from the light-emitting element 150, the radiated light does not easily reach the TFT channel 204, and malfunction of the transistor 203 can be prevented.

The light-shielding layer 330 can be formed of a conductive material such as a metal, etc., and the light-shielding layer 330 can be connected to any potential. For example, the light-shielding layer 330 can assist noise suppression by providing a portion of the light-shielding layer 330 directly under switching elements such as the transistor 203, etc., and by connecting to a ground potential, a power supply potential, etc.

The light-shielding layer 330 is not limited to the application to the embodiment and can be commonly applied to the subpixels of the other embodiments described above and other embodiments described below. Effects similar to those described above can be obtained even when applied to the other embodiments.

According to the embodiment, the color filter 180 is formed after removing the substrate 102 and the graphene sheet 140*a* to roughen the light-emitting surface 151S. As described above, by roughening the light-emitting surface 151S, more efficient light emission is possible, and the light can reach the color filter 180 without passing through the substrate 102, the graphene sheet 140*a*, etc. Therefore, even for a low-luminance light emission, a high-definition image can be displayed, which contributes to a power consumption reduction.

The configuration and method for manufacturing a light-emitting element including a roughened light-emitting surface are described in the example above. A roughened light-emitting surface such as that of the embodiment is applicable to a light-emitting element that includes a connection part. Specifically, the configuration of the light-emitting element including the roughened light-emitting surface is applicable to the light-emitting element 150 according to the first embodiment, the light-emitting element 250 according to the second embodiment, and a light-emitting element 650 according to the sixth embodiment. Also, the roughened light-emitting surface is applicable to a semiconductor layer 750 according to the seventh embodiment described below. The effects described above can be obtained by applying the roughening of the light-emitting surface to the components of such light-emitting elements.

Fourth Embodiment

Figure 19:
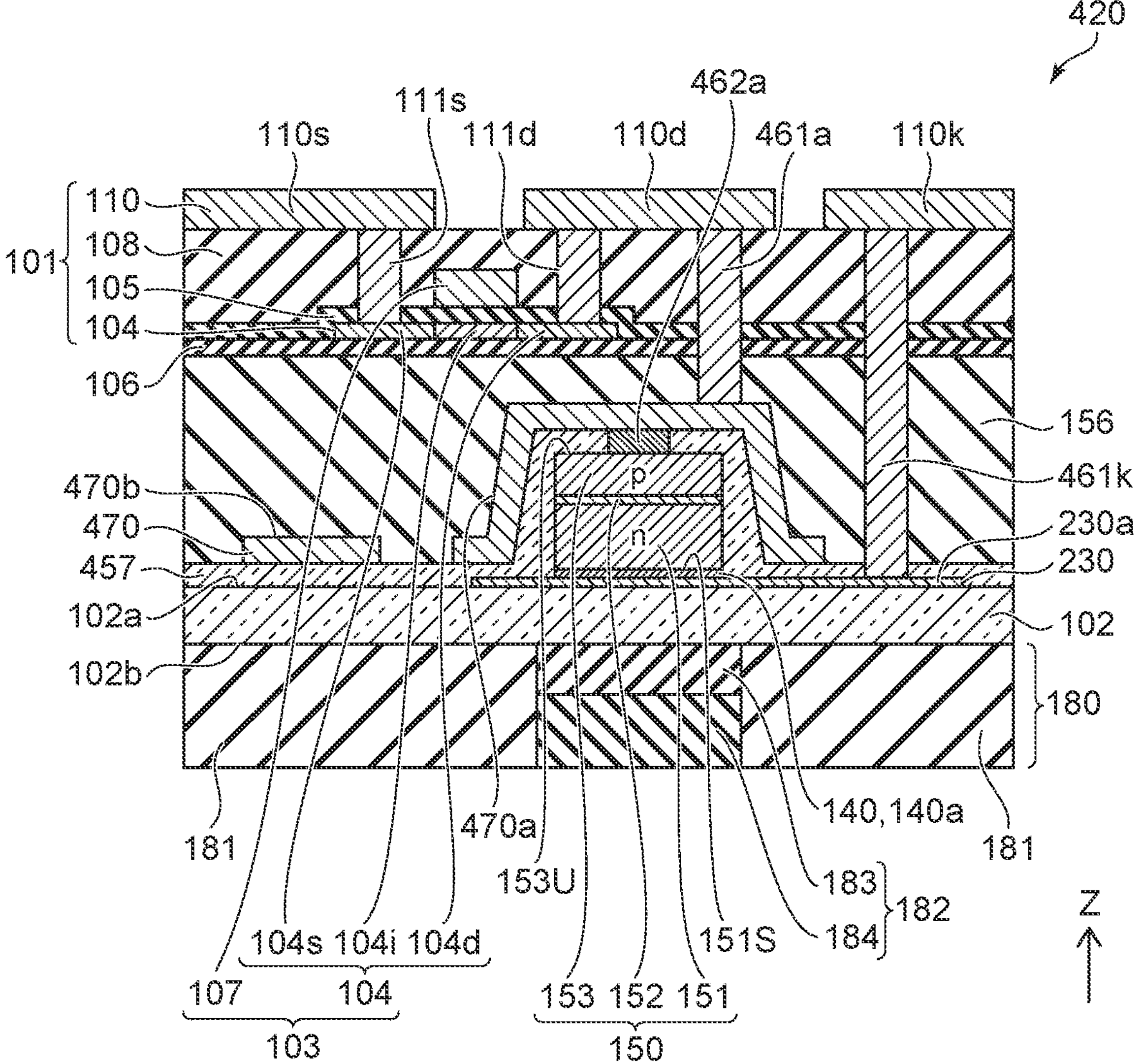
FIG. 19 is a schematic cross-sectional view illustrating a portion of an image display device according to a fourth embodiment.

FIG. 19 is a schematic cross-sectional view illustrating a portion of an image display device of the embodiment.

The embodiment differs from the other embodiments described above in that a third wiring layer 470 is included on the light-emitting element 150. Otherwise, the embodiment is the same as the other embodiments described above; the same components are marked with the same reference numerals, and a detailed description is omitted as appropriate.

As shown in FIG. 19, a subpixel 420 of the image display device of the embodiment includes the substrate 102, the second wiring layer 230, the graphene layer 140, the light-emitting element 150, the third wiring layer 470, the first inter-layer insulating film 156, the transistor 103, the second inter-layer insulating film 108, a via 461*a*, and the first wiring layer 110. The subpixel 420 further includes the color filter 180.

Similarly to the second embodiment, the second wiring layer 230 is located on the one surface 102*a* of the substrate 102. The second wiring layer 230 includes the multiple wiring parts 230*a*. The multiple wiring parts 230*a* are provided respectively for the light-emitting elements 150. The graphene sheet 140*a* is located on the wiring part 230*a*, and the light-emitting element 150 is located on the wiring part 230*a* with the graphene sheet 140*a* interposed. The configurations and functions of the second wiring layer 230 including the wiring part 230*a* and the graphene layer 140 including the graphene sheet 140*a* are respectively the same as those of the second embodiment, and a detailed description is omitted.

A resin layer 457 is provided to cover the surface 102*a*, the second wiring layer 230, the graphene layer 140, and the light-emitting element 150. The resin layer 457 is, for example, a transparent resin. The third wiring layer 470 is located on the resin layer 457. The third wiring layer 470 can include multiple wiring parts. For example, a portion of the multiple wiring parts can be physically separated and electrically set to different potentials. Another portion of the multiple wiring parts are physically connected. In the example, the third wiring layer 470 includes separated wiring parts 470*a* and 470*b*.

The wiring part (a first light-shielding electrode) 470*a* is provided over the top and side of the light-emitting element 150 and covers the upper surface 153U and the side surface of the light-emitting element 150. The wiring part 470*a* shields the sideward and upward-scattered light and reflected light of the light-emitting element 150 by covering almost the entire light-emitting element 150 other than the light-emitting surface 151S. A connection electrode 462*a* is located between the upper surface 153U and the wiring part 470*a* and electrically connects the upper surface 153U and the wiring part 470*a*. The wiring part 470*a* functions as a light-shielding electrode.

When the resin layer 457 is a transparent resin, the scattered light and the like that are emitted from the top and side of the light-emitting element 150 are reflected toward the light-emitting surface 151S side by the wiring part 470*a*. Therefore, the substantial luminous efficiency of the light-emitting element 150 is increased. When the resin layer 457 is a highly light-reflective material such as a white resin, etc., higher light reflectance can be realized by further locating the wiring part 470$a$ on the resin layer 457.

The via (the first via) 461$a$ extends through the second inter-layer insulating film 108, the insulating layer 105, the TFT underlying film 106, and the first inter-layer insulating film 156 and reach the wiring part (the first light-shielding electrode) 470$a$. The via 461$a$ is located between the wiring part 110$d$ and the wiring part 470$a$ and electrically connects the wiring part 110$d$ and the wiring part 470$a$. Accordingly, the p-type semiconductor layer 153 is electrically connected to the drain region of the transistor 103 via the connection electrode 462$a$, the wiring part 470$a$, the via 461$a$, the wiring part 110$d$, and the via 111$d$.

A via 461$k$ extends through the second inter-layer insulating film 108, the insulating layer 105, the TFT underlying film 106, the first inter-layer insulating film 156, and the resin layer 457 and reach the wiring part 230$a$. The via 461$k$ is located between the wiring part 110$k$ and the wiring part 230$a$ and electrically connects the wiring part 110$k$ and the wiring part 230$a$. Accordingly, for example, the n-type semiconductor layer 151 is electrically connected to the ground line 4 of the circuit of FIG. 2 via the graphene sheet 140$a$, the wiring part 230$a$, the via 461$k$, and the wiring part 110$k$.

The first inter-layer insulating film 156 is provided to cover the resin layer 457 and the third wiring layer 470. The configurations of the TFT underlying film 106 and the circuit 101 located on the first inter-layer insulating film 156 are respectively the same as those of the other embodiments described above, and a detailed description is omitted.

A method for manufacturing the image display device of the embodiment will now be described.

FIGS. 20A to 22B are schematic cross-sectional views illustrating the method for manufacturing the image display device of the embodiment.

According to the method for manufacturing the image display device of the embodiment, the processes described using FIGS. 13A and 13B are applied, and the process of FIG. 13B and subsequent processes are applied to the following description. However, in FIG. 13B, the p-type semiconductor layer 1153, the light-emitting layer 1152, and the n-type semiconductor layer 1151 are stacked on the graphene layer 1140 on the light-transmitting conductive film 1130 in this order from the graphene layer 1140 side in the positive direction of the Z-axis. According to the embodiment, the semiconductor layer 1150 includes the n-type semiconductor layer 1151, the light-emitting layer 1152, and the p-type semiconductor layer 1153 stacked in this order from the graphene layer 1140 side in the positive direction of the Z-axis. The technology described in the first and second embodiments described above is applied to the formation process of the semiconductor layer 1150.

Figure 20A:
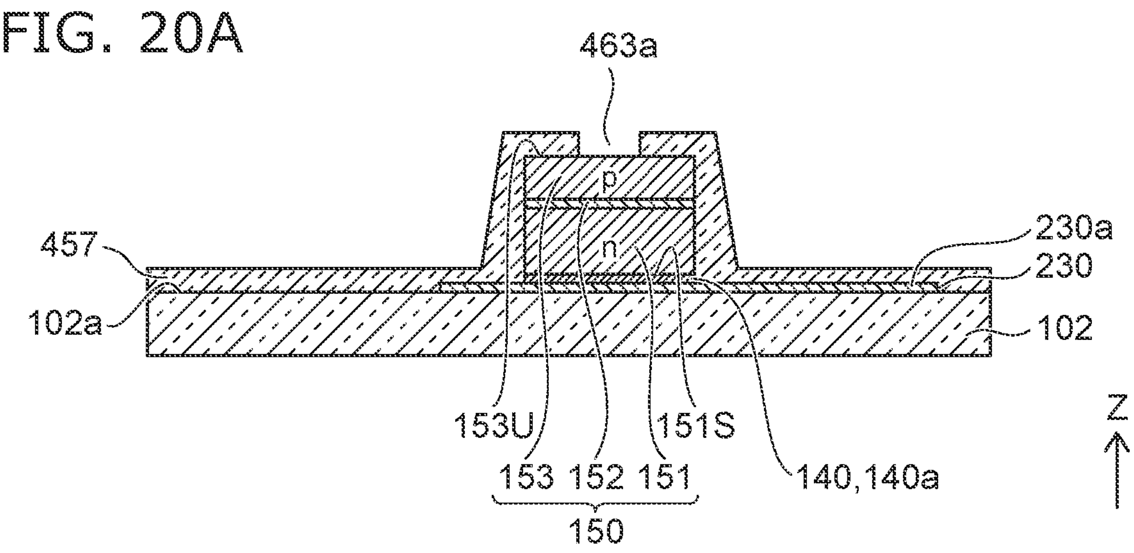
FIG. 20A is a schematic cross-sectional view illustrating a portion of a method for manufacturing the image display device of the fourth embodiment.

As shown in FIG. 20A, the second wiring layer 230 that includes the wiring part 230$a$ is formed by patterning the light-transmitting conductive film 1130 shown in FIG. 13B by etching. The semiconductor layer 1150 shown in FIG. 13B is patterned by etching to form the light-emitting element 150. The graphene layer 1140 shown in FIG. 13B is shaped into the graphene sheet 140$a$ by over etching when forming the light-emitting element 150.

The resin layer 457 is formed to cover the surface 102$a$, the wiring part 230$a$, the graphene sheet 140$a$, and the light-emitting element 150. An opening 463$a$ is formed in the resin layer 457 to expose a portion of the upper surface 153U of the light-emitting element 150.

Figure 20B:
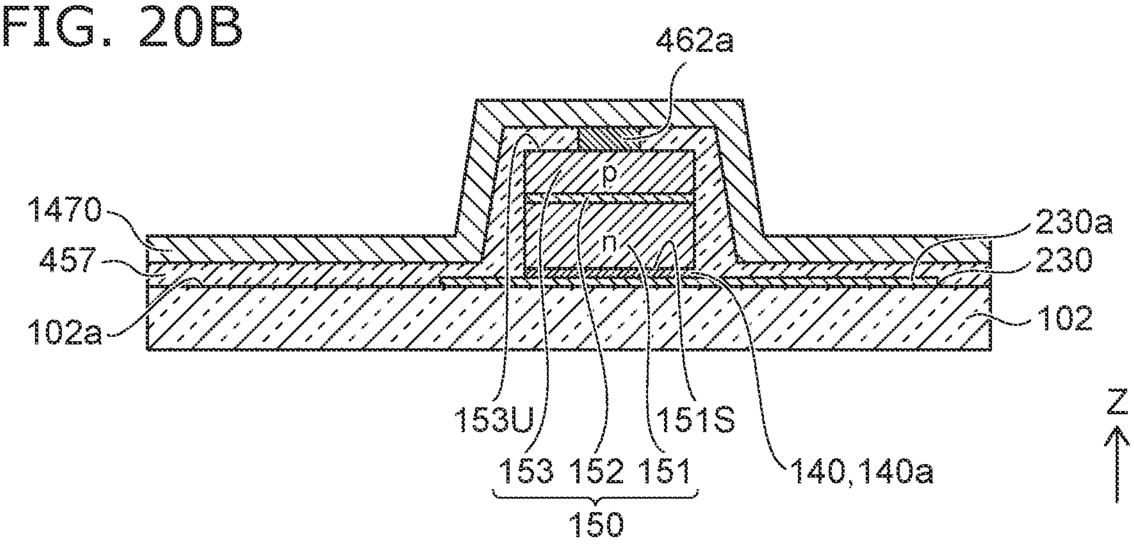
FIG. 20B is a schematic cross-sectional view illustrating a portion of the method for manufacturing the image display device of the fourth embodiment.

As shown in FIG. 20B, a metal layer 1470 is formed to cover the resin layer 457. The connection electrode 462$a$ may be formed by filling the opening 463$a$ shown in FIG. simultaneously when forming the metal layer 1470, or the metal layer 1470 may be formed after forming the connection electrode 462$a$ by filling the opening 463$a$.

Figure 21A:
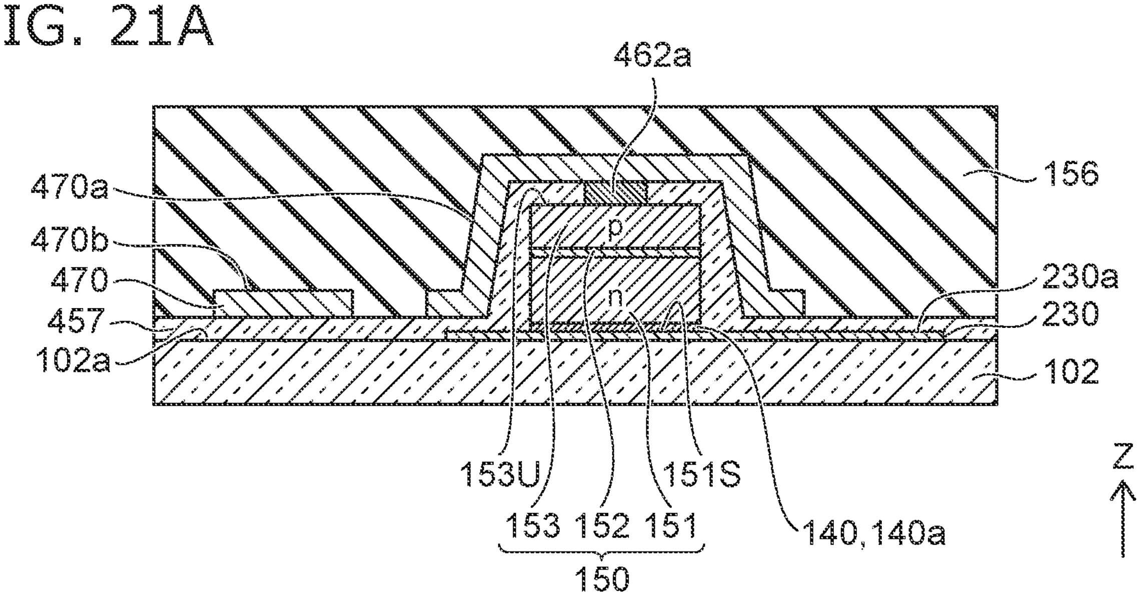
FIG. 21A is a schematic cross-sectional view illustrating a portion of the method for manufacturing the image display device of the fourth embodiment.
Figure 21A:

As shown in FIG. 21A, the metal layer 1470 shown in FIG. 20B is patterned by etching to form the third wiring layer 470. The wiring parts 470$a$ and 470$b$ are formed to be separated from each other when forming the third wiring layer 470. The wiring part 470$a$ is formed to cover the upper surface 153U and the side surface of the light-emitting element 150. The first inter-layer insulating film 156 is formed to cover the resin layer 457 and the third wiring layer 470.

Figure 21B:
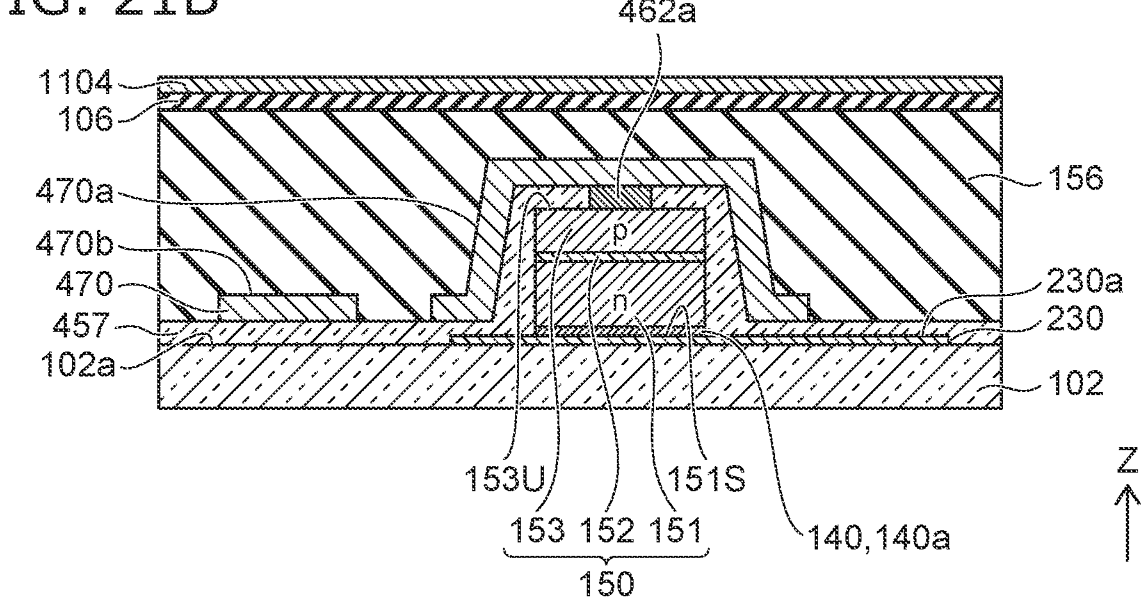
FIG. 21B is a schematic cross-sectional view illustrating a portion of the method for manufacturing the image display device of the fourth embodiment.

As shown in FIG. 21B, the TFT underlying film 106 is formed on the first inter-layer insulating film 156, and the polycrystallized Si layer 1104 is formed on the TFT underlying film 106.

Figure 22A:
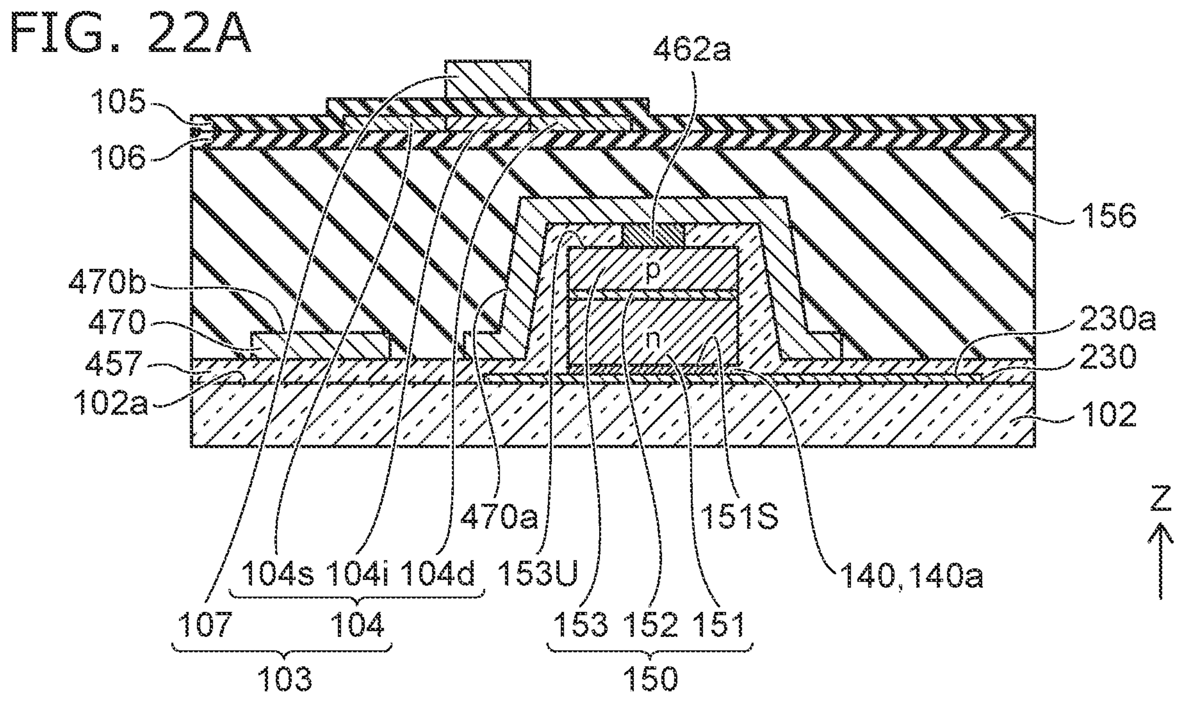
FIG. 22A is a schematic cross-sectional view illustrating a portion of the method for manufacturing the image display device of the fourth embodiment.

As shown in FIG. 22A, the TFT channel 104, the insulating layer 105, the gate 107, and the regions 104$s$, 104$d$, and 104$i$ are formed by using a LTPS process, etc.

Figure 22B:
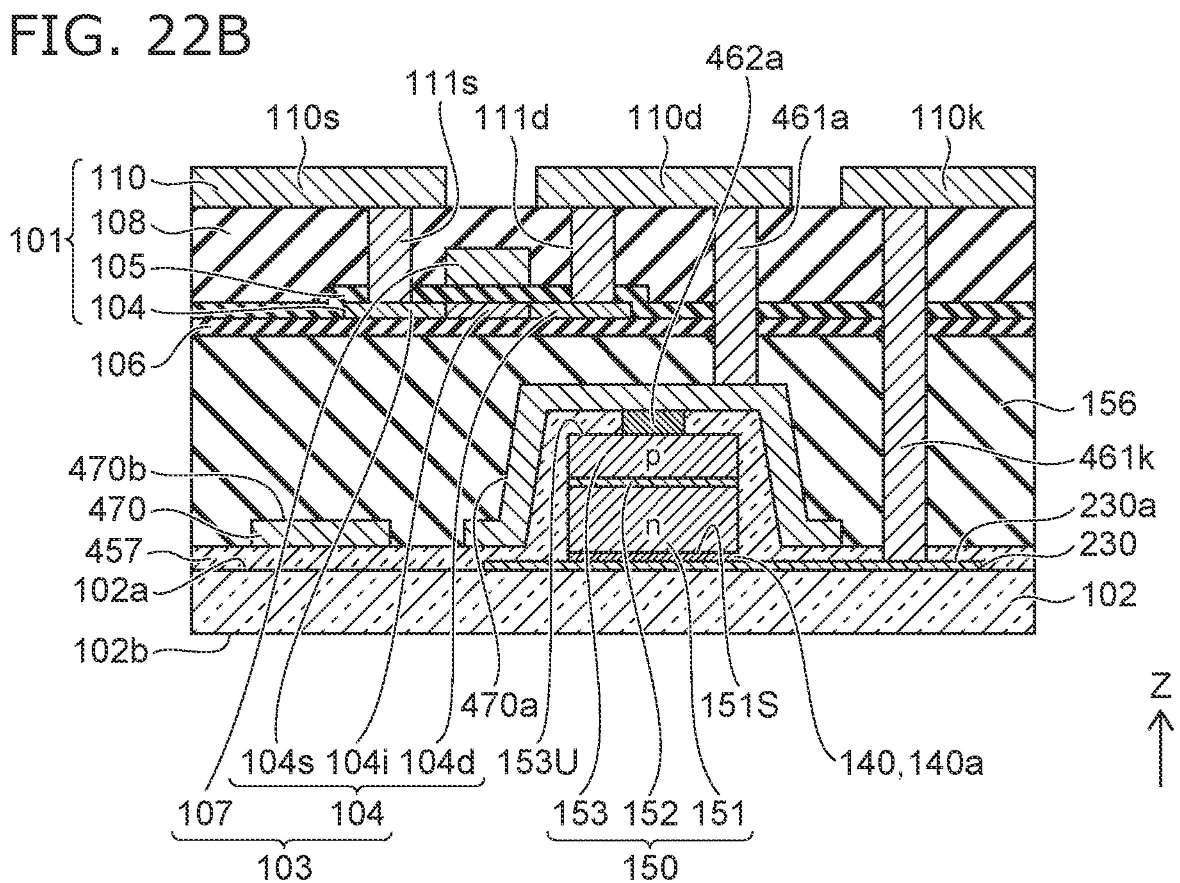
FIG. 22B is a schematic cross-sectional view illustrating a portion of the method for manufacturing the image display device of the fourth embodiment.

As shown in FIG. 22B, the vias 111$s$, 111$d$, 461$a$, and 461$k$ are formed, and the first wiring layer 110 is formed on the second inter-layer insulating film 108. A via hole that is formed to reach the wiring part 230$a$ is filled with a conductive material to form the via 461$k$.

The technology described in the methods for manufacturing the image display devices of the other embodiments described above is applicable to the details of the manufacturing processes of FIGS. 21A to 22B.

Subsequently, the color filter 180 is formed at the other surface 102$b$ of the substrate 102, and the subpixel 420 is formed. As shown in FIG. 10, the monochromatic image display device may be made without providing a color filter.

Effects of the image display device of the embodiment will now be described.

Similarly to the other embodiments described above, the image display device of the embodiment has the effects of reducing the time of the transfer process for forming the light-emitting element 150 and reducing the number of processes. The image display device of the embodiment also has the following effects.

In the image display device of the embodiment, the subpixel 420 includes the third wiring layer 470. The third wiring layer 470 is electrically isolated from the light-emitting element 150 by the resin layer 457. The third wiring layer 470 includes the wiring part 470$a$, and the wiring part 470$a$ covers the upper surface 153U and the side surface of the light-emitting element 150 via the resin layer 457. Therefore, the upward and sideward-scattered light and the like of the light-emitting element 150 can be shielded. Even when the transistor 103 is located above the light-emitting element 150, the upward and sideward-scattered light and the like of the light-emitting element 150 that reaches the transistor 103 is suppressed because such scattered light and the like is shielded by the wiring part 470$a$. Therefore, malfunction of the transistor 103 due to the scattered light and the like of the light-emitting element 150 is prevented. The wiring part 470$b$ that is formed simultaneously with the wiring part 470$a$ can be utilized as a connection to another circuit element, etc., and can help increase the efficiency of the wiring layout.

According to the embodiment, similarly to the second embodiment, the second wiring layer 230 is provided by patterning the light-transmitting conductive film, and the wiring part 230$a$ is connected to the light-emitting surface 151S. Therefore, the patterning is easy, and the manufacturing processes can be simplified and reduced.

The vertical light-emitting element structure suppresses the current component flowing in the lateral direction, which is advantageous in that the internal loss of the light-emitting element 150 can be reduced.

Fifth Embodiment

Figure 23:
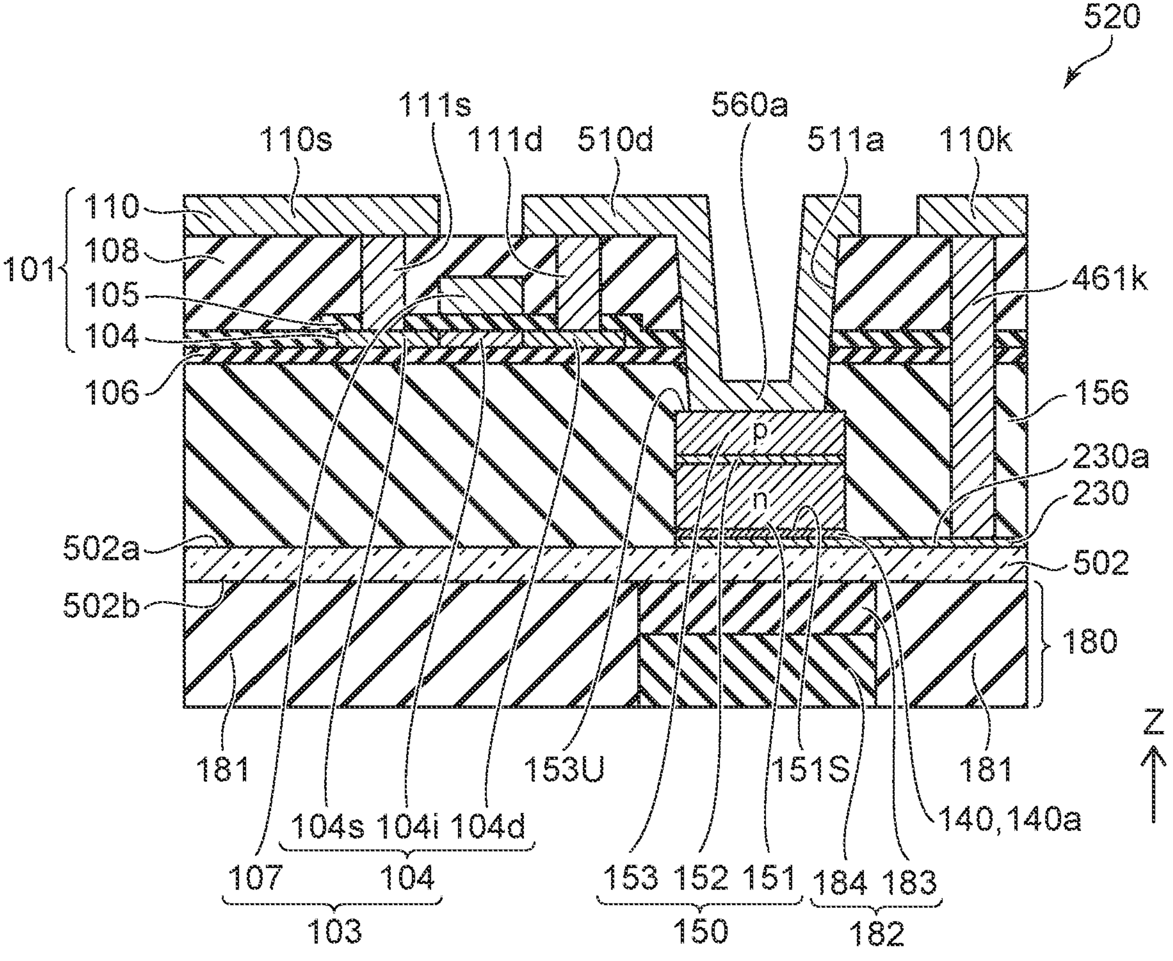
FIG. 23 is a schematic cross-sectional view illustrating a portion of an image display device according to a fifth embodiment.

FIG. 23 is a schematic cross-sectional view illustrating a portion of an image display device of the embodiment.

The embodiment differs from the other embodiments described above in that a light-shielding electrode 560*a* that covers the upper surface 153U of the light-emitting element 150 is included, and the light-shielding electrode 560*a* is connected to a wiring part 510*d* formed at the wall surface of a through-hole 511*a*. In the example, a light-transmitting substrate such as a glass substrate or the like is thinned, and the color filter 180 is located on the thinned substrate 502. Otherwise, the embodiment is the same as the other embodiments; the same components are marked with the same reference numerals, and a detailed description is omitted as appropriate.

As shown in FIG. 23, a subpixel 520 of the image display device of the embodiment includes the substrate 502, the second wiring layer 230, the graphene layer 140, the light-emitting element 150, the light-shielding electrode 560*a*, the first inter-layer insulating film 156, the transistor 103, the second inter-layer insulating film 108, and the first wiring layer 110.

The substrate 502 includes two surfaces 502*a* and 502*b*. The surface 502*b* is the surface at the side opposite to the surface 502*a*. The substrate 502 is a light-transmitting substrate, e.g., a glass substrate. Other than a glass substrate, the substrate 502 may be a light-transmitting resin substrate. The light-emitting element 150 is located on the one surface (the first surface) 502*a* of the substrate 502. The color filter 180 is located at the other surface 502*b* of the substrate 502. The color filter 180 is the same as those of the other embodiments described above.

The light-emitting element 150 is located on the wiring part 230*a* of the second wiring layer 230 with the graphene sheet 140*a* interposed and is electrically connected to the wiring part 230*a* via the graphene sheet 140*a* at the light-emitting surface 151S. The configurations of the second wiring layer 230 including the wiring part 230*a*, the graphene layer 140 including the graphene sheet 140*a*, the light-emitting element 150, and the first inter-layer insulating film 156 are the same as those of the other embodiments described above. The via 461*k* also is the same as that of the fourth embodiment described above in that the via 461*k* electrically connects the wiring part 110*k* and the wiring part 230*a* between the wiring part 110*k* and the wiring part 230*a*. The configuration of the transistor 103 on the TFT underlying film 106 also is the same as that of the other embodiments described above. A detailed description of these components is omitted.

The through-hole 511*a* is located above the light-emitting element 150. The through-hole 511*a* extends through the second inter-layer insulating film 108, the insulating layer 105, the TFT underlying film 106, and the first inter-layer insulating film 156 and reach the upper surface 153U. The inner perimeter of the through-hole 511*a* when projected onto the XY plane is the same as the outer perimeter of the upper surface 153U when projected onto the XY plane, or is provided slightly inward of the outer perimeter of the upper surface 153U when projected onto the XY plane.

The light-shielding electrode (a second light-shielding electrode) 560*a* is provided over the upper surface 153U. Because the light-shielding electrode 560*a* is located at the bottom portion of the through-hole 511*a*, the outer perimeter of the light-shielding electrode 560*a* when projected onto the XY plane substantially matches the inner perimeter of the through-hole 511*a* when projected onto the XY plane. Accordingly, the light-shielding electrode 560*a* is provided to cover the entire upper surface 153U or substantially the entire upper surface 153U.

The light-shielding electrode 560*a* shields the upward-scattered light and the like of the light-emitting element 150. Therefore, malfunction of the transistor 103 is prevented because the upward-scattered light and the like that reach the transistor 103 are suppressed. The light-reflectivity can be improved by forming the light-shielding electrode 560*a* of a highly reflective material such as Ag, etc., or by providing an ITO film between the light-shielding electrode 560*a* and the upper surface 153U. By improving the light-reflectivity, the scattered light and the like traveling toward the upper surface 153U side can be reflected toward the light-emitting surface 151S side, and the substantial luminous efficiency of the light-emitting element 150 can be increased. Because the light-shielding electrode 560*a* may be formed as a continuous body with the wiring part 510*d* formed on the wall surface of the through-hole 511*a*, the light-shielding electrode 560*a* and the wiring part 510*d* correspond to the function of the via (the first via) 161*a* connecting the first wiring layer 110 and the upper surface of the light-emitting element 150 according to the other embodiments described above, etc.

The first wiring layer 110 includes the wiring part 510*d*. The wiring part 510*d* is located on the second inter-layer insulating film 108 and on the wall surface of the through-hole 511*a*, and is connected to the light-shielding electrode 560*a* at the bottom portion of the through-hole 511*a*. The wiring part 510*d* is connected to the drain region of the transistor 103 by the via 111*d*, and so the p-type semiconductor layer 153 is electrically connected to the drain region of the transistor 103 via the light-shielding electrode 560*a*, the wiring part 510*d*, and the via 111*d*.

The other configurations such as the transistor 103, etc., are the same as those of the other embodiments described above, and a detailed description is omitted.

A method for manufacturing the image display device of the embodiment will now be described.

FIGS. 24A to 25B are schematic cross-sectional views illustrating a portion of the method for manufacturing the image display device of the embodiment.

According to the method for manufacturing the image display device of the embodiment, the processes described using FIGS. 13A and 13B are applied, and the following description is applied to the process of FIG. 13B and subsequent processes. Similarly to the fourth embodiment, the polarity of the semiconductor layer 1150 shown in FIG. 13B is the opposite of that of the second embodiment.

Figure 24A:
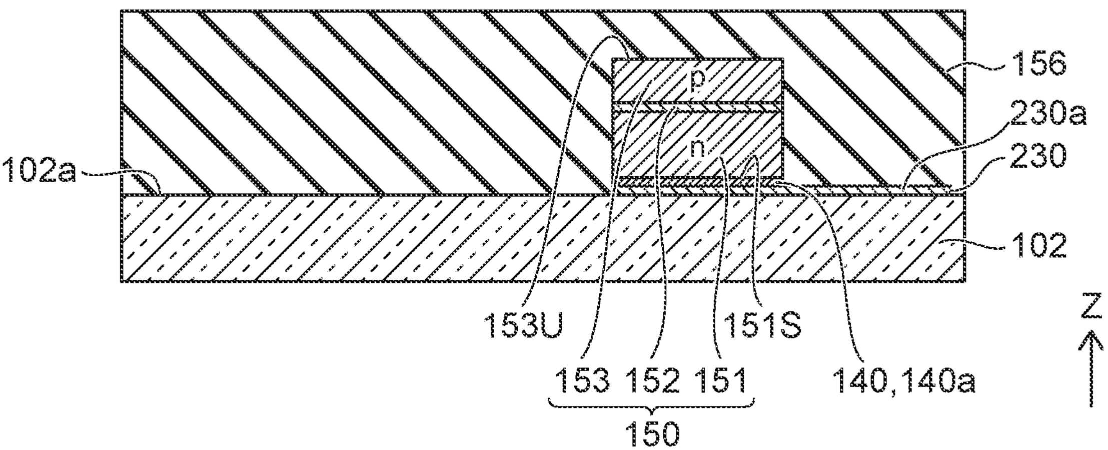
FIG. 24A is a schematic cross-sectional view illustrating a portion of a method for manufacturing the image display device of the fifth embodiment.

As shown in FIG. 24A, the light-transmitting conductive film 1130 shown in FIG. 13B is patterned by etching to form the second wiring layer 230 including the wiring part 230*a*. The semiconductor layer 1150 shown in FIG. 13B is patterned by etching to form the light-emitting element 150. The graphene layer 1140 shown in FIG. 13B is shaped into the graphene sheet 140*a* by over etching when forming the light-emitting element 150. The first inter-layer insulating film 156 is formed to cover the surface 102*a*, the second wiring layer 230 including the wiring part 230*a*, the graphene layer 140 including the graphene sheet 140*a*, and the light-emitting element 150.

Figure 24B:
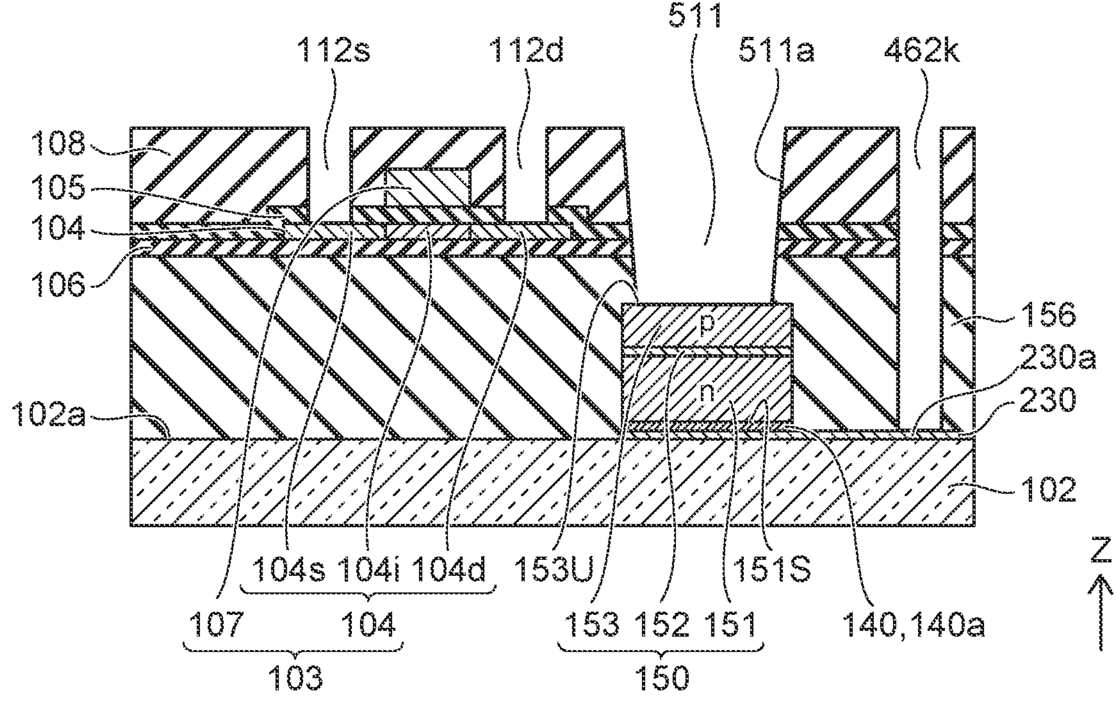
FIG. 24B is a schematic cross-sectional view illustrating a portion of the method for manufacturing the image display device of the fifth embodiment.

As shown in FIG. 24B, the through-hole 511*a* is formed to extend through the second inter-layer insulating film 108, the insulating layer 105, the TFT underlying film 106, and the first inter-layer insulating film 156 located above the upper surface 153U of the light-emitting element 150 and reach the upper surface 153U. A portion of the upper surface 153U is exposed in an opening 511 by forming the through-hole 511*a*.

Although it is favorable for the entire upper surface 153U to be exposed by the opening 511 of the through-hole 511*a*, the upper surface 153U that is exposed is set according to the formation accuracy of the through-hole 511*a*. For example, the inner perimeter of the through-hole 511*a* when projected onto the XY plane is set to be slightly smaller than the outer perimeter of the upper surface 153U when projected onto the XY plane.

A via hole 462*k* that extends through the second inter-layer insulating film 108, the insulating layer 105, the TFT underlying film 106, and the first inter-layer insulating film 156 and reaches the wiring part 230*a* is formed. A via hole 112*d* that extends through the second inter-layer insulating film 108 and the insulating layer 105 and reaches the region 104*d* is formed. A via hole 112*s* that extends through the second inter-layer insulating film 108 and the insulating layer 105 and reaches the region 104*s* is formed. For example, the via holes 462*k*, 112*d*, and 112*s* are formed simultaneously with these multiple via holes. The through-hole 511*a* also may be formed simultaneously with the via holes 462*k*, 112*d*, and 112*s* or may be formed separately.

Figure 25A:
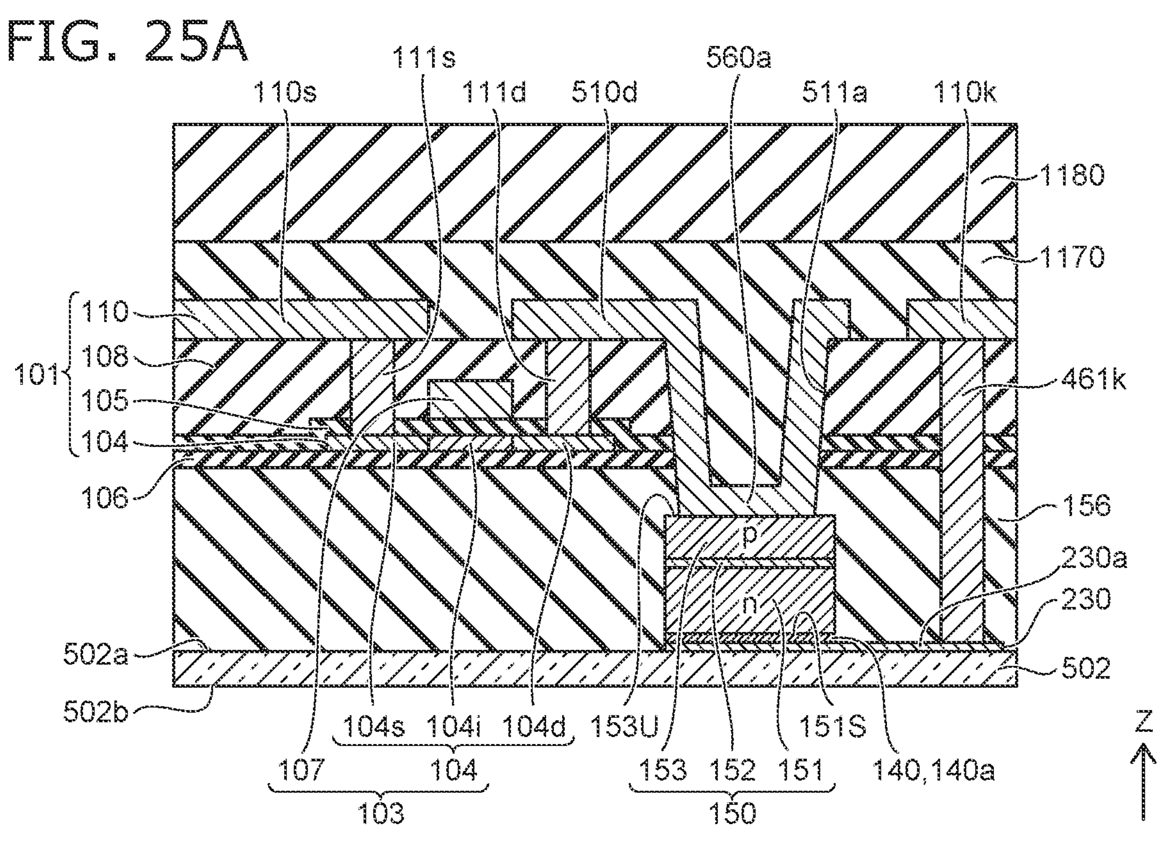
FIG. 25A is a schematic cross-sectional view illustrating a portion of the method for manufacturing the image display device of the fifth embodiment.

As shown in FIG. 25A, the vias 461*k*, 111*d*, and 111*s* are formed by filling the via holes 462*k*, 112*d*, and 112*s* shown in FIG. 24B with a conductive material. The bottom portion of the through-hole 511*a*, i.e., the upper surface 153U, may be covered with the conductive material when forming the vias 461*k*, 111*d*, and 111*s*.

The first wiring layer 110 is formed on the second inter-layer insulating film 108. When forming the first wiring layer 110, a conductive layer used to form the first wiring layer 110 is formed on the second inter-layer insulating film 108 and patterned by etching to form the first wiring layer 110 including the wiring parts 110*k*, 510*d*, and 110*s*. The conductive layer is formed over the second inter-layer insulating film 108, the exposed upper surface 153U, and the wall surface of the through-hole 511*a*.

Thus, the wiring part 110*k* that is connected to the via 461*k* is formed, the wiring part 510*d* that is connected to the via 111*d* is formed, and the wiring part 110*s* that is connected to the via 111*s* is formed. The wiring part 510*d* is provided over the wall surface of the through-hole 511*a* and is therefore connected with the upper surface 153U as well.

The adhesive layer 1170 is located on the second inter-layer insulating film 108 and the first wiring layer 110, and the reinforcing substrate 1180 is bonded by the adhesive layer 1170. Subsequently, the substrate 102 shown in FIG. 24B is thinned by wet etching, etc., to be patterned into the thin substrate 502.

Figure 25B:
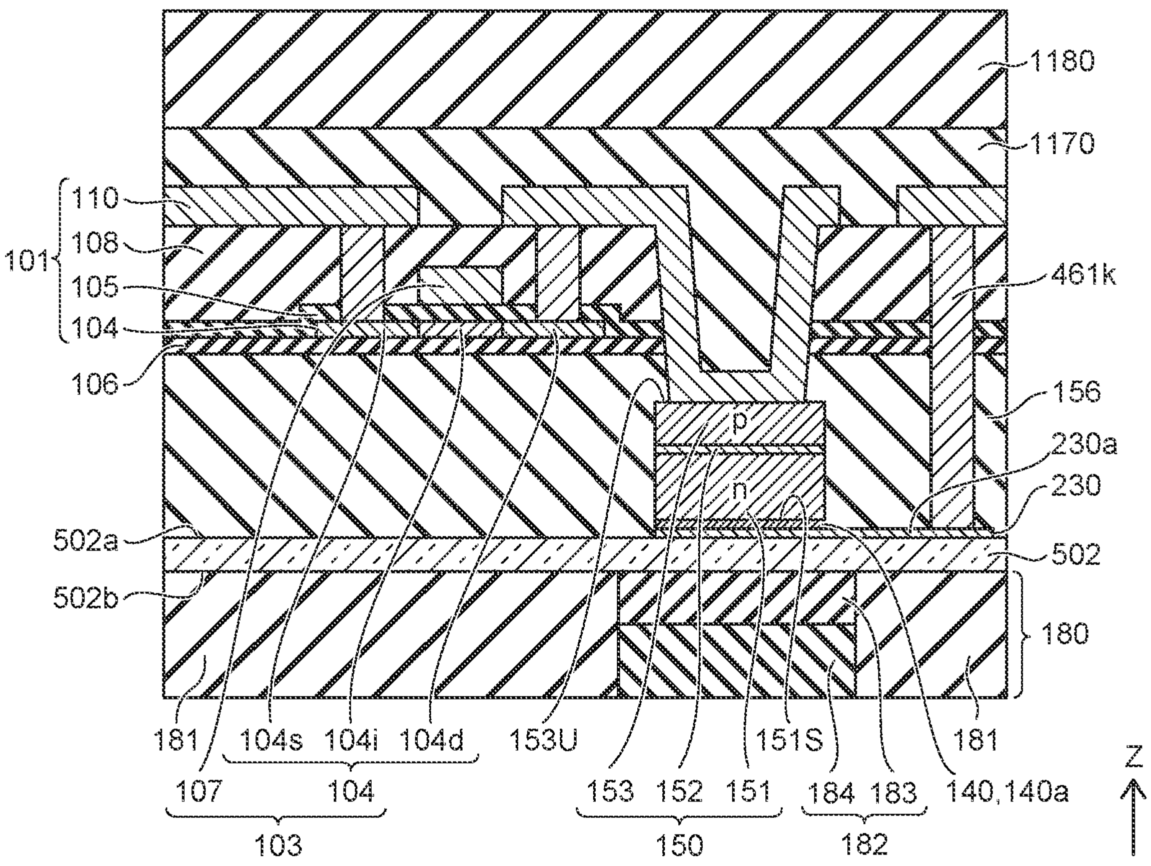
FIG. 25B is a schematic cross-sectional view illustrating a portion of the method for manufacturing the image display device of the fifth embodiment.

As shown in FIG. 25B, the color filter 180 is formed at the other surface 502*b* of the substrate 502.

When the substrate 502 is a light-transmitting resin substrate, for example, it is sufficient for the substrate 502 to be a resin layer formed on a glass substrate. It is sufficient to remove the glass substrate by wet etching, etc., after the light-emitting element, etc., are formed on the substrate 502, i.e., the resin layer, after which the color filter 180 may be formed at the surface 502*b* from which the glass substrate was removed. As shown in FIG. 10, a monochromatic image display device may be made without providing a color filter. In such a case, the thinning processing of the substrate 102 shown in FIG. 24B may be omitted.

Thus, the subpixel 520 is formed.

Effects of the image display device of the embodiment will now be described.

Similarly to the image display devices of the other embodiments described above, the image display device of the embodiment has the effects of reducing the time of the transfer process for forming the light-emitting element 150 and reducing the number of processes. Also, because the light-shielding electrode 560*a* is provided over the upper surface 153U, the scattered light and the like that are radiated upward by the light-emitting element 150 can be shielded. Malfunction of the transistor 103 located above the light-emitting element 150 is prevented because the light that reaches the transistor 103 is suppressed by the light-shielding electrode 560*a*.

According to the embodiment, it is unnecessary to add a process for forming the light-shielding electrode 560*a* because the light-shielding electrode 560*a* can be formed when forming the vias and the first wiring layer 110. Therefore, the manufacturing processes can be reduced, and the period from material input to product completion can be shortened.

Sixth Embodiment

Figure 26:
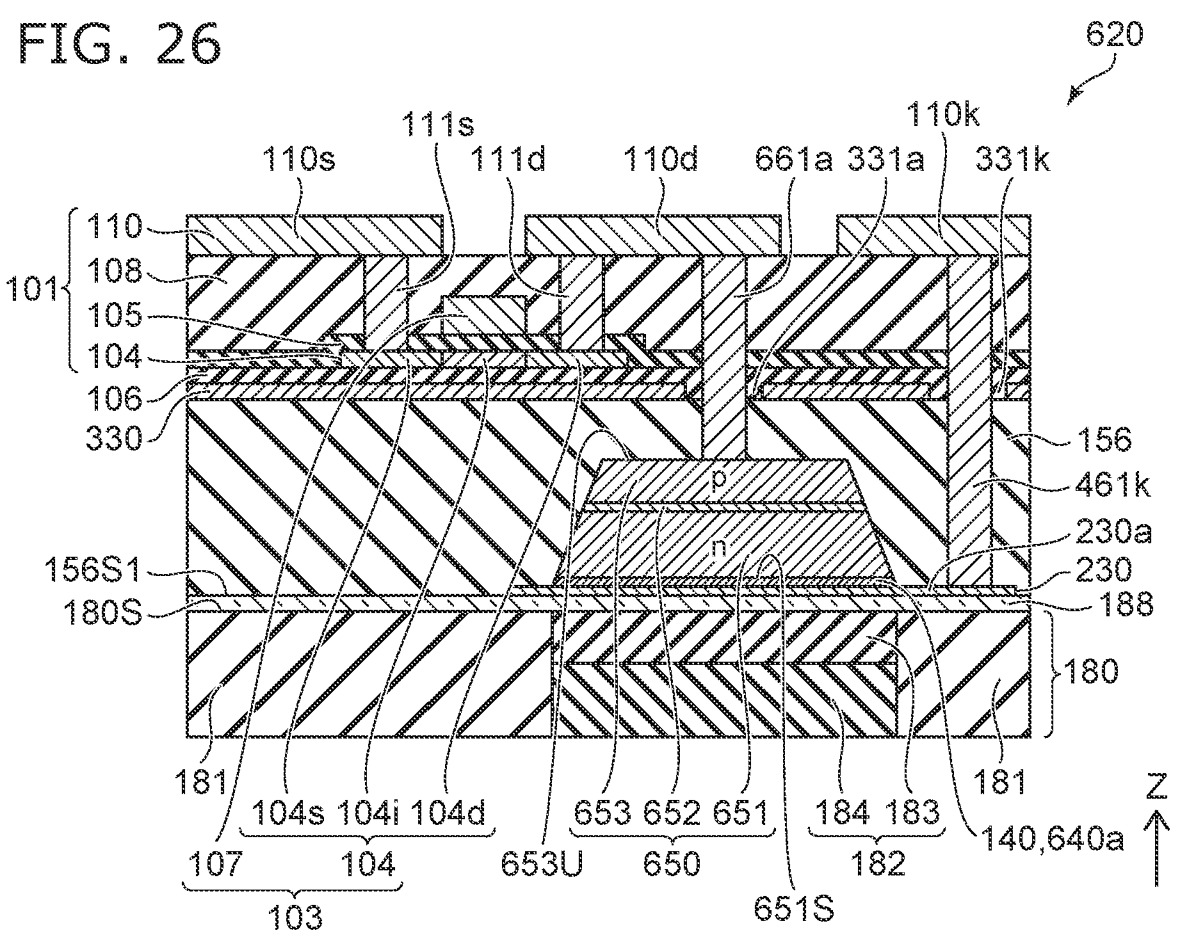
FIG. 26 is a schematic cross-sectional view illustrating a portion of an image display device according to a sixth embodiment.

FIG. 26 is a schematic cross-sectional view illustrating a portion of an image display device of the embodiment.

The configuration of the light-emitting element 650 of the embodiment is different from that of the other embodiments. The other components are the same as those of the other embodiments described above. The same components are marked with the same reference numerals, and a detailed description is omitted as appropriate.

As shown in FIG. 26, the image display device includes a subpixel 620. The subpixel 620 includes the color filter (the light-transmitting member) 180, the second wiring layer 230, the graphene layer 140, the light-emitting element 650, the first inter-layer insulating film 156, the light-shielding layer 330, the transistor 103, the second inter-layer insulating film 108, and the first wiring layer 110.

The light-emitting element 650 is located on the connection surface (the first surface) 180S of the color filter 180 with the transparent resin layer 188 interposed. The embodiment is the same as the other embodiments described above in that the wiring part 230*a* is located on the transparent resin layer 188, and a graphene sheet 640*a* is located on the wiring part 230*a*. The embodiment is the same as the fourth and fifth embodiments described above in that the light-emitting element 650 is located on the graphene sheet 640*a*. The surface 156S1 of the first inter-layer insulating film 156 at a light-emitting surface 651S side is located on the connection surface 180S of the color filter 180 with the transparent resin layer 188 interposed.

The light-emitting element 650 includes the light-emitting surface 651S and an upper surface 653U that is the surface at the side opposite to the light-emitting surface 651S. The light-emitting element 650 includes an n-type semiconductor layer 651, the light-emitting layer 652, and a p-type semiconductor layer 653 stacked in this order from the light-emitting surface 651S toward the upper surface 653U. As described with reference to FIG. 27 below, the light-emitting element 650 has a truncated pyramid or truncated circular conic shape formed so that the area when projected onto the XY plane gradually decreases from the light-emitting surface 651S toward the upper surface 653U.

According to the embodiment, the light-shielding layer 330 is located between the TFT underlying film 106 and the first inter-layer insulating film 156. The light-shielding layer 330 is the same as that described using FIG. 16 according to the third embodiment. Accordingly, the light-shielding layer 330 is provided to cover the TFT channel 104, can shield the light radiated from the light-emitting element 650, and can prevent malfunction of the transistor 103 including the TFT channel 104.

Similarly to the fourth embodiment, the via 461*k* is included. Specifically, the via 461*k* extends through the second inter-layer insulating film 108, the insulating layer 105, the TFT underlying film 106, the light-shielding layer 330, and the first inter-layer insulating film 156 and reach the wiring part 230*a*. The via 461*k* is located between the wiring part 110*k* and the wiring part 230*a* and electrically connects the wiring part 110*k* and the wiring part 230*a*.

A via 661*a* extends through the second inter-layer insulating film 108, the insulating layer 105, the TFT underlying film 106, the light-shielding layer 330, and the first inter-layer insulating film 156 and reach the upper surface 653U. The via 661*a* is located between the wiring part 110*d* and the upper surface 653U and electrically connects the wiring part 110*d* and the upper surface 653U. The other components are the same as those of the other embodiments described above, and a detailed description is omitted.

Figure 27:
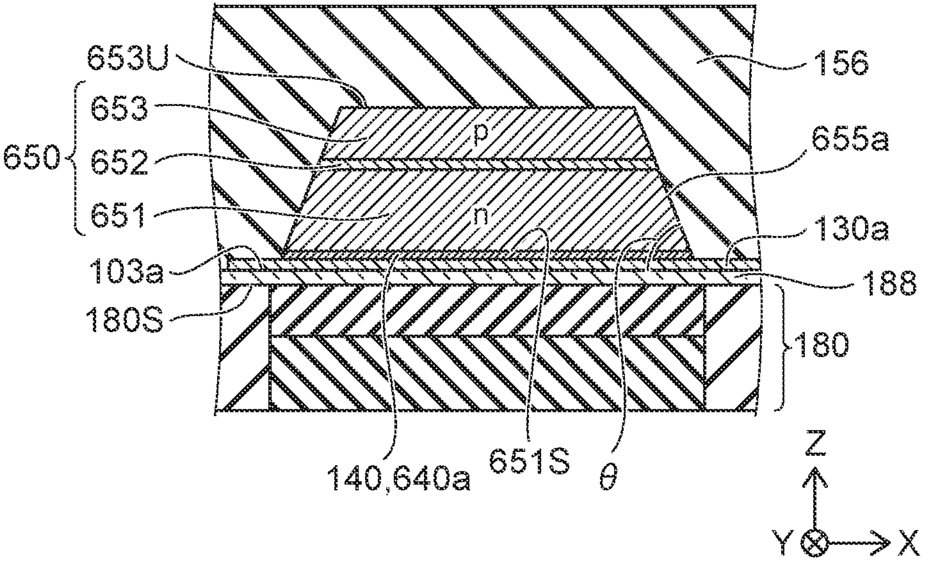
FIG. 27 is a schematic cross-sectional view illustrating a portion of the image display device of the sixth embodiment.

FIG. 27 is an enlarged view of a portion of the light-emitting element 650 of FIG. 26, and shows the relationship between the light-emitting surface 651S and a side surface 655*a* in detail.

As shown in FIG. 27, the light-emitting surface 651S is a plane that is substantially parallel to the XY plane. The light-emitting element 650 is located on the connection surface 180S of the color filter with the transparent resin layer 188 interposed, and the light-emitting surface 651S is substantially parallel to the connection surface 180S.

Although the first inter-layer insulating film 156 is taken to be a transparent resin for simplification in the following description, even when the first inter-layer insulating film 156 is a white resin, the effects on the refractive index of the fine scattering particles inside the white resin are small, and such effects can be ignored.

The side surface 655*a* of the light-emitting element 650 is a surface between the upper surface 653U and the light-emitting surface 651S and is adjacent to the light-emitting surface 651S and the upper surface 653U. An interior angle $\theta$ of the angle between the side surface 655*a* and the light-emitting surface 651S is less than 90°. It is favorable for the interior angle $\theta$ to be about 70°. The interior angle $\theta$ is more favorably less than the critical angle of the side surface 655*a* determined based on the refractive index of the light-emitting element 650 and the refractive index of the first inter-layer insulating film 156. The light-emitting element 650 is covered with the first inter-layer insulating film 156, and the side surface 655*a* contacts the first inter-layer insulating film 156.

For example, a critical angle $\theta c$ of the interior angle $\theta$ between the light-emitting surface 651S and the side surface 655*a* of the light-emitting element 650 is determined as follows.

The critical angle $\theta c$ of the light emitted from the light-emitting element 650 into the first inter-layer insulating film 156 is determined using the following Formula (1) for a refractive index n0 of the light-emitting element 650 and a refractive index n1 of the first inter-layer insulating film 156.

$$\theta c = 90° - \sin^{-1}(n1/n0) \qquad (1)$$

For example, it is known that the refractive index of a general transparent organic insulating material such as an acrylic resin or the like is about 1.4 to 1.5. Therefore, when the light-emitting element 650 is formed of GaN and the first inter-layer insulating film 156 is formed of a general transparent organic insulating material, it follows that the refractive index n0 of the light-emitting element 650 equals 2.5, and the refractive index n1 of the first inter-layer insulating film 156 equals 1.4. Substituting these values in Formula (1) gives critical angle $\theta c = 56°$.

This indicates that when the interior angle $\theta$ between the light-emitting surface 651S and the side surface 655*a* is set to $\theta c = 56°$, the light radiated from the light-emitting layer 652 that is parallel to the light-emitting surface 651S is totally reflected at the side surface 655*a*. This also indicates that the light radiated from the light-emitting layer 652 that has a component in the positive direction of the Z-axis also is totally reflected at the side surface 655*a*.

On the other hand, the light radiated from the light-emitting layer 652 that has a component in the negative direction of the Z-axis is emitted from the side surface 655*a* at an emergence angle corresponding to the refractive index at the side surface 655*a*. The light that is incident on the first inter-layer insulating film 156 is emitted from the first inter-layer insulating film 156 at an angle determined by the refractive index of the first inter-layer insulating film 156.

The light that is totally reflected at the side surface 655*a* is re-reflected by the upper surface 653U, and the re-reflected light that has a component in the negative direction of the Z-axis is emitted from the light-emitting surface 651S and the side surface 655*a*. The light that is parallel to the light-emitting surface 651S and the light that has a component in the positive direction of the Z-axis are totally reflected at the side surface 655*a*.

Thus, the light radiated from the light-emitting layer 652 that is parallel to the light-emitting surface 651S or has a component in the positive direction of the Z-axis is converted into light having a component in the negative direction of the Z-axis by the side surface 655*a*. Accordingly, the ratio of the light from the light-emitting element 650 that is emitted toward the light-emitting surface 651S is increased, and the substantial luminous efficiency of the light-emitting element 650 is improved.

By setting $\theta < \theta c$, substantially all of the light having a component parallel to the light-emitting surface 651S can be totally reflected inside the light-emitting element 650. Because the critical angle $\theta c$ is about 56° when the refractive index of the first inter-layer insulating film 156 is set to n=1.4, it is more favorable to set the interior angle $\theta$ to be 45°, 30°, etc. The critical angle $\theta c$ decreases as the refractive index n of the material increases. However, even if the interior angle $\theta$ is set to about 70°, substantially all of the light having a component in the negative direction of the Z-axis can be converted into light having a component in the positive direction of the Z-axis; therefore, considering the manufacturing fluctuation, etc., for example, the interior angle $\theta$ may be set to be not more than 80°, etc.

A method for manufacturing the image display device of the embodiment will now be described.

The manufacturing processes of the light-emitting element 650 according to the embodiment are different from those of the other embodiments; otherwise, the manufacturing processes of the other embodiments described above are applicable. The different portions of the manufacturing processes will now be described.

According to the embodiment, the following processes are performed for the process of FIG. 13B and subsequent processes to form the shape of the light-emitting element 650 shown in FIG. 26.

The semiconductor layer 1150 shown in FIG. 13B is patterned by etching into the shape of the light-emitting element 650 shown in FIG. 26. To shape the light-emitting element 650, the etching rate is selected so that the side surface 655*a* shown in FIG. 27 has the interior angle θ with respect to the light-emitting surface 651S. For example, the etching is selected so that the etching rate is higher proximate to the upper surface 653U. It is favorable to set the etching rate to linearly increase from the light-emitting surface 651S side toward the upper surface 653U side.

Specifically, for example, a contrivance when exposing is performed so that the resist mask pattern in the dry etching gradually becomes thin toward the end portions. Accordingly, the resist gradually recedes from the thin portions in the dry etching, and the etching amount can be increased from the light-emitting surface 651S toward the upper surface 653U side. Thereby, the side surface 655*a* of the light-emitting element 650 is formed to form a constant angle with respect to the light-emitting surface 651S. Therefore, the light-emitting element 650 is formed so that the areas of the layers from the upper surface 653U when projected onto the XY plane increase in the order of the p-type semiconductor layer 653, the light-emitting layer 652, and the n-type semiconductor layer 651.

Subsequently, the subpixel 620 is formed similarly to that of the other embodiments. As shown in FIG. 10, a monochromatic image display device may be made without providing a color filter. In such a case, the process of removing the substrate can be reduced as in the third embodiment.

Effects of the image display device of the embodiment will now be described.

The image display device of the embodiment has the following effects in addition to the effects of reducing the time of the transfer process for forming the light-emitting element 650 and reducing the number of processes similarly to the image display devices of the other embodiments described above.

In the image display device of the embodiment, the light-emitting element 650 is formed to include the side surface 655*a* having the interior angle θ with respect to the light-emitting surface 651S at which the light-emitting element 650 is located. The interior angle θ is less than 90° and is set based on the critical angle θc determined by the refractive indexes of the materials of the light-emitting element 650 and the first inter-layer insulating film 156. The interior angle θ can convert the light radiated from the light-emitting layer 652 that is light traveling sideward and above the light-emitting element 650 into light traveling toward the light-emitting surface 651S side, which can be emitted. The substantial luminous efficiency of the light-emitting element 650 is increased by setting the interior angle θ to be sufficiently small.

According to the embodiment, the light-emitting element 650 is a vertical element, and the via 461*k* is connected using the wiring part 230*a* of the second wiring layer 230. The connection is not limited thereto; similarly to the first embodiment, a connection part that is formed on the connection surface 180S may be included in the light-emitting element, and the via 461*k* may be connected via the connection part.

Seventh Embodiment

Figure 28:
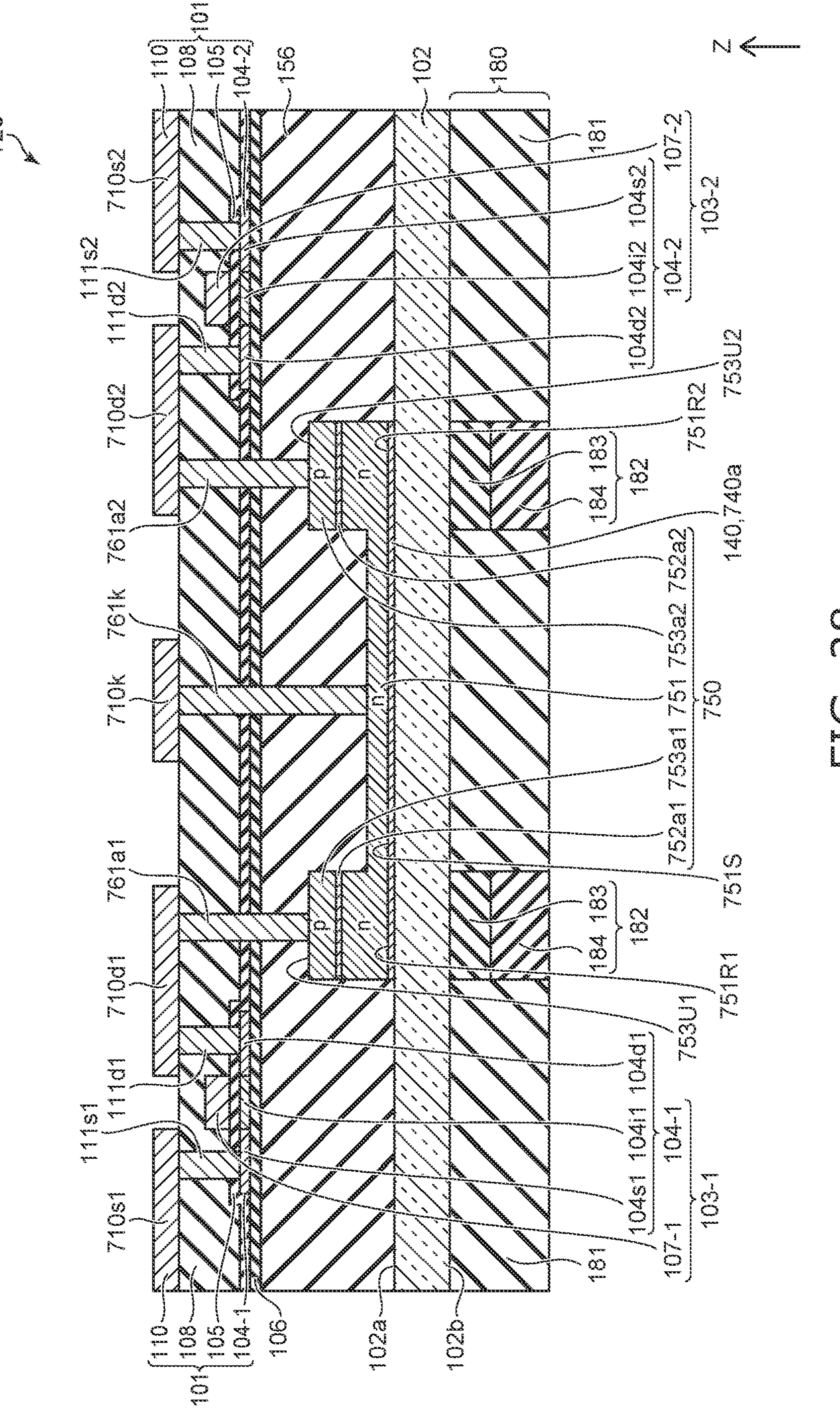
FIG. 28 is a schematic cross-sectional view illustrating a portion of an image display device according to a seventh embodiment.

FIG. 28 is a schematic cross-sectional view illustrating a portion of an image display device of the embodiment.

The embodiment differs from the other embodiments in that the image display device includes a subpixel group 720 including multiple light-emitting regions for one light-emitting surface. The same components are marked with the same reference numerals, and a detailed description is omitted as appropriate.

As shown in FIG. 28, the image display device of the embodiment includes the subpixel group 720. The subpixel group 720 includes the substrate (the light-transmitting member) 102, the graphene layer 140, the semiconductor layer 750, the first inter-layer insulating film (the first insulating film) 156, multiple transistors 103-1 and 103-2, the second inter-layer insulating film (the second insulating film) 108, multiple vias (first vias) 761*a*1 and 761*a*2, and the first wiring layer 110. The subpixel group 720 further includes the color filter 180. The semiconductor layer 750 is located in the one surface (the first surface) 102*a* of the substrate 102, and the color filter 180 is located at the other surface of the substrate 102.

According to the embodiment, holes are injected from one side of the semiconductor layer 750 via the first wiring layer 110 and the vias 761*a*1 and 761*a*2 by switching the p-channel transistors 103-1 and 103-2 on. Electrons are injected from the other side of the semiconductor layer 750 via the first wiring layer 110 and a via 761*k* by switching the p-channel transistors 103-1 and 103-2 on. Light-emitting layers 752*a*1 and 752*a*2 of the semiconductor layer 750 that are separated from each other emit light when the holes and the electrons are injected and the holes and the electrons combine. For example, the circuit configuration shown in FIG. 2 is applied to the drive circuit for driving the light-emitting layers 752*a*1 and 752*a*2. The example of the second embodiment in which the n-type semiconductor layer and p-type semiconductor layer of the semiconductor layer are interchanged also can be used as a configuration that drives the semiconductor layer with an n-channel transistor. In such a case, the circuit configuration of FIG. 12 is applied to the drive circuit.

The configuration of the subpixel group 720 will now be described in detail.

The semiconductor layer 750 includes a light-emitting surface 751S. The light-emitting surface 751S is located on the one surface 102*a* of the substrate 102 in contact with the one surface 102*a*. The light-emitting surface 751S is a surface of an n-type semiconductor layer 751. The light-emitting surface 751S includes multiple light-emitting regions 751R1 and 751R2.

The semiconductor layer 750 includes the n-type semiconductor layer (the first semiconductor layer) 751, the light-emitting layers 752*a*1 and 752*a*2, and p-type semiconductor layers (second semiconductor layers) 753*a*1 and 753*a*2. The light-emitting layer 752*a*1 is located on the n-type semiconductor layer 751. The light-emitting layer 752*a*1 is separated from the light-emitting layer 752*a*2 and is located on the n-type semiconductor layer 751. The p-type semiconductor layer 753*a*1 is located on the light-emitting layer 752*a*1. The p-type semiconductor layer 753*a*2 is separated from the p-type semiconductor layer 753*a*1 and is located on the light-emitting layer 752*a*2.

The p-type semiconductor layer 753*a*1 includes an upper surface 753U1 that is located at the side opposite to the surface at which the light-emitting layer 752*a*1 is located. The p-type semiconductor layer 753*a*2 includes an upper surface 753U2 that is located at the side opposite to the surface at which the light-emitting layer 752*a*2 is located.

The light-emitting region 751R1 substantially matches the region of the light-emitting surface 751S facing the upper surface 753U1. The light-emitting region 751R2 substantially matches the region of the light-emitting surface 751S facing the upper surface 753U2.

The relationship between the semiconductor layer 750 and the light-emitting regions 751R1 and 751R2 will now be described.

Figure 29:
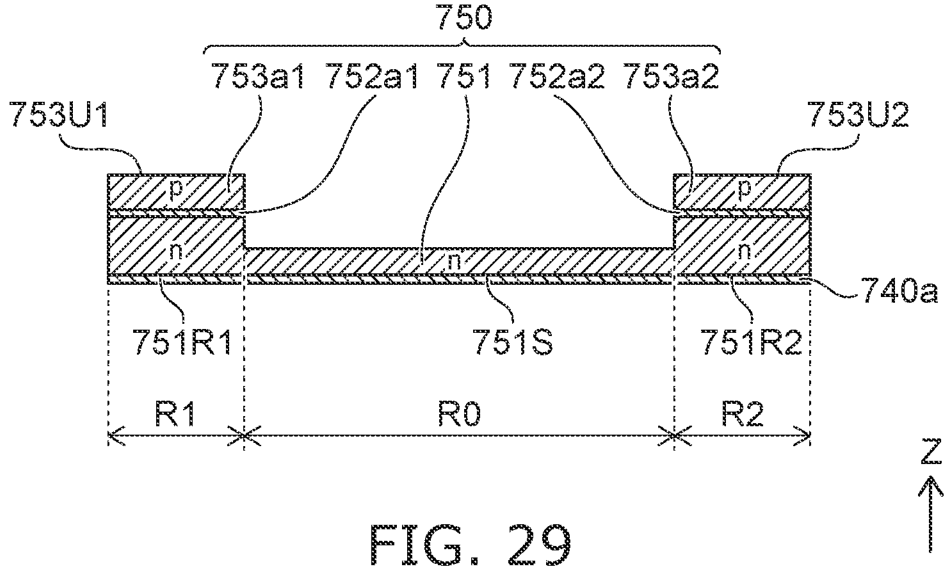
FIG. 29 is a schematic cross-sectional view illustrating a portion of the image display device of the seventh embodiment.

FIG. 29 is a schematic cross-sectional view illustrating a portion of the image display device of the embodiment.

FIG. 29 is a schematic view for describing the light-emitting regions 751R1 and 751R2 of the semiconductor layer 750.

As shown in FIG. 29, the light-emitting regions 751R1 and 751R2 are surfaces on the light-emitting surface 751S. In FIG. 29, the portions of the semiconductor layer 750 that include the light-emitting regions 751R1 and 751R2 are respectively called light-emitting parts R1 and R2. The light-emitting part R1 includes the p-type semiconductor layer 753*a*1, the light-emitting layer 752*a*1, and a portion of the n-type semiconductor layer 751. The light-emitting part R2 includes the p-type semiconductor layer 753*a*2, the light-emitting layer 752*a*2, and a portion of the n-type semiconductor layer 751.

The semiconductor layer 750 includes a connection part R0. The connection part R0 is located between the light-emitting part R1 and the light-emitting part R2 and is a portion of the n-type semiconductor layer 751. One end of the via 761*k* shown in FIG. 28 is connected to the connection part R0 and provides a path of current to each of the light-emitting parts R1 and R2.

In the light-emitting part R1, electrons that are supplied via the connection part R0 are supplied to the light-emitting layer 752*a*1. In the light-emitting part R1, holes that are supplied through the upper surface 753U1 are supplied to the light-emitting layer 752*a*1. The electrons and the holes that are supplied to the light-emitting layer 752*a*1 combine and emit light. The light that is emitted by the light-emitting layer 752*a*1 passes through the portion of the n-type semiconductor layer 751 of the light-emitting part R1 and reaches the light-emitting surface 751S. Because the light travels straight substantially along the Z-axis direction through the light-emitting part R1, the portion of the light-emitting surface 751S that emits light is the light-emitting region 751R1. Accordingly, in the example, when projected onto the XY plane, the light-emitting region 751R1 substantially matches a region surrounded with the outer perimeter of the light-emitting layer 752*a*1 projected onto the light-emitting surface 751S.

The light-emitting part R2 also is similar to the light-emitting part R1. Specifically, the electrons that are supplied via the connection part R0 are supplied to the light-emitting layer 752*a*2 in the light-emitting part R2. The holes that are supplied through the upper surface 753U2 are supplied to the light-emitting layer 752*a*2 in the light-emitting part R2. The electrons and the holes that are supplied to the light-emitting layer 752*a*2 combine and emit light. The light that is emitted by the light-emitting layer 752*a*2 passes through the portion of the n-type semiconductor layer 751 of the light-emitting part R2 and reaches the light-emitting surface 751S. Because the light travels straight substantially along the Z-axis direction through the light-emitting part R2, the portion of the light-emitting surface 751S that emits light is the light-emitting region 751R2. Accordingly, in the example, when projected onto the XY plane, the light-emitting region 751R2 substantially matches the region surrounded with the outer perimeter of the light-emitting layer 752*a*2 projected onto the light-emitting surface 751S.

According to the embodiment, the light-emitting surface 751S is located on a graphene sheet 740*a*, and so the light that is radiated from the light-emitting regions 751R1 and 751R2 reaches the substrate 102 and the color filter 180 via the graphene sheet 740*a*.

Thus, in the semiconductor layer 750, the n-type semiconductor layer 751 can be shared, and the multiple light-emitting regions 751R1 and 751R2 can be formed on the light-emitting surface 751S.

According to the embodiment, the semiconductor layer 750 can be formed by using a portion of the n-type semiconductor layer 751 as the connection part R0 for the multiple light-emitting layers 752*a*1 and 752*a*2 and the multiplep-type semiconductor layers 753*a*1 and 753*a*2 of the semiconductor layer 750. Accordingly, the semiconductor layer 750 can be formed similarly to the method for forming the light-emitting elements 150 and 250 according to the first and second embodiments and the like described above.

The description continues now by returning to FIG. 28.

The graphene layer 140 includes the multiple graphene sheets 740*a*. The graphene sheet 740*a* is located on the surface 102*a* and is provided for each semiconductor layer 750. The light-emitting surface 751S contacts the graphene sheet 740*a*, and the semiconductor layer 750 is located at the surface 102*a* of the substrate 102 with the graphene sheet 740*a* interposed. The outer perimeter of the graphene sheet 740*a* when projected onto the XY plane substantially matches the outer perimeter of the semiconductor layer 750 when projected onto the XY plane.

The first inter-layer insulating film 156 (the first insulating film) is provided to cover the surface 102*a* of the substrate 102, the graphene sheet 740*a*, and the semiconductor layer 750.

The TFT underlying film 106 is formed over the first inter-layer insulating film 156. The TFT underlying film 106 is planarized, and the TFT channels 104-1 and 104-2, etc., are formed on the TFT underlying film 106.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The second inter-layer insulating film (the second insulating film) 108 is provided to cover the insulating layer 105 and the gates 107-1 and 107-2.

The TFT channel 104-1 includes regions 104*s*1 and 104*d*1 doped to be of the p-type, and the regions 104*s*1 and 104*d*1 are the source region and drain region of the transistor 103-1. A region 104*i*1 is doped to be of the n-type and forms the channel of the transistor 103-1. Similarly, the TFT channel 104-2 also includes regions 104*s*2 and 104*d*2 doped to be of the p-type, and the regions 104*s*2 and 104*d*2 are the source region and drain region of the transistor 103-2. A region 104*i*2 is doped to be of the n-type and forms the channel of the transistor 103-2. According to the embodiment, the circuit 101 includes the TFT channels 104-1 and 104-2, the insulating layer 105, the second inter-layer insulating film 108, vias 111*s*1, 111*d*1, 111*s*2, and 111*d*2, and the first wiring layer 110.

The first wiring layer 110 is located on the second inter-layer insulating film 108. The first wiring layer 110 includes wiring parts 710*s*1, 710*d*1, 710*k*, 710*d*2, and 710*s*2.

The wiring part 710*k* is located above the n-type semiconductor layer 751. The via 761*k* is located between the wiring part 710*k* and the n-type semiconductor layer 751 and electrically connects the wiring part 710*k* and the n-type semiconductor layer 751. For example, the wiring part 710*k* is connected to the ground line 4 of the circuit of FIG. 2.

The vias 111*d*1, 111*s*1, 111*d*2, and 111*s*2 extend through the second inter-layer insulating film 108, the insulating layer 105, and the TFT underlying film 106. The via 111*d*1 is located between the region 104*d*1 and the wiring part 710*d*1 and electrically connects the region 104*d*1 and the wiring part 710*d*1. The via 111*s*1 is located between the region 104*s*1 and the wiring part 710*s*1 and electrically connects the region 104*s*1 and the wiring part 710*s*1. The via 111*d*2 is located between the region 104*d*2 and the wiring part 710*d*2 and electrically connects the region 104*d*2 and the wiring part 710*d*2. The via 111*s*2 is located between the region 104*s*2 and the wiring part 710*s*2 and electrically connects the region 104*s*2 and the wiring part 710*s*2. For example, the wiring parts 710*s*1 and 710*s*2 are connected to the power supply line 3 of the circuit of FIG. 2.

The wiring part 710*d*1 is located above the upper surface 753U1. The via 761*a*1 is located between the wiring part 710*d*1 and the upper surface 753U1 and electrically connects the wiring part 710*d*1 and the upper surface 753U1. Accordingly, thep-type semiconductor layer 753*a*1 is electrically connected to the drain region of the transistor 103-1 by the via 761*a*1, the wiring part 710*d*1, and the via 111*d*1.

The wiring part 710*d*2 is located above the upper surface 753U2. The via 761*a*2 is located between the wiring part 710*d*2 and the upper surface 753U2 and electrically connects the wiring part 710*d*2 and the upper surface 753U2. Accordingly, thep-type semiconductor layer 753*a*2 is electrically connected to the drain region of the transistor 103-2 by the via 761*a*2, the wiring part 710*d*2, and the via 111*d*2.

For example, the transistors 103-1 and 103-2 are drive transistors of adjacent subpixels and are sequentially driven. When the holes supplied from the transistor 103-1 are injected into the light-emitting layer 752*a*1 and the electrons supplied from the wiring part 710*k* are injected into the light-emitting layer 752*a*1, the light-emitting layer 752*a*1 emits light, and the light is radiated from the light-emitting region 751R1. When the holes supplied from the transistor 103-2 are injected into the light-emitting layer 752*a*2 and the electrons supplied from the wiring part 710*k* are injected into the light-emitting layer 752*a*2, the light-emitting layer 752*a*2 emits light, and the light is radiated from the light-emitting region 751R2.

Effects of the image display device of the embodiment will now be described.

Similarly to the image display devices of the other embodiments described above, the image display device of the embodiment has the effects of reducing the time of the transfer process for forming the semiconductor layer 750 and reducing the number of processes. Also, because the connection part R0 can be shared by the multiple light-emitting parts R1 and R2, the number of the vias 761*k* provided in the connection part R0 can be reduced. The pitch of the light-emitting parts R1 and R2 included in the subpixel group 720 can be reduced by reducing the number of vias, and a small and high-definition image display device is possible. Although two light-emitting regions are described in the example, the number of light-emitting regions formed in the light-emitting surface is not limited to two, and can be any number of three or more.

Although a color filter is included in the description of the example of the embodiment, a monochromatic image display device may be made without providing a color filter similarly to the other embodiments.

The components of the embodiments described above are selected and applied as appropriate in addition to the configurations described above. As described above, the roughening of the light-emitting surface is applicable to the first embodiment, the second, sixth, and seventh embodiments. The application of the light-shielding layer 330 also is clearly applicable to the first, second, fourth, fifth, and seventh embodiments. It is expected that the light-shielding performance of the embodiments to which the wiring part 470*a* having the light-shielding function shown in FIG. 19 and/or the light-shielding electrode 560*a* shown in FIG. 23 are applied can be further improved by applying the light-shielding layer 330.

Although an example in which the p-type semiconductor layer 253 is used as the light-emitting surface 253S is described in the second embodiment, the example of the second embodiment is easily applied to the light-emitting elements of the other embodiments and their manufacturing processes.

Eighth Embodiment

The image display device described above can be used as an image display module having the appropriate number of pixels in, for example, a computer display, a television, a portable terminal such as a smartphone, car navigation, etc.

Figure 30:
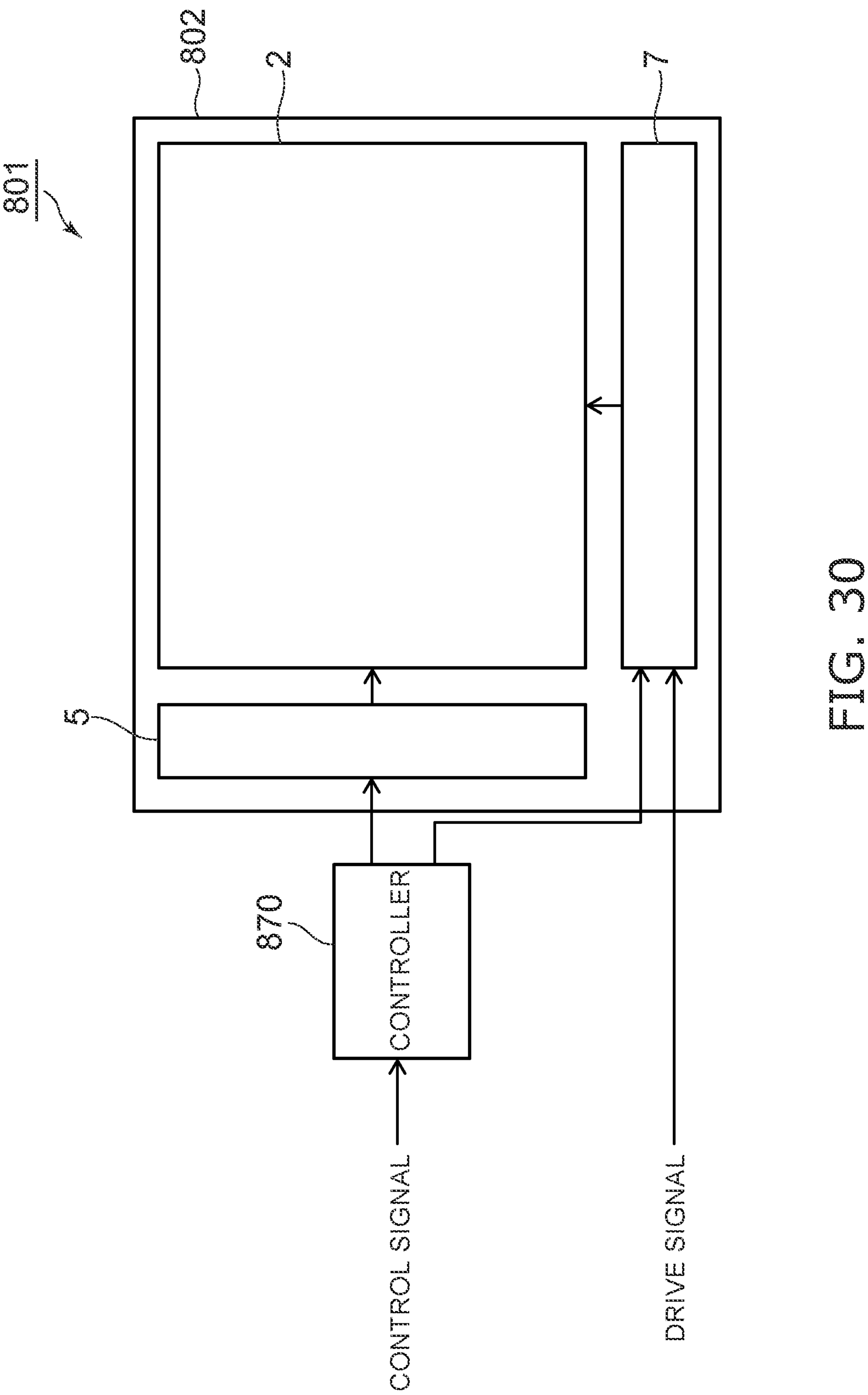
FIG. 30 is a block diagram illustrating an image display device according to an eighth embodiment.

FIG. 30 is a block diagram illustrating an image display device according to the embodiment.

FIG. 30 shows the major parts of the configuration of a computer display.

As shown in FIG. 30, the image display device 801 includes an image display module 802. The image display module 802 is, for example, an image display device that includes the configuration according to the first embodiment described above. The image display module 802 includes the display region 2 in which multiple subpixels including the subpixels 20 are arranged, the row selection circuit 5, and the signal voltage output circuit 7.

The image display device 801 further includes a controller 870. The controller 870 receives input of control signals separated and generated by not-illustrated interface circuitry, and controls the driving and the drive sequence of the subpixels in the row selection circuit 5 and the signal voltage output circuit 7.

Modification

Figure 31:
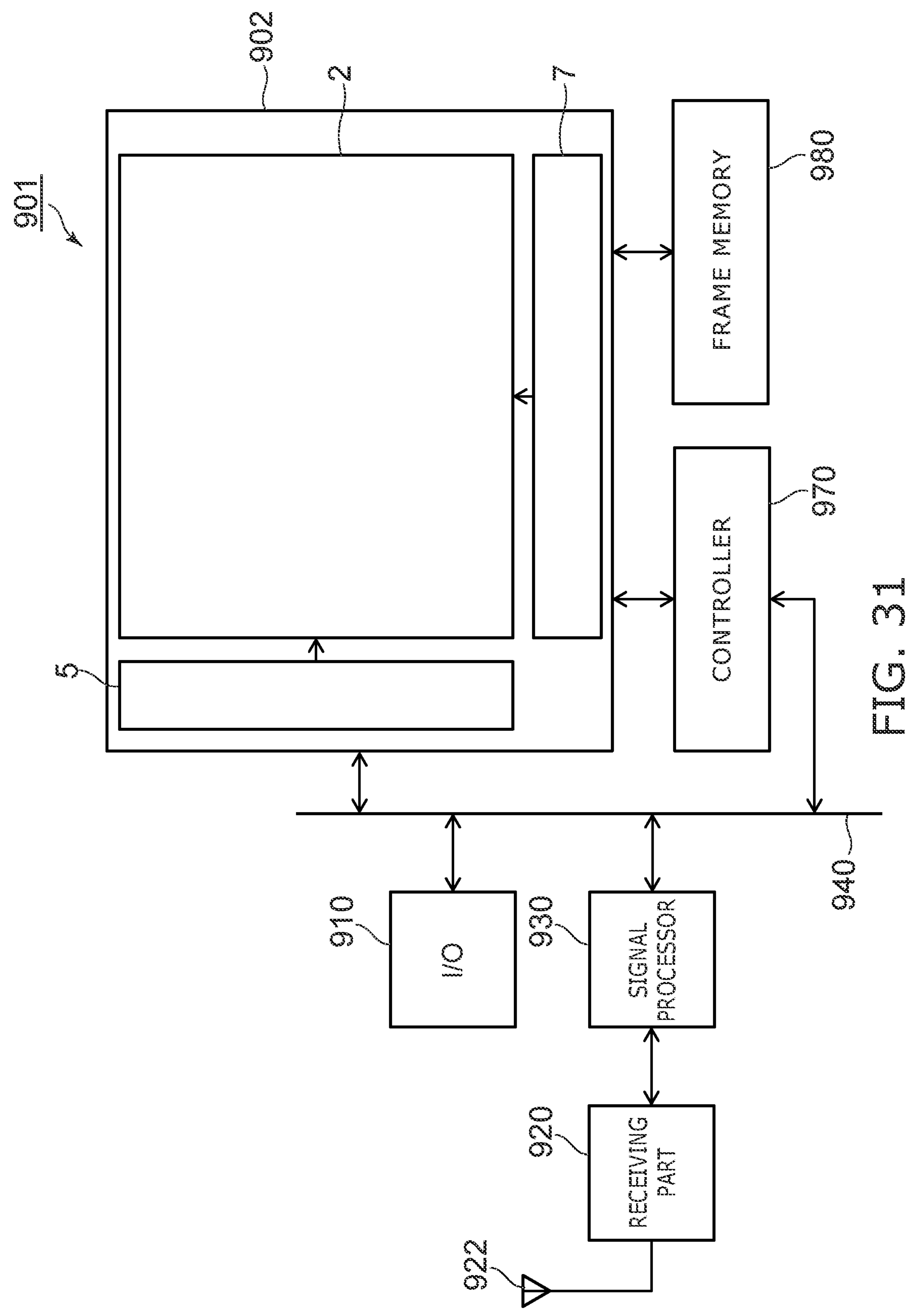
FIG. 31 is a block diagram illustrating an image display device according to a modification of the eighth embodiment.

FIG. 31 is a block diagram illustrating an image display device according to a modification of the embodiment.

FIG. 31 shows the configuration of a high-definition thin television.

As shown in FIG. 31, the image display device 901 includes an image display module 902. The image display module 902 is, for example, the image display device 1 that includes the configuration according to the first embodiment described above. The image display device 901 includes a controller 970 and a frame memory 980. The controller 970 controls the drive sequence of the subpixels of the display region 2 based on a control signal supplied by a bus 940. The frame memory 980 stores one frame of display data and is used for smooth processing such as video image reproduction, etc.

The image display device 901 includes an I/O circuit 910. The I/O circuit 910 is labeled as simply "I/O" in FIG. 31. The I/O circuit 910 provides interface circuitry for connecting with an external terminal, a device, etc. The I/O circuit 910 includes, for example, an audio interface, a USB interface that connects an external hard disk device, etc.

The image display device 901 includes a receiving part 920 and a signal processor 930. An antenna 922 is connected to the receiving part 920, and the necessary signal is separated and generated from the radio wave received by the antenna 922. The signal processor 930 includes a DSP (Digital Signal Processor), a CPU (Central Processing Unit), etc., and the signal that is separated and generated by the receiving part 920 is separated and generated into image data, voice data, etc., by the signal processor 930.

Other image display devices also can be made by using the receiving part 920 and the signal processor 930 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment and other embodiments may be used. The image display modules according to the embodiment and its modifications are configured to include many subpixels as shown in FIGS. 9 and 10.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are included in the scope and spirit of the inventions, and are included in the scope of the inventions recited in the claims and their equivalents. Also, embodiments described above can be implemented in combination with each other.

What is claimed is:

1. A method for manufacturing an image display device, the method comprising:

forming a first wiring layer on a surface of a substrate, the first wiring layer being light-transmissive; and after forming the first wiring layer, forming a graphene-including layer on a surface of the first wiring layer;

forming a semiconductor layer on the graphene-including layer, the semiconductor layer comprising a light-emitting layer;

forming a light-emitting element by patterning the semiconductor layer, the light-emitting element including:

a light-emitting surface on the graphene-including layer, and an upper surface at a side opposite to the light-emitting surface, forming a first insulating film covering the surface of the substrate, the graphene-including layer, and the light-emitting element;

forming a circuit element on the first insulating film;

forming a second insulating film covering the first insulating film and the circuit element;

forming a first via and a second via extending through the first and second insulating films; and forming a second wiring layer on the second insulating film, wherein:

the first via is located between the second wiring layer and the upper surface of the light-emitting element and electrically connects the second wiring layer and the upper surface of the light-emitting element, and the second via is located between the second wiring layer and the first wiring layer and electrically connects the second wiring layer and the first wiring layer.

2. The method according to claim 1, wherein:

the substrate is light-transmissive.

3. The method according to claim 2, further comprising:

forming a wavelength conversion member at a light-emitting surface side of the light-emitting element.

4. The method according to claim 1, further comprising:

before the forming of the first insulating film, forming a third wiring layer to cover the light-emitting element.

5. The method according to claim 1, further comprising:

removing the substrate; and roughening the light-emitting surface.

6. The method according to claim 5, further comprising:

forming a wavelength conversion member in place of the substrate that has been removed.

7. The method according to claim 1, further comprising:

forming a light-shielding layer on the first insulating film.

8. The method according to claim 1, wherein:

the semiconductor layer comprises a gallium nitride compound semiconductor.

9. An image display device comprising:

a light-transmitting member including a first surface;

a light-emitting element including:

a light-emitting surface on the first surface, and an upper surface at a side opposite to the light-emitting surface;

a first insulating film covering the first surface and the light-emitting element;

a circuit element located on the first insulating film;

a second insulating film covering the first insulating film and the circuit element;

a first via extending through the first and second insulating films;

a second via extending through the first and second insulating films;

a first wiring layer located on the second insulating film;

a second wiring layer located on the first surface, the second wiring layer being light-transmissive; wherein:

the first via is located between the first wiring layer and the upper surface and electrically connects the first wiring layer and the upper surface, the first wiring layer includes:

a first wiring part, and a second wiring part separated from the first wiring part, the first via is located between the first wiring part and the upper surface and electrically connects the first wiring part and the upper surface, and the second via is located between the second wiring part and the second wiring layer and electrically connects the second wiring part and the second wiring layer.

10. The image display device according to claim 9, further comprising:

a third wiring layer comprising a first light-shielding electrode, the first light-shielding electrode covering the upper surface and a side surface of the light-emitting element and being electrically connected to the upper surface, wherein:

the first via is located between the first wiring layer and the first light-shielding electrode and electrically connects the first wiring layer and the first light-shielding electrode.

11. The image display device according to claim 9, further comprising:

a second light-shielding electrode covering the upper surface, the second light-shielding electrode being electrically connected to the upper surface, wherein:

the first via is located between the first wiring layer and the second light-shielding electrode inside a through-hole and electrically connects the first wiring layer and the second light-shielding electrode, the through-hole having an inner diameter that includes an outer perimeter of the second light-shielding electrode in a plan view.

12. The image display device according to claim 9, wherein:

an interior angle between the first surface and a side surface of the light-emitting element is less than 90°.

13. The image display device according to claim 9, further comprising:

a graphene-including layer located between the first surface and the light-emitting surface.

14. The image display device according to claim 9, wherein:

the light-emitting surface is roughened.

15. The image display device according to claim 9, further comprising:

a light-shielding layer located between the first insulating film and the second insulating film.

16. The image display device according to claim 9, wherein:

the first insulating film is light-reflective.

17. The image display device according to claim 9, wherein:

the light-emitting element comprises a gallium nitride compound semiconductor.

18. The image display device according to claim 9, wherein:

the light-transmitting member comprises a wavelength conversion member.

19. An image display device comprising:

a light-transmitting member including a first surface;

a first semiconductor layer including a light-emitting surface on the first surface, wherein the light-emitting surface comprises a plurality of light-emitting regions;

a plurality of light-emitting layers that are separated from each other on the first semiconductor layer;

a plurality of second semiconductor layers located respectively on the plurality of light-emitting layers, the plurality of second semiconductor layers being of a different conductivity type from the first semiconductor layer;

a first insulating film covering the first surface, the first semiconductor layer, the plurality of light-emitting layers, and the plurality of second semiconductor layers;

a plurality of transistors that are separated from each other on the first insulating film;

a second insulating film covering the first insulating film and the plurality of transistors;

a plurality of first vias extending through the first and second insulating films; and a first wiring layer located on the second insulating film, wherein:

the plurality of second semiconductor layers are separated from each other by the first insulating film, and the plurality of light-emitting layers are separated from each other by the first insulating film, the plurality of first vias are located respectively between the first wiring layer and the plurality of second semiconductor layers and electrically connect the first wiring layer and the plurality of second semiconductor layers, respectively.

20. The image display device according to claim 19, further comprising:

a graphene-including layer located between the first surface and the light-emitting surface.

* * * * *